US012793948B2

(12) United States Patent
Valcore, Jr. et al.

(10) Patent No.: US 12,793,948 B2
(45) Date of Patent: Nov. 10, 2026

(54) SYSTEMS AND METHODS FOR ANALYZING AND INTELLIGENTLY COLLECTING SENSOR DATA

(71) Applicant: Lam Research Corporation, Fremont, CA (US)

(72) Inventors: John C. Valcore, Jr., Worthington, OH (US); Travis Joseph Wong, Oakland, CA (US); Ying Wu, Livermore, CA (US); Sandeep Mudunuri, Austin, TX (US); Bostjan Pust, San Ramon, CA (US); Shreeram Jyoti Dash, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 972 days.

(21) Appl. No.: 18/011,445

(22) PCT Filed: Aug. 31, 2021

(86) PCT No.: PCT/US2021/048515
§ 371 (c)(1),
(2) Date: Dec. 19, 2022

(87) PCT Pub. No.: WO2022/055757
PCT Pub. Date: Mar. 17, 2022

(65) Prior Publication Data

US 2023/0282465 A1 Sep. 7, 2023

Related U.S. Application Data

(60) Provisional application No. 63/076,700, filed on Sep. 10, 2020.

(51) Int. Cl.
*H01J 37/32* (2006.01)

(52) U.S. Cl.
CPC .... *H01J 37/3299* (2013.01); *H01J 37/32146* (2013.01); *H01J 2237/24564* (2013.01)

(58) Field of Classification Search
CPC ....... H01J 37/32146; H01J 2237/24564; H01J 37/32935; H01J 37/3299; H01J 37/32082;
(Continued)

(56) References Cited

U.S. PATENT DOCUMENTS 6,368,975 B1 * 4/2002 Balasubramhanya ........................ G05B 23/024 438/706
7,885,774 B2 2/2011 Swank
(Continued)

OTHER PUBLICATIONS

ISR & WO PCT/US2021/048515, dated Dec. 23, 2022, 8 pages.

*Primary Examiner* — Ricky Go
(74) *Attorney, Agent, or Firm* — Polygon IP, LLP

(57) ABSTRACT

A method for controlling a plasma tool is described. The method includes receiving, by a processor, a first set of metric data from a plasma tool. The method further includes analyzing the first set of metric data to determine a first location and a first time window for capturing of a second set of metric data. The method includes providing, by the processor, the first location and the first time window to a data processing system of the plasma tool. The method also includes receiving the second set of metric data captured at the first location and for the first time window. The method includes analyzing the second set of metric data to generate variable data and controlling the plasma tool according to the variable data.

21 Claims, 30 Drawing Sheets

(58) Field of Classification Search
CPC .......... H01J 37/32972; H01J 37/32963; H01L 21/67253; H01L 21/67248; H01L 22/20; C23C 16/52; C23C 14/54
USPC ............ 118/663, 665, 668, 688; 156/345.24, 156/345.25, 345.26, 345.27, 345.28
See application file for complete search history.

(56) References Cited

U.S. PATENT DOCUMENTS

| | | | | |
|---|---|---|---|---|
| 7,960,670 | B2 | 6/2011 | Mundt et al. | |
| 8,698,037 | B2 | 4/2014 | Mundt et al. | |
| 9,029,728 | B2 | 5/2015 | Mundt et al. | |
| 9,627,186 | B2 | 4/2017 | Valcore, Jr. et al. | |
| 10,325,760 | B2 | 6/2019 | Valcore, Jr. et al. | |
| 2002/0177917 | A1 | 11/2002 | Kameshwar et al. | |
| 2004/0127031 | A1 | 7/2004 | Klekotka | |
| 2008/0228306 | A1 * | 9/2008 | Yetter | G05B 23/0254 700/109 |
| 2009/0210181 | A1 | 8/2009 | Swank | |
| 2009/0294275 | A1 * | 12/2009 | Shannon | H01L 21/67253 204/164 |
| 2011/0240610 | A1 | 10/2011 | Mundt et al. | |
| 2014/0312916 | A1 | 10/2014 | Mundt et al. | |
| 2016/0131587 | A1 | 5/2016 | Meloni et al. | |
| 2016/0314943 | A1 * | 10/2016 | Albarede | H01J 37/32963 |
| 2017/0200592 | A1 | 7/2017 | Valcore, Jr. et al. | |
| 2018/0040460 | A1 * | 2/2018 | Gottscho | G05B 19/418 |

* cited by examiner

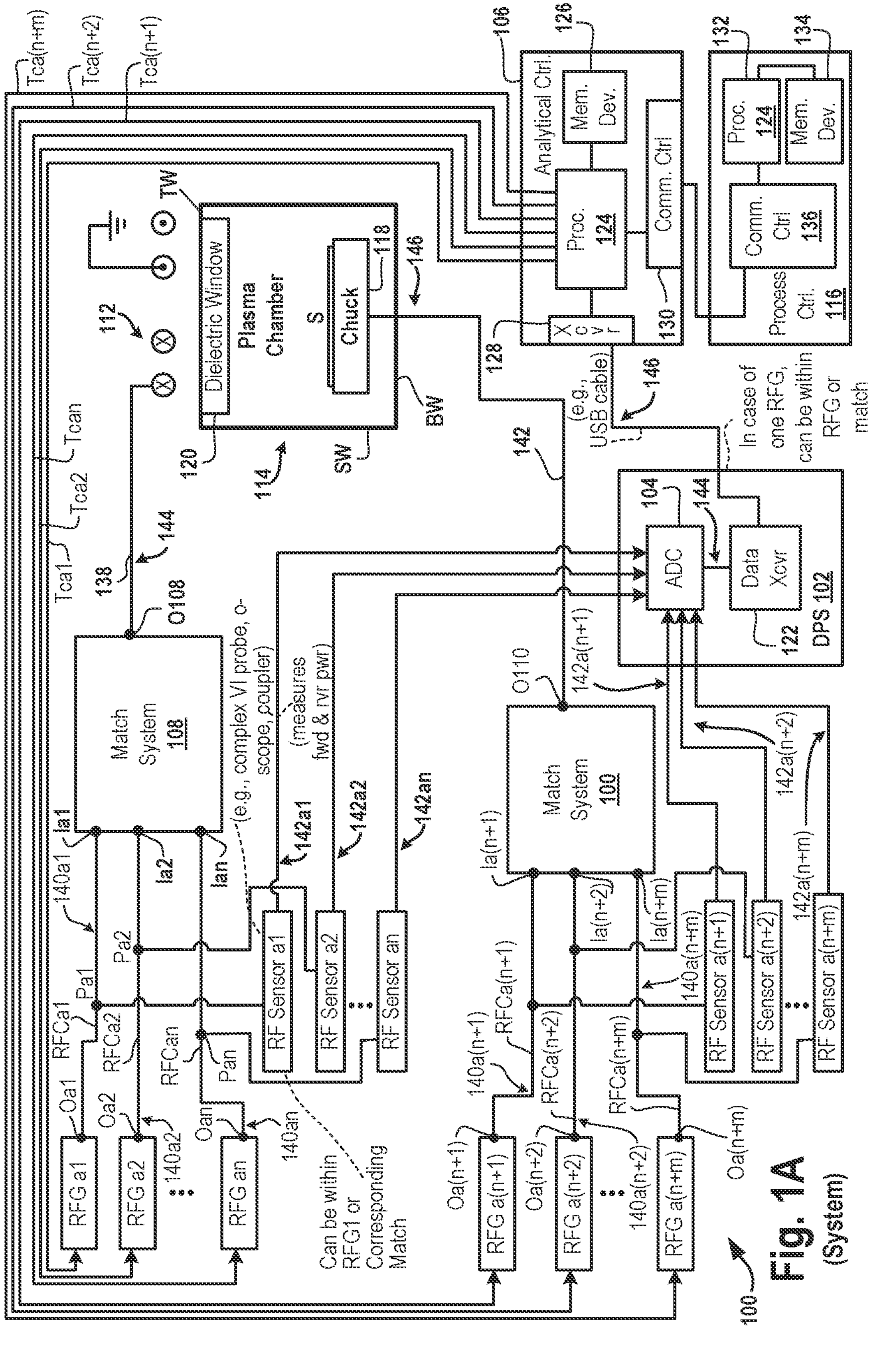
Fig. 1A (System)

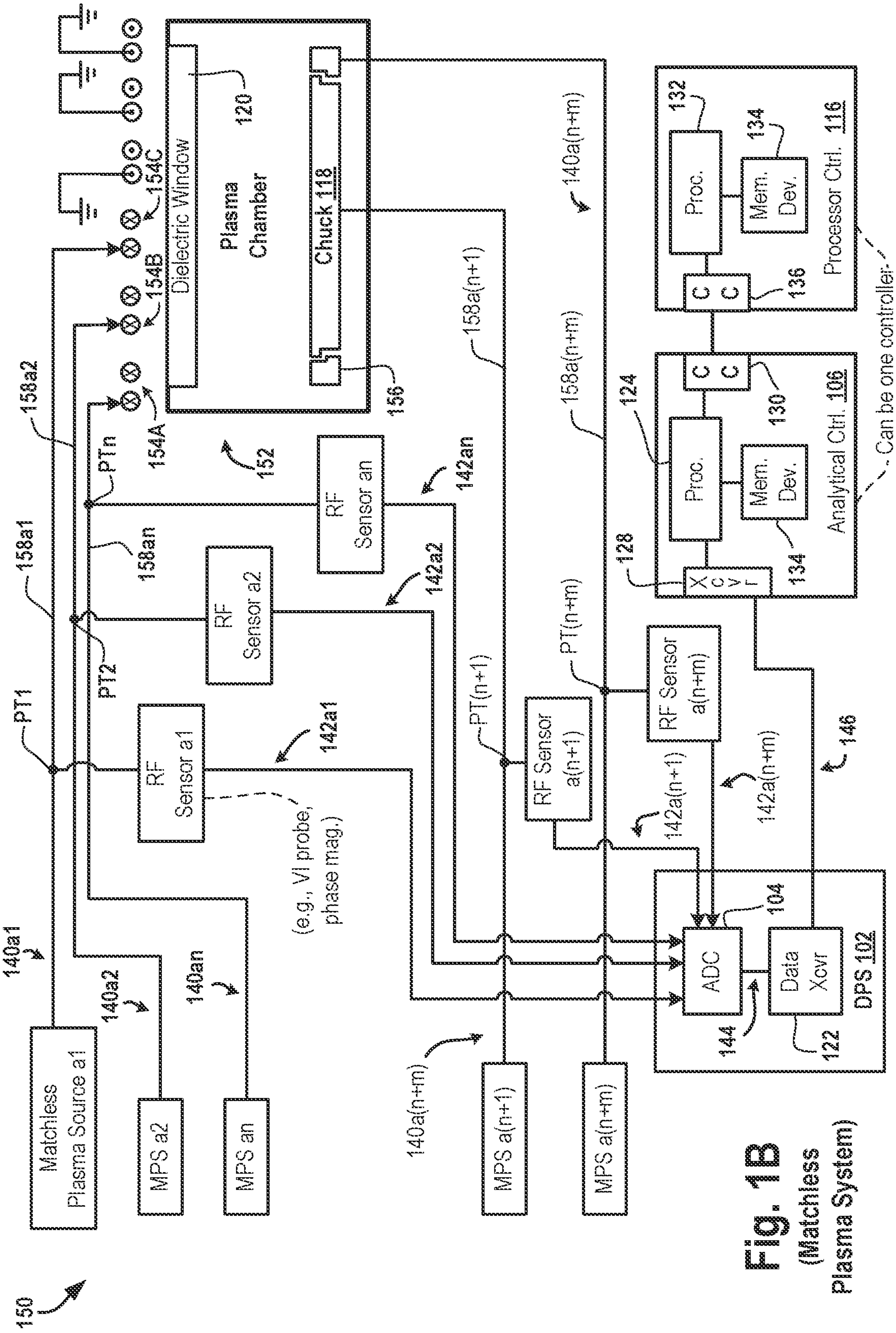
Fig. 1B (Matchless Plasma System)

(Analytical Ctrl. Determines Location & Time Window)

(Control of Plasma Source Based on Metric Data At Location for Time Window)

(Only Portion of Digital Metric Data Stored in Memory Device)

(Plasma Source Controlled According to the Portion)

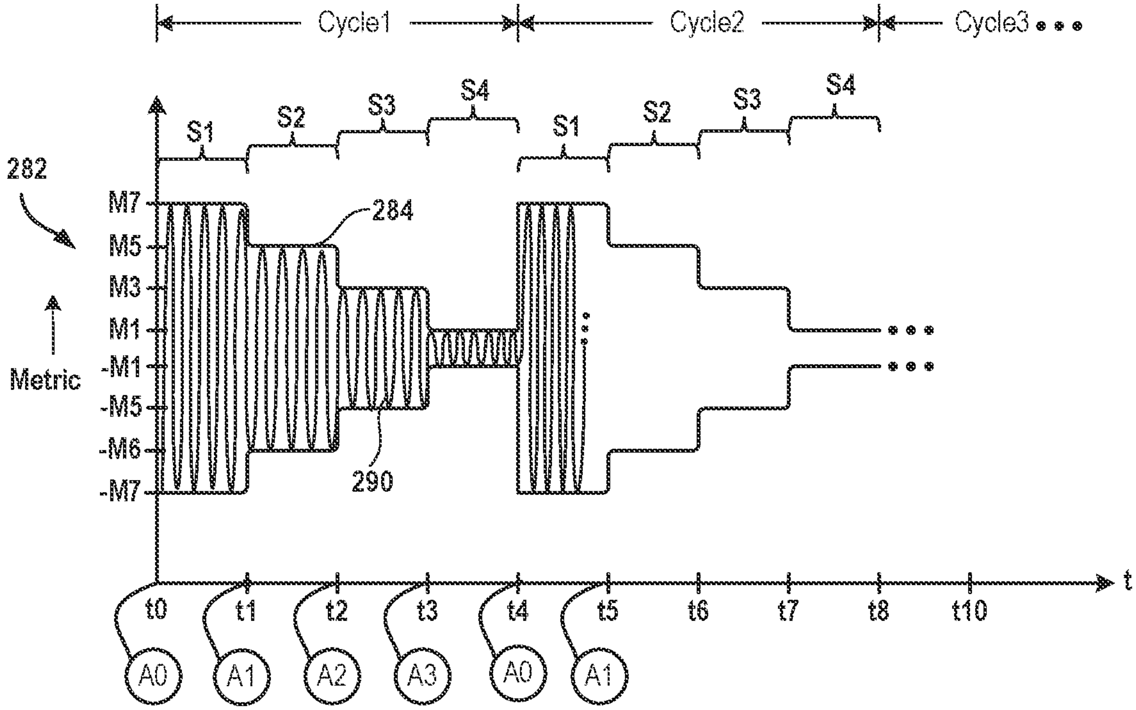
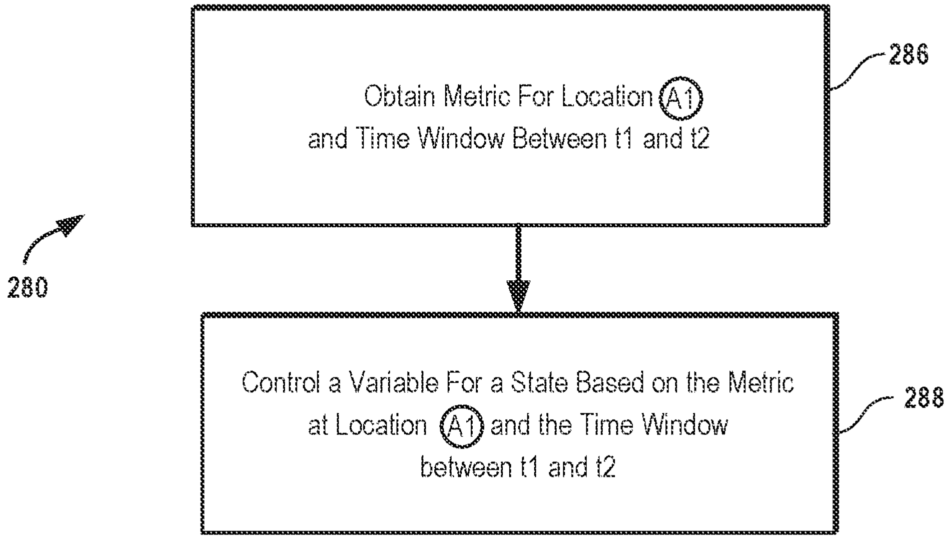
Fig. 2E
(Control a Variable For a State)

(Method for Applying A Statistical Value)

(Virtual Sensors & Consensus)

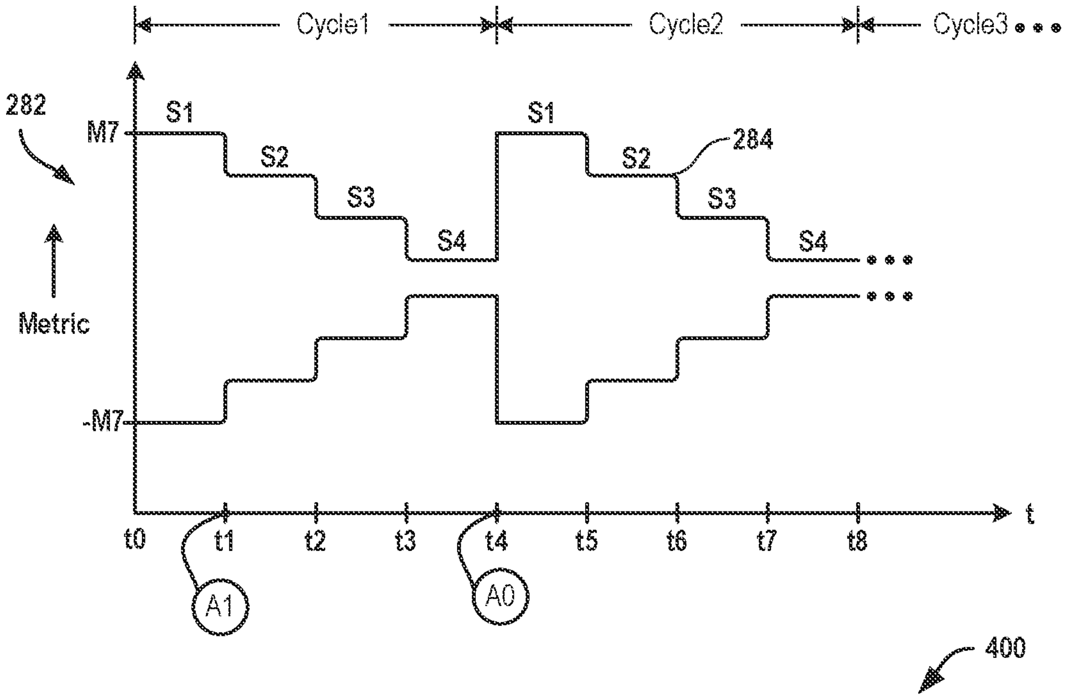
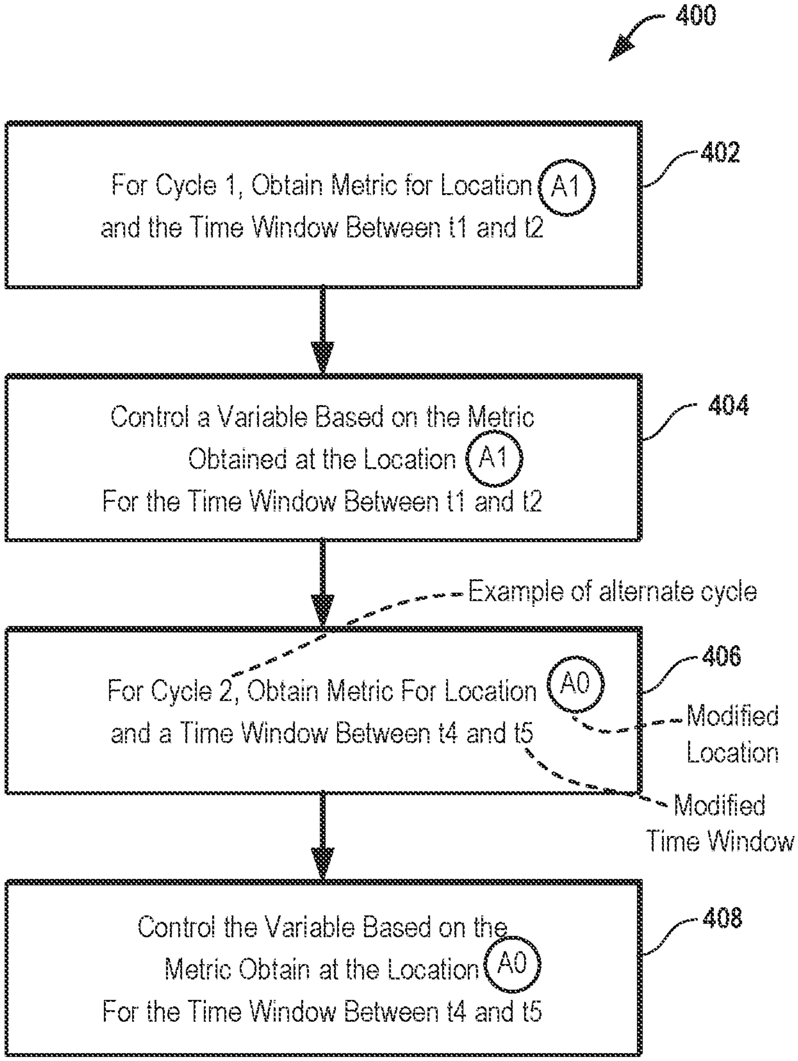
Fig. 4
(Method for Changing Location and/or Time Window)

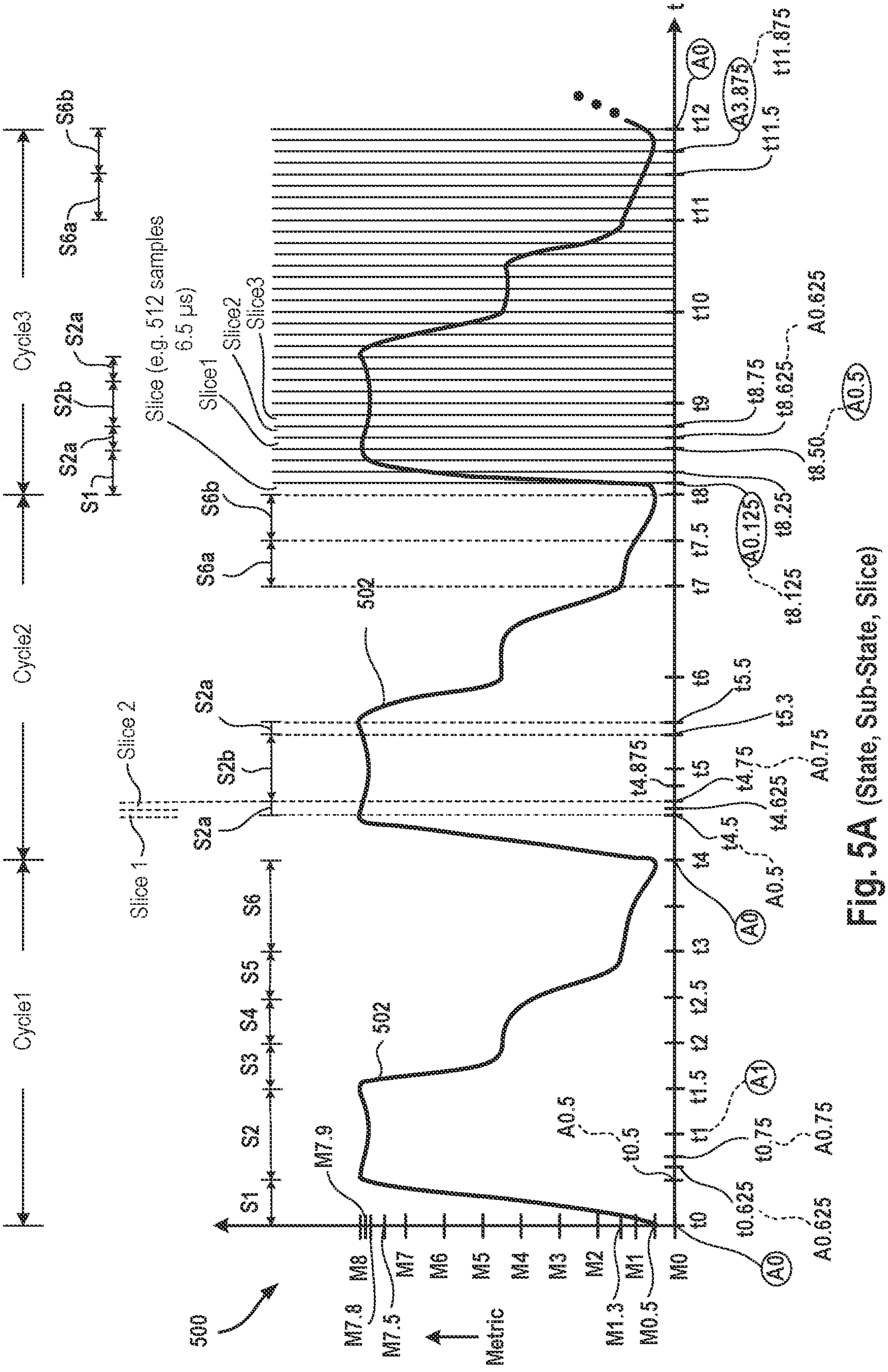
Fig. 5A (State, Sub-State, Slice)

(TTL1)
(All data sampled as per TTL1)

(Master - TTL1)
(All data sampled as per TTL1)

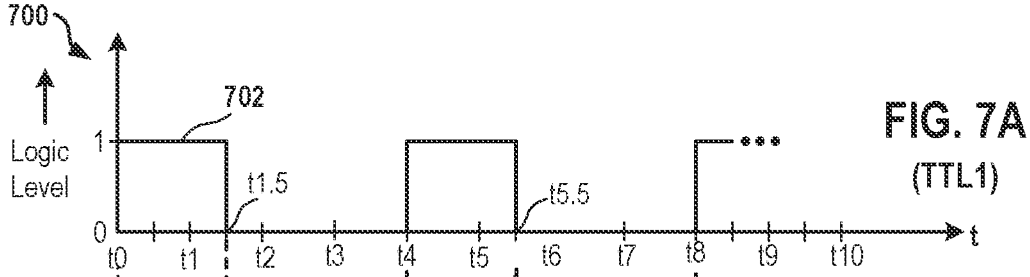
FIG. 7A (TTL1)
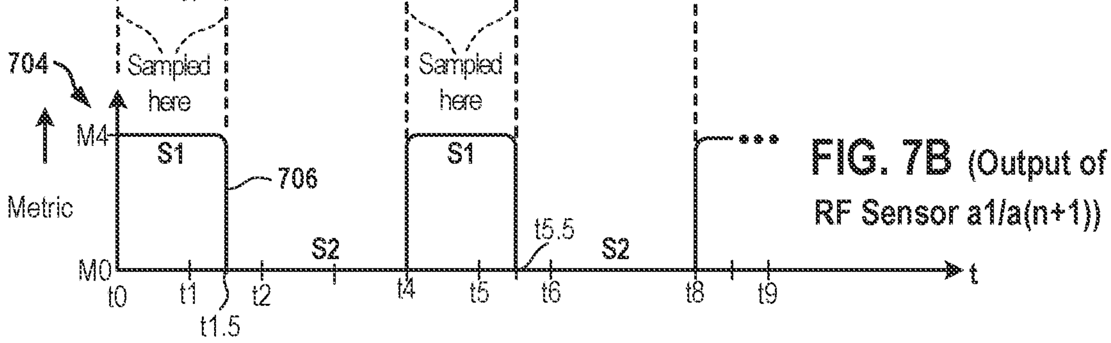
FIG. 7B (Output of RF Sensor a1/a(n+1))
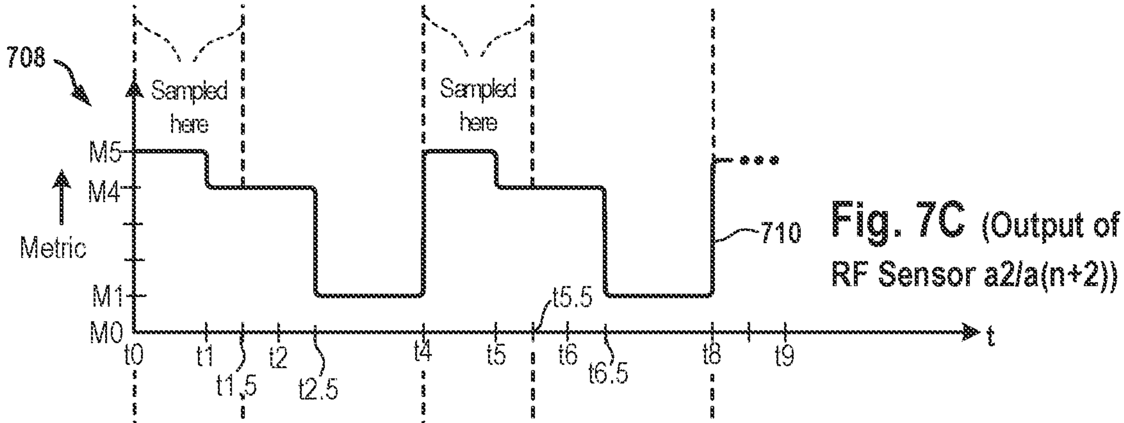
Fig. 7C (Output of RF Sensor a2/a(n+2))
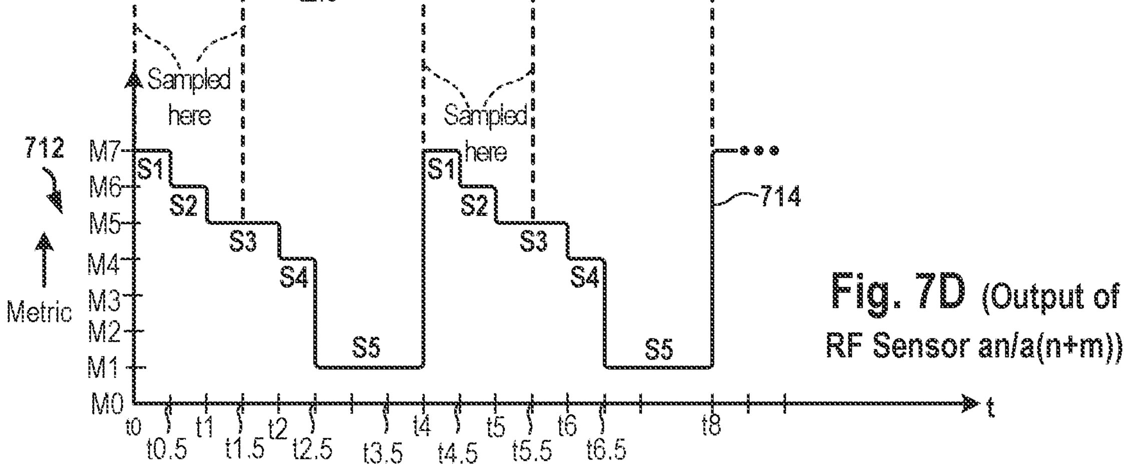
Fig. 7D (Output of RF Sensor an/a(n+m))

(TTLs1-3)

(Data from RFG a1/a(n+1) sampled -TTL1,
Data from RFG a2/a(n+2) sampled -TTL2,
Data from RFG an/a(n+m) sampled -TTL3)

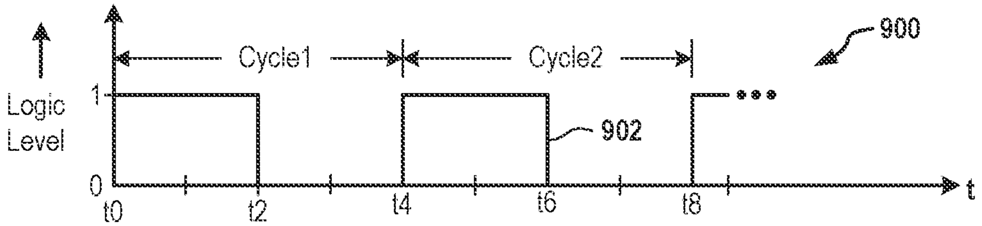
Fig. 9A (TTL Master Clk)
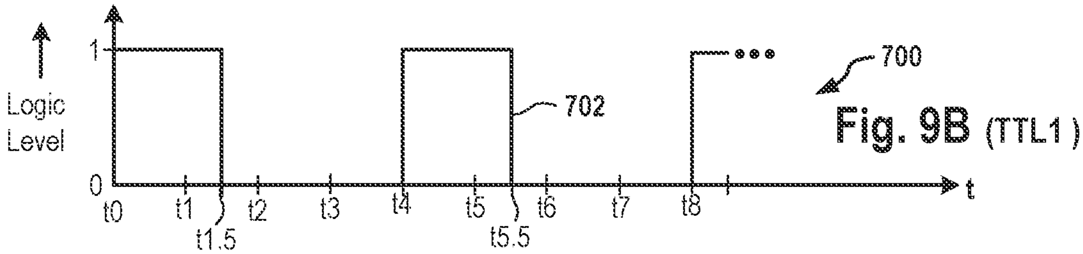
Fig. 9B (TTL1 )
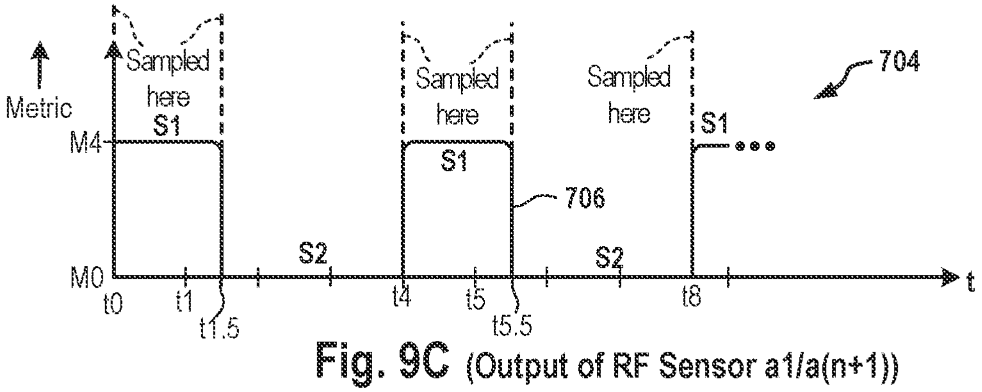
Fig. 9C (Output of RF Sensor a1/a(n+1))
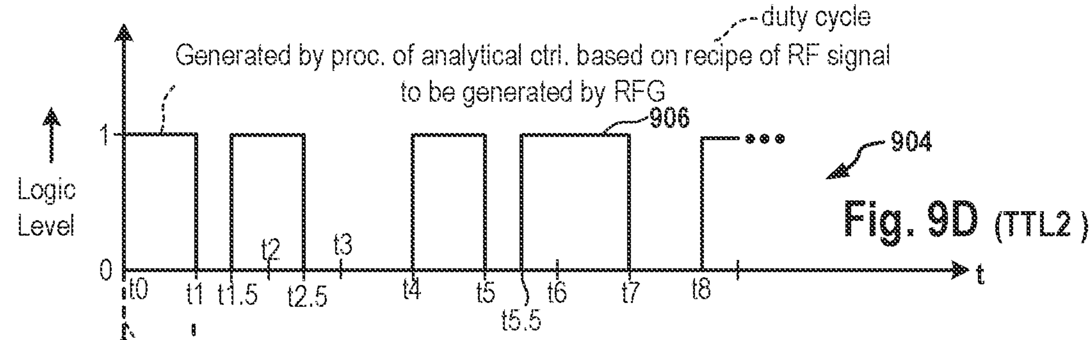
Fig. 9D (TTL2 )
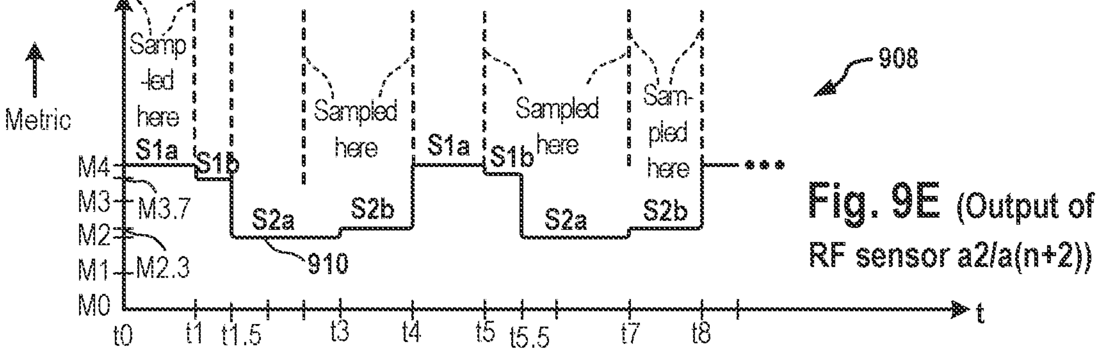
Fig. 9E (Output of RF sensor a2/a(n+2))

(TTL3)

(Output of RF
Sensor an/a(n+m))

(Intra-chamber Matching)

(Chamber-to-Chamber Matching)

(Different Sampling Rates for Edge & Steady State)

(Different Sampling Rates for Edge & Steady State)

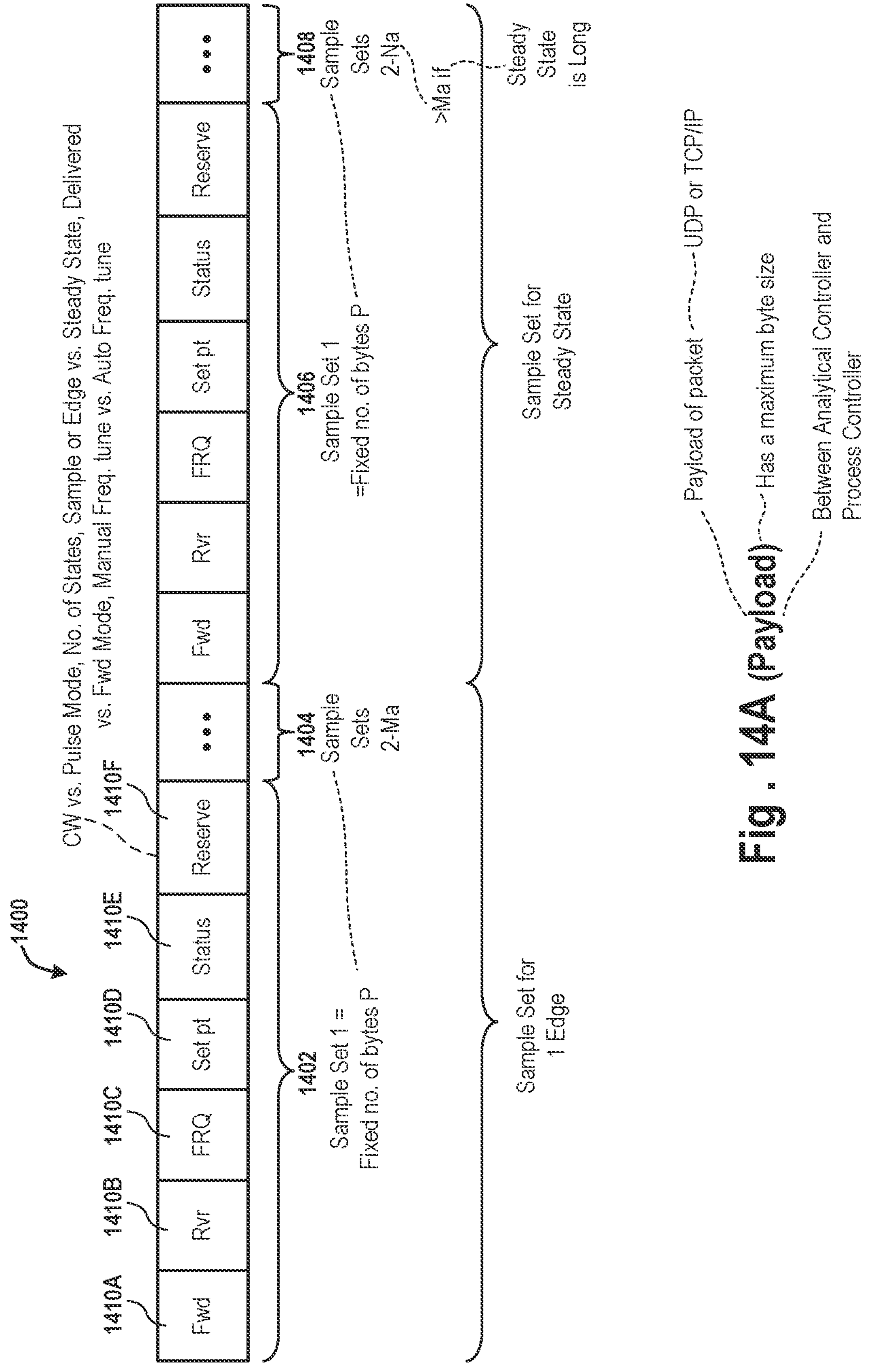
Fig. 14A (Payload)

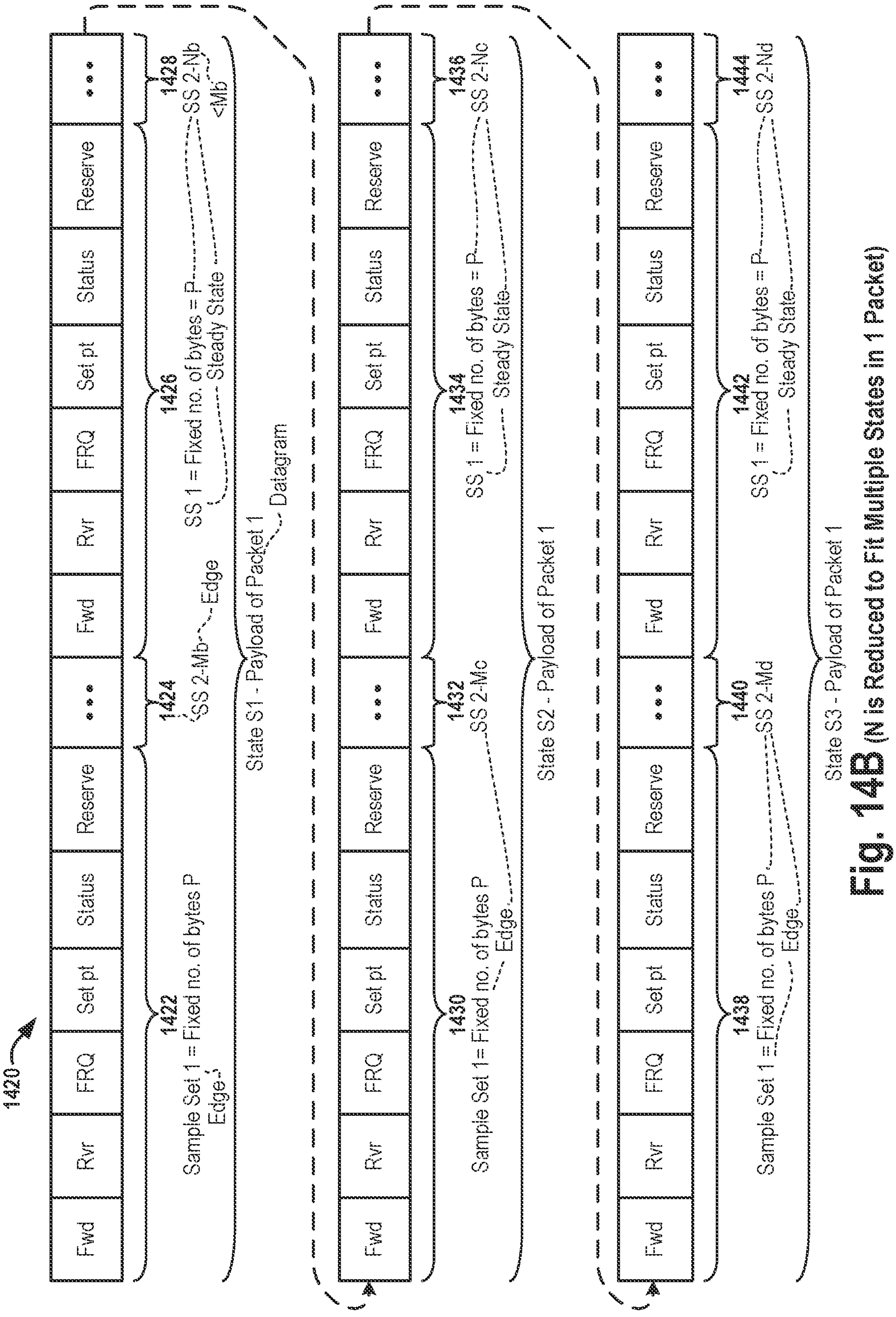
Fig. 14B (N is Reduced to Fit Multiple States in 1 Packet)

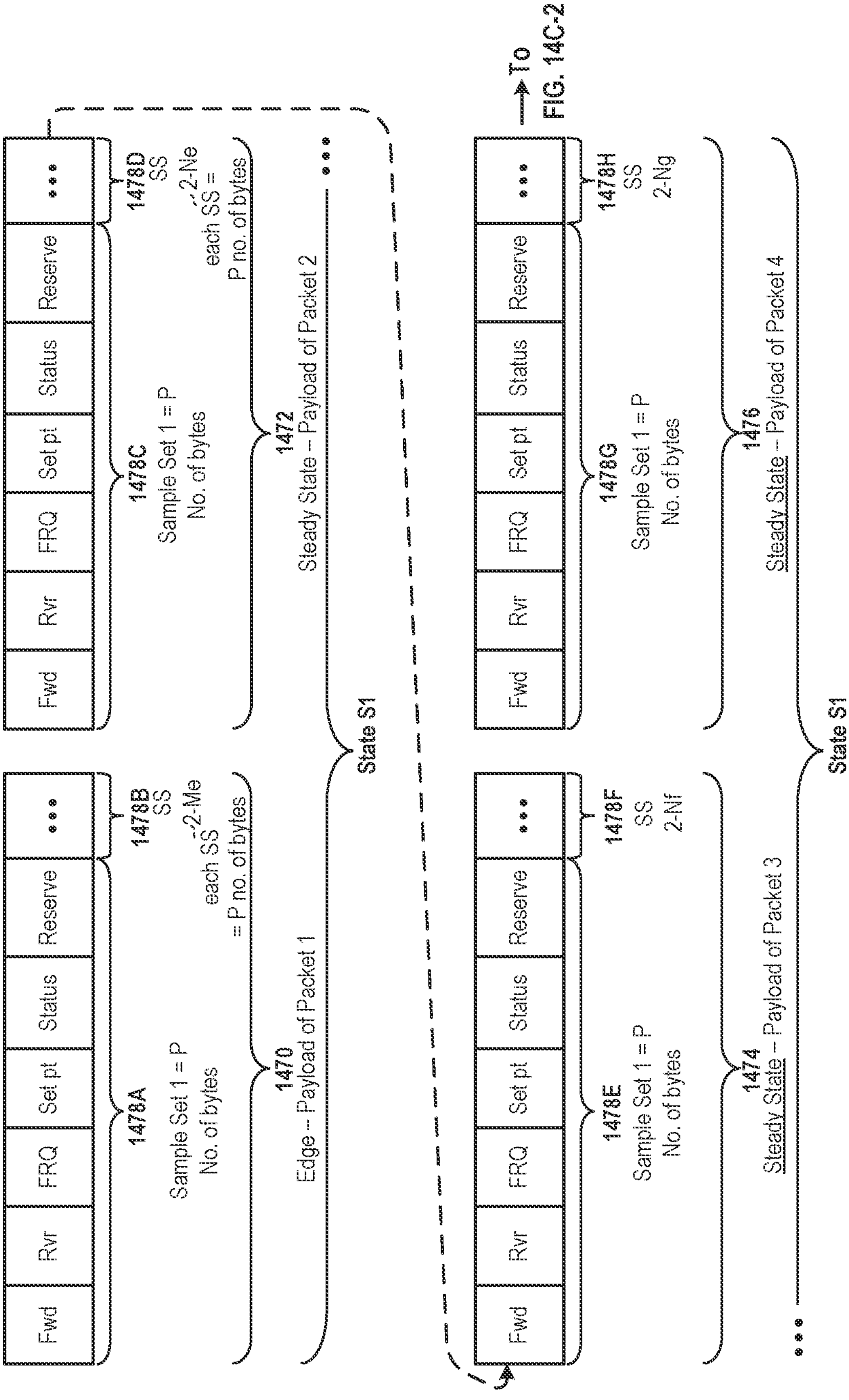
Fig. 14C-1 (Long Steady State Info. Sent in Multiple Packets)

SYSTEMS AND METHODS FOR ANALYZING AND INTELLIGENTLY COLLECTING SENSOR DATA

CLAIM OF PRIORITY

This application is a national stage filing of and claims priority, under 35 U.S.C. § 371, to PCT/US21/48515, filed on Aug. 31, 2021, and titled "SYSTEMS AND METHODS FOR ANALYZING AND INTELLIGENTLY COLLECTING SENSOR DATA", which claims the benefit of and priority, under 35 U.S.C. § 119(e), to U.S. Provisional Patent Application No. 63/076,700, filed on Sep. 10, 2020, and titled "SYSTEMS AND METHODS FOR INTELLIGENTLY COLLECTING SENSOR DATA", all of which are incorporated by reference herein in their entirety.

FIELD

The embodiments described in the present disclosure relate to systems and methods for analyzing and intelligently collecting sensor data.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, one or more radio frequency (RF) generators are coupled to an impedance matching network. The impedance matching network is coupled to a plasma chamber. RF signals are supplied from the RF generators to the impedance matching network. The impedance matching network outputs an RF signal to the plasma chamber upon receiving the RF signals. Also, multiple process gases are supplied via a showerhead of the plasma chamber to a gap within the plasma chamber. When the RF signal is supplied from the impedance matching circuit to the plasma chamber and the process gases are supplied, a wafer is processed in the plasma chamber.

During processing of the wafer, a large amount of data is collected.

It is in this context that embodiments described in the present disclosure arise.

SUMMARY

Embodiments of the disclosure provide sensor agnostic apparatus, methods and computer programs for analyzing and intelligently collecting sensor data. It should be appreciated that the present embodiments can be implemented in numerous ways, e.g., a process, an apparatus, a system, a piece of hardware, or a method on a computer-readable medium. Several embodiments are described below.

In one embodiment, a method for capturing and analyzing metric data is described. The method includes providing, by a processor, a location and a time window for capturing of metric data to a data processing system of a plasma tool. The method further includes receiving the metric data captured at the location and for the time window, analyzing the metric data to generate variable data, and controlling the plasma tool according to the variable data.

In an embodiment, a method for controlling a plasma tool is described. The method includes receiving, by a processor, a first set of metric data from a plasma tool. The method further includes analyzing the first set of metric data to determine a first location and a first time window for capturing of a second set of metric data. The method includes providing, by the processor, the first location and the first time window to a data processing system of the plasma tool. The method also includes receiving the second set of metric data captured at the first location and for the first time window. The method includes analyzing the second set of metric data to generate variable data and controlling the plasma tool according to the variable data.

In one embodiment, a controller for controlling a plasma tool is described. The controller includes a processor. The processor receives a first set of metric data from a plasma tool and analyzes the first set metric data to determine a first location and a first time window used to capture a second set of metric data. The processor provides the first location and the first time window to a data processing system of the plasma tool. The processor further receives the second set of metric data captured at the first location and for the first time window. The processor analyzes the second set of metric data to generate variable data and controls the plasma tool according to the variable data. The controller includes a memory device coupled to the processor.

In an embodiment, a plasma system is described. The plasma system includes a plasma source configured to generate a radio frequency (RF) signal. The plasma system further includes a data processing device. The plasma system includes a controller coupled to the data processing device and the plasma source. The controller receives a first set of metric data associated with the RF signal from an RF sensor. The controller then analyzes the first set metric data to determine a first location and a first time window used to capture a second set of metric data. The controller provides the first location and the first time window to the data processing system and receives the second set of metric data captured at the first location and for the first time window. The controller analyzes the second set of metric data to generate variable data and controls the plasma source according to the variable data.

Some advantages of the herein described systems and methods include providing a location and a time window for which digital metric data is to be collected. The time window extends over a state of the digital metric data or a sub-state of the digital metric data or a slice of the digital metric data. By providing the location and time window, a process can be accurately controlled where desired. Also, by providing the location and time window, an amount of memory space used for saving the digital metric data is reduced. When the location and time window is not provided, a large amount of digital metric data is stored, which increases the memory space.

Additional advantages of the herein described systems and methods include generating a statistical value from digital metric data. The statistical value is stored in a memory device instead of the digital metric data. A variable is then controlled based on the statistical value. By storing the statistical value instead of the digital metric data, an amount of memory space for storing the digital metric data is reduced.

Further advantages of the herein described systems and methods include achieving intra-chamber matching and inter-chamber matching. The intra-chamber matching is achieved between a first set of digital metric data that is collected at the location for the time window and a second set of digital metric data that is collected at the location for the time window. For example, the first set of digital metric data is sampled at the location during a first cycle of a clock signal and the second set of digital metric data is collected at the location during a second cycle of the clock signal. Also, the inter-chamber matching is achieved between a first set of digital metric data that is collected at the location for the time window from a first plasma tool and a second set of digital metric data that is collected at the location for the time window from a second plasma tool. For example, the first set of digital metric data is sampled at the location during a cycle of a clock signal and the second set of digital metric data is collected at the location during the same cycle of the clock signal.

Additional advantages of the herein described systems and methods include sampling an edge of analog metric data at a higher rate compared to a steady state of the analog metric data. The steady state does not change as frequently as the edge. As such, by sampling the edge with a higher frequency compared to a frequency of sampling the steady state, a variable can be controlled with accuracy.

Further advantages of the herein described systems and methods include allocating a larger number of sample sets within a payload upon determining that a first set of digital metric data has a larger number of states, such as steady states or edges. The first set of digital metric data has the larger number of states compared to a number of states of a second set of digital metric data. Additional advantages of the herein described systems and methods include allocating a larger number of packets to a steady state that extends for a larger duration compared to another steady state.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 1A is a diagram of an embodiment of a system for illustrating collection of sensor data from multiple radio frequency (RF) sensors associated with RF generators.

FIG. 1B is a diagram of an embodiment of a system for illustrating collection of sensor data from multiple RF sensors associated with matchless plasma sources.

FIG. 2E is a diagram to illustrate a method for using the additional digital metric data to determine a value of a variable for a state.

FIG. 4 is a diagram of an embodiment of a method to illustrate that a location and a time window for collection of metric data can change with each cycle of a clock signal.

FIG. 5A is an embodiment of a graph to illustrate a state, a sub-state, and a slice of the metric.

FIG. 7A is an embodiment of a graph to illustrate a plot of the TTL1 signal.

FIG. 7B is an embodiment of a graph to illustrate a plot of metric data of the metric that is measured by a first RF sensor of the system of FIG. 6A.

FIG. 7C is an embodiment of a graph to illustrate a plot of metric data of the metric that is measured by a second RF sensor of the system of FIG. 6A.

FIG. 7D is an embodiment of a graph to illustrate a plot of metric data of the metric that is measured by a third RF sensor of the system of FIG. 6A.

FIG. 9A is a graph to illustrate a plot of the clock signal.

FIG. 9B is an embodiment of the graph of FIG. 7A to illustrate the plot of the TTL1 signal.

FIG. 9C is an embodiment of the graph of FIG. 7B to illustrate the plot of the metric data that is output from the first RF sensor.

FIG. 9D is an embodiment of a graph to illustrate a plot of a TTL2 signal of the system of FIG. 8.

FIG. 9E is an embodiment of a graph to illustrate a plot of metric data of the metric that is output from the second RF sensor.

FIG. 14A is a diagram of an embodiment of a payload of a datagram to illustrate a manner in which digital metric data of FIG. 2A is transferred from the analytical controller to the process controller.

FIG. 14B is an embodiment of a payload of a packet that is sent from the analytical controller to the process controller.

FIG. 14C-1 is a diagram of an embodiment of payloads of multiple packets to illustrate that a large amount of digital metric data of a steady state S1 can be distributed among the packets.

FIG. 14C-2 is a diagram of an embodiment of a payload of a packet, which includes digital metric data of an edge associated with a steady state S2.

DETAILED DESCRIPTION

Figure 2A:
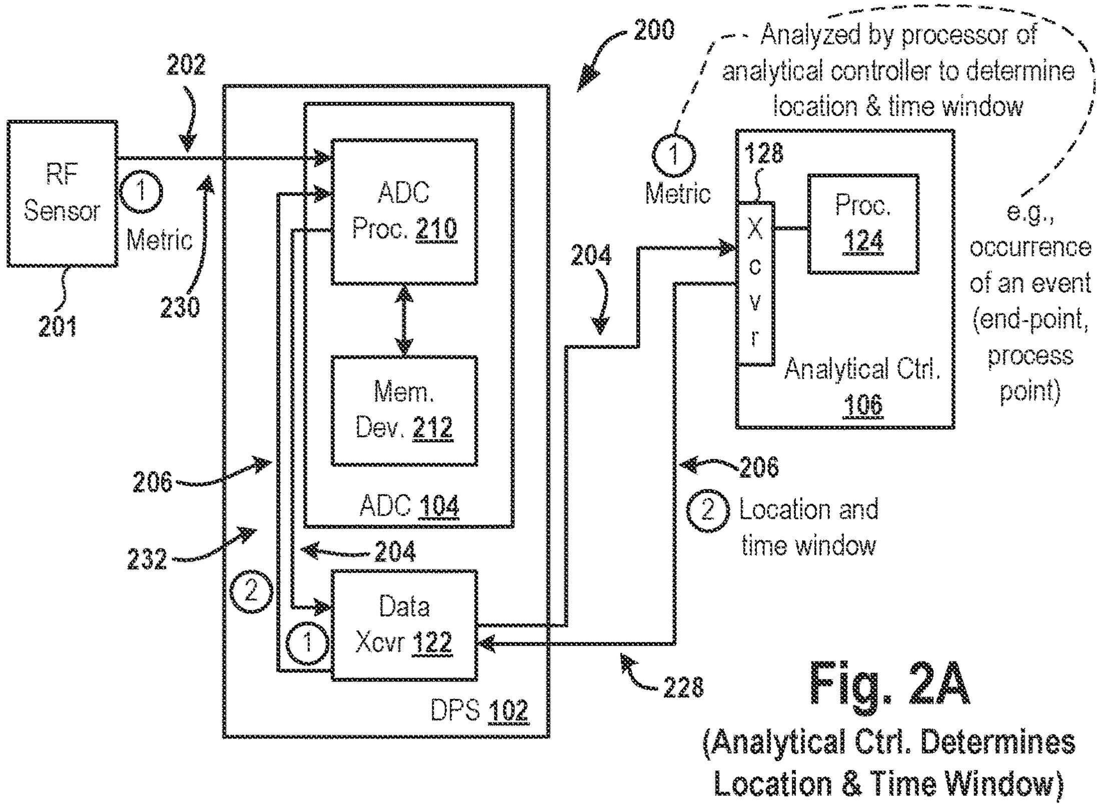
FIG. 2A is a diagram of an embodiment of a system to illustrate functionality of an RF sensor, a data processing system (DPS), and an analytical controller for collection of metric data.

The following embodiments describe systems and methods for analyzing and intelligently collecting sensor data. It will be apparent that the present embodiments may be practiced without some or all of these specific details. In other instances, well known process operations have not been described in detail in order not to unnecessarily obscure the present embodiments.

In one embodiment, metric data of a metric is received by a processor of an analytical controller. The processor of the analytical controller analyzes the metric data to determine a location and a time window for which additional metric data is to be received. The processor sends a signal indicating the location and the time window to a data processing system (DPS). Upon receiving the signal, an analog-to-digital converter (ADC) of the data processing system samples the metric data, such as, converts the metric data from an analog form to a digital form, at the location for the time window to output the additional metric data, and sends the additional metric data to the processor of the analytical controller. The processor of the analytical controller can control a variable of a radio frequency (RF) generator based on the additional metric data collected, such as sampled, at the location for the time window.

FIG. 1A is a diagram of an embodiment of a plasma system 100 for illustrating collection of sensor data from multiple RF sensors a1 through a(n+m), where n is a positive integer and m is a positive integer. A plasma system is sometimes referred to herein as a plasma tool. The system 100 includes RF generators (RFGs) a1 through a(n+m), where n and m are positive integers. The system 100 further includes the RF sensors a1 through a(n+m), multiple match systems 108 and 110, an RF coil 112, and a plasma chamber 114. As an example, the RF coil 112 includes a single RF coil having multiple turns. The system 100 further includes a DPS 102, an analytical controller 106, and a process controller 116. A DPS is sometimes referred to herein as a data processing device.

As an example, each RF generator operates at a frequency. For example, the RF generator RFGa1 operates at a low frequency, the RF generator RFGa2 operates at a medium frequency, and the RF generator RFGan operates at a high frequency. To illustrate, the RF generator RFGa1 generates an RF signal having a frequency of 400 kilohertz (kHz), the RF generator RFGa2 generates an RF signal having a frequency of 27 megahertz (MHz), and the RF generator RFGan generates an RF signal having a frequency of 60 MHz. As another illustration, the RF generator RFGa1 generates an RF signal having a frequency of 2 MHz, and the remaining RF generators RFGa2 and RFGan generate RF signals have the same frequencies as that in the preceding illustration.

A match system, as described herein, includes one or more branch circuits. As an example, the match system has a housing or an enclosure. An example of the match system includes an impedance matching network, and impedance matching circuit, and a match. To illustrate, each branch circuit of the match system includes one or more electrical circuit components, such as transistors, resistors, and capacitors. To further illustrate, each branch circuit includes a series circuit, or a shunt circuit, or a combination thereof. The shunt circuit is coupled to the series circuit at one end and to a ground potential at an opposite end. As an example, the series circuit includes two or more electrical circuit components coupled to each other in series and the shunt circuit includes two or more electrical circuit components coupled to each other in series.

The match system 108 has multiple inputs Ia1 through Ian and an output O108. As an example, each input and output of a match system is a connector. As an example, the inputs Ia1 through Ian are coupled via the branch circuits of the match system 108 to the output O108. To illustrate, the input Ia1 is coupled via a first branch circuit of the match system 108 to the output O108 and the input Ia2 is coupled via a second branch circuit of the match system 108 to the output O108.

Similarly, the match system 110 has multiple inputs Ia(n+1) through Ia(n+m) and an output O110. As an example, the inputs Ia(n+1) through Ia(n+m) are coupled via the branch circuits of the match system 110 to the output O110. To illustrate, the input Ia(n+1) is coupled via a first branch circuit of the match system 110 to the output O110 and the input Ia(n+2) is coupled via a second branch circuit of the match system 110 to the output O110.

Each RF generator RFGa1 through RFGan is coupled to a corresponding input of the match system 108 via a corresponding RF cable. For example, an output Oa1 of the RF generator RFGa1 is coupled to the input Ia1 of the match system 108 via an RF cable RFC a1, an output Oa2 of the RF generator RFGa2 is coupled to the input Ia2 of the match system 108 via an RF cable RFC a2, and an output Oan of the RF generator RFGan is coupled to the input Ian of the match system 108 via an RF cable RFCan. The output O108 of the match system 108 is coupled to the RF coil 112 via an RF transmission line 138.

Similarly, each RF generator RFGa(n+1) through RFGa (n+m) is coupled to a corresponding input of the match system 110 via a corresponding RF cable. For example, an output Oa(n+1) of the RF generator RFGa(n+1) is coupled to the input Ia(n+1) of the match system 110 via an RF cable RFCa(n+1), an output O(n+2) of the RF generator RFGa (n+2) is coupled to the input Ia(n+2) of the match system 110 via an RF cable RFCa(n+2), and an output Oa(n+m) of the RF generator RFGa(n+m) is coupled to the input Ia(n+m) of the match system 110 via an RF cable RFCa(n+m). The output O110 of the match system 110 is coupled to the chuck 118 via an RF transmission line 142.

An example of an RF sensor, as used herein, includes a voltage and current probe, a directional coupler, a complex current sensor, a complex voltage sensor, and a phase mag sensor. To illustrate, the RF sensor measures a metric, such as a complex voltage and current (complex V and I), or forward power, or reflected power, or voltage, or current, or impedance, or a combination of two or more thereof. The complex voltage and current includes a magnitude of a voltage, a magnitude of a current, and a phase between the voltage and current. The complex current sensor measures a complex current, which includes a magnitude of a current and the phase of the current. The complex voltage sensor measures a complex voltage, which includes a magnitude of a voltage and the phase of the voltage. As an example, the forward power is supplied from a plasma source to a plasma chamber and the reflected power is reflected back from the plasma source to the RF generator. Examples of plasma source are provided below. The directional coupler is an example of a power sensor that measures supplied power and reflected power. As an example, the RF cable RFCan passes from an input port of a directional coupler via a channel within the directional coupler to an output port of the directional coupler. As another example, the RF cable RFCan passes from an input port of a VI probe via a channel within the VI probe to an output port of the VI probe.

As an example, one or more of the RF sensors a1 through a(n+m) measures a different metric than remaining of the RF sensors a1 through a(n+m). For example the RF sensor a1 measures a complex voltage and current and the RF sensor an measures a complex voltage. As another example, the RF sensor a(n+1) measures a complex current and the RF sensor a(n+m) measures a complex voltage.

The plasma chamber 114 is an inductively coupled plasma chamber having the RF coil 112. For example, the RF coil 112 is located above a dielectric window 120 of the plasma chamber 114. The plasma chamber 114 further includes a chuck 114, which is an example of a substrate support. An example of the chuck 114 is an electrostatic chuck (ESC). The chuck 114 supports a substrate S, such as a semiconductor wafer, for processing within the plasma chamber 114. The substrate S is placed on a top surface of the chuck 114. The chuck 114 includes a lower electrode, which is fabricated from a metal, such as aluminum or an alloy of aluminum. The chuck 114 faces the dielectric window 120, and a gap is formed between the chuck 114 and the dielectric window 120.

The plasma chamber 114 has a side wall SW, a bottom wall BW, and a top wall TW. The side wall SW is located between the top wall TW and the bottom wall BW. As an example, a part of the top wall TW is formed by the dielectric window 120.

The DPS 102 includes an ADC 104 and a transceiver 122. The ADC 104 is coupled to the transceiver 122. Also, the analytical controller 106 includes a processor 124, a memory device 126, a transceiver 128, and a communication controller (CC) 130. As an example, a communication controller applies, such as executes, a network communication protocol to transfer data to another communication controller. Examples of the network communication protocol include a User Datagram Protocol (UDP), a User Datagram Protocol over Internet Protocol (UDP/IP), and a Transmission Control Protocol over IP (TCP/IP). As an example, a transceiver transfers, such as receives or sends, data by applying a transfer protocol, such as in a parallel manner, or in a serial manner, or by applying a universal serial bus (USB) protocol. The processor 124 is coupled to the transceiver 128, the communication controller 130, and the memory device 126.

As an example, a processor is a central processing unit (CPU), or a microprocessor, or a microcontroller, or an application specific integrated circuit (ASIC), or a programmable logic device (PLD). Examples of a memory device include a random access memory and a read-only memory. To illustrate, the memory device is a flash memory, a solid state memory, or a hard disk, or a redundant array of independent disks.

The process controller 116 includes a processor 132, a memory device 134, and a communication controller 136. The processor 132 is coupled to the memory device 134 and to the communication controller 136.

An example of an RF transmission line includes an RF rod that is surrounded by an RF sheath. There is an insulating material between the RF rod and the RF sheath. Another example of an RF transmission line is a combination of an RF rod and one or more RF straps. To illustrate, the RF rod is surrounded by the RF sheath, is coupled to an RF coil via an RF strap, and is coupled to the output O108 via an RF strap. As another illustration, an RF rod is surrounded by an RF sheath, is coupled to the chuck 114 via an RF strap, and is coupled to the output O110 via an RF strap.

Each RF sensor is coupled to an RF cable between an RF generator and a match system. For example, the RF sensor a1 is coupled at a point Pa1 on the RF cable RFC a1 between the RF generator RFGa1 and the input Ia1, the RF sensor a2 is coupled at a point Pa2 on the RF cable RFC a2 between the RF generator RFGa2 and the input Ia2, and the RF sensor an is coupled at a point Pan on the RF cable RFC an between the RF generator RFGan and the input Ian. As another example, the RF sensor a(n+1) is coupled at a point Pa(n+1) on the RF cable RFCa(n+1) between the RF generator RFGa(n+1) and the input Ia(n+1), the RF sensor a(n+2) is coupled at a point Pa(n+2) on the RF cable RFCa(n+2) between the RF generator RFGa(n+2) and the input Ia(n+2), and the RF sensor a(n+m) is coupled at a point Pa(n+m) on the RF cable RFC a(n+m) between the RF generator RFGa (n+m) and the input Ia(n+m).

The RF sensors a1 through a(n+m) are coupled to the ADC 104 of the DPS 102. The DPS 102 is coupled to the analytical controller 106, which is coupled to the process controller 116. For example, the transceiver 122 is coupled to the transceiver 128 via a parallel transfer cable, a serial transfer cable, or a USB cable. The parallel transfer cable transfers data in the parallel manner, such as a simultaneous manner. The serial transfer cable transfers data in the serial manner, such as a consecutive manner. The USB cable transfers data using the USB protocol. Also, in the example, the communication controller 130 is coupled to the communication controller 136.

The processor 124 is coupled to an RF generator via a corresponding transfer cable. For example, the processor 124 is coupled to the RF generator RFGa1 via a transfer cable TCa1, is coupled to the RF generator RFGa2 via a transfer cable TCa2, and is coupled to the RF generator RFGan via a transfer cable TCan. Also, the processor 124 is coupled to the RF generator RFGa(n+1) via a transfer cable TCa(n+1), is coupled to the RF generator RFGa(n+2) via a transfer cable TCa(n+2), and is coupled to the RF generator RFGa(n+m) via a transfer cable TCa(n+m). Examples of a transfer cable are provided above.

As an example, the process controller 116 is managed by an entity that is different from an entity that manages the analytical controller 106. To illustrate, the process controller 116 is managed by a manufacturer A of one or more components of the plasma system 100 and the analytical controller 106 is managed by a customer of the manufacturer. The customer uses the components of the plasma system 100 to fabricate the substrate.

The processor 124 accesses a recipe, which includes the variable, such as frequency or power or a combination thereof. The recipe is accessed from the memory device 126. The recipe is for each of the RF generators RFGa1 through RFGa(n+m). For example, a the RF generator RFGa1 is controlled based on a first recipe and the RF generator RFGan is controlled based on a second recipe. The processor 124 sends recipe signals including corresponding recipes to the RF generators RFGa1 through RFGa(n+m).

After sending the recipe signals, the processor 124 sends a trigger signal, such as a single digital pulse, to the RF generators RFGa1 through RFGa(n+m). Upon receiving the trigger signal, each RF generator RFGa1 through RFGa(n+m) generates an RF signal based on a corresponding recipe. For example, the RF generators RFGa1 through RFGa(n+m) generate corresponding RF signals 140*a*1, 140*a*2, 140*an*, 140*a*(n+1), 140*a*(n+2), and 140*a*(n+m) according to the corresponding recipes. For example, the RF generator RFGan generates the RF signal 140*an* based on an $n^{th}$ recipe and the RF generator RFGa(n+m) generates the RF signal 140*a*(n+m) based on an $(n+m)^{th}$ recipe.

The match system 108 receives the RF signals 140*a*1 through 140*an* at the inputs Ia1 through Ian and modifies impedances of the RF signals 140*a*1 through 140*an* to output modified impedance signals. The match system 108 matches an impedance of a load coupled to the output O108 with that of a source coupled to the inputs Ia1 through Ian to modify the impedances of the RF signals 140*a* through 140*an*. An example of the load coupled to the output O108 is the RF transmission line 138 and the plasma chamber 114, and an example of the source coupled to the inputs Ia1 through Ian is the RF cables RFCa1 through RFCan and the RF generators RFGa1 through RFGan. The modified impedance signals are combined at the output O108 to output a modified RF signal 144. The modified RF signal 144 is sent from the output O108 via the RF transmission line 138 to the RF coil 112.

Similarly, the match system 110 receives the RF signals 140*a*(n+1) through 140*a*(n+m) at the inputs Ia(n+1) through Ia(n+m) and modifies impedances of the RF signals 140*a*(n+1) through 140*a*(n+m) to output modified impedance signals. The match system 108 matches an impedance of a load coupled to the output O110 with that of a source coupled to the inputs Ia(n+1) through Ia(n+m) to modify the impedances of the RF signals 140*a*(n+1) through 140*a*(n+m). An example of the load coupled to the output O110 is the RF transmission line 142 and the plasma chamber 104, and an example of the source coupled to the inputs Ia(n+1) through Ia(n+m) is the RF cables RFCa(n+1) through RFCa(n+m) and the RF generators RFGa(n+1) through RFGa(n+m). The modified impedance signals are combined at the output O110 to output a modified RF signal 146. The modified RF signal 146 is sent from the output O110 via the RF transmission line 142 to the lower electrode of the chuck 118. When one or more process gases, such as an oxygen-containing gas, or a fluorine-containing gas, or a nitrogen-containing gas, or a combination thereof, are supplied to the plasma chamber 114, in addition to the modified RF signals 144 and 146, plasma is generated or maintained within the plasma chamber 114.

When plasma is generated or maintained within the plasma chamber 114, the RF sensors a1 through a(n+m) sense data of the RF signals 140*a*1 through 140*a*(n+m) transferred via the RF cables RFC1 through RFCa(n+m) to output analog metric data and provide the analog metric data to the ADC 104. For example, the RF sensor a1 senses or measures data of the RF signal 140*a*1 to output analog metric data 142*a*1, the RF sensor a2 senses data of the RF signal 140*a*2 to output analog metric data 142*a*2, and the RF sensor an senses data of the RF signal 140*an* to output analog metric data 142*an*. Also, the RF sensor a(n+1) senses data of the RF signal 140*a*(n+1) to output analog metric data 142*a*(n+1), the RF sensor a(n+2) senses data of the RF signal 140*a*(n+2) to output analog metric data 142*a*(n+2), and the RF sensor a(n+m) senses data of the RF signal 140*a*(n+m) to output analog metric data 142*a*(n+m).

The RF sensors a1 through a(n+m) send the analog metric data 142*a*1 through 142*a*(n+m) via the transfer cables to the ADC 104. The ADC 104 collects, such as samples, the analog metric data 142*a*1 through 142*a*(n+m) to output digital metric data 144. For example, the ADC 104 converts the analog metric data 142*a*1 through 142*a*(n+m) received from the RF sensors a1 through a(n+m) from the analog form to the digital form to output the digital metric data 144.

The transceiver 122 of the DPS 102 applies the transfer protocol to the digital metric data 144 to generate data transfer units 146 and sends the data transfer units 146 to the transceiver 128. It should be noted that analog metric data or digital metric data, as described herein, is data of the metric.

The transceiver 128 obtains the data transfer units 146 and applies the transfer protocol to the data transfer units 146 to extract the digital metric data 144. The transceiver 128 provides the digital metric data 144 to the processor 124. The processor 124 of the analytical controller 106 analyzes the digital metric data 144 to determine whether to control the ADC 104 to change a location and time window for which additional analog metric data output by one or more of the RF sensors a1 through a(n+m) is to be collected by the ADC 104. For example, the processor 124 determines that additional analog metric data output by the RF sensor a1 is to be converted from the analog form to the digital form at the changed location for the changed time window. In the example, the processor 124 sends a control signal to the ADC 104 via the transceiver 128 of the analytical controller 106 and the transceiver 122 of the DPS 102 indicating the changed location and the changed time window. The ADC 104 receives the changed location and the changed time window and converts the additional analog metric data output by the RF sensor a1 at the changed location for the changed time window from the analog form to the digital form.

As another example, the processor 124 of the analytical controller 106 analyzes the digital metric data 144 to determine to control the ADC 104 to change a first location and a first time window for which additional analog metric data output by the RF sensor an is to be collected by the ADC 104. In the example, the processor 124 sends a control signal to the ADC 104 via the transceiver 128 of the analytical controller 106 and the transceiver 122 of the DPS 102 indicating the changed first location and the changed first time window. The ADC 104 receives the changed first location and the changed first time window and converts the additional analog metric data output by the RF sensor an at the changed first location for the changed first time window from the analog form to the digital form. Also, in the example, the processor 124 of the analytical controller 106 analyzes the digital metric data 144 to determine to control the ADC 104 to change the first location and the first time window for which additional analog metric data output by the RF sensor a(n+m) is to be collected by the ADC 104. In the example, the processor 124 sends a control signal to the ADC 104 via the transceiver 128 of the analytical controller 106 and the transceiver 122 of the DPS 102 indicating the changed first location and the changed first time window. The ADC 104 receives the changed first location and the changed first time window and converts the additional analog metric data output by the RF sensor a(n+m) at the changed first location for the changed first time window from the analog form to the digital form.

As yet another example, the processor 124 of the analytical controller 106 analyzes the digital metric data 144 to determine to control the ADC 104 to change a first location and a first time window for which additional analog metric data output by the RF sensor an is to be collected by the ADC 104. In the example, the processor 124 sends a control signal to the ADC 104 via the transceiver 128 of the analytical controller 106 and the transceiver 122 of the DPS 102 indicating the changed first location and the changed first time window. The ADC 104 receives the changed first location and the changed first time window and converts the additional analog metric data output by the RF sensor an at the changed first location for the changed first time window from the analog form to the digital form. Also, in the example, the processor 124 of the analytical controller 106 analyzes the digital metric data 144 to determine to control the ADC 104 to change a second location and a second time window for which additional analog metric data output by the RF sensor a(n+m) is to be collected by the ADC 104. In the example, the processor 124 sends a control signal to the ADC 104 via the transceiver 128 of the analytical controller 106 and the transceiver 122 of the DPS 102 indicating the changed second location and the changed second time window. The ADC 104 receives the changed second location and the changed second time window and converts the additional analog metric data output by the RF sensor a(n+m) at the changed second location for the changed second time window from the analog form to the digital form. In the example, the first location is different from the second location and the first time window is different from the second time window. To illustrate, the first location falls before or after in time compared to the second location and the first time window has a time period that falls before or after a time period of the second time window. To further illustrate, the second time window partially overlaps with the first time window but does not completely overlap with the first time window. Further description of functionality of the system 100 is described below with reference to FIGS. 2A and 2B.

In an embodiment, a clock source, such as a clock oscillator or a digital clock, generates a clock signal and supplies the clock signal to the ADC 104 for converting from the analog form to the digital form, such as sampling, the analog metric data 142*a*1 through 142*a*(n+m) received from the RF sensors a1 through a(n+m). The analog metric data 142*a*1 through 142*a*(n+m) is converted from the analog form to the digital form synchronous with the clock signal. For example, the analog metric data 142*a*1 through 142*a*(n+m) is converted at each instance of a rise time or at each instance of a fall time of the clock signal. As an example, the clock source is the processor 124. As another example, the clock source is the processor 132. In the example, the processor 132 provides the clock signal via the communication controller 136, the communication controller 130, the processor 124, the transceiver 128, and the transceiver 122 to the ADC 104. As yet another example, the processor 124 or the processor 132 receives the clock signal from the Internet and supplies the clock signal to the ADC 104.

In one embodiment, an RF sensor is located within an RF generator or within a match system. For example, the RF sensor a1 is located within the RF generator RFGa1 or within the match system 108.

In an embodiment, the analytical controller 106 is coupled to the process controller 116 via a computer network, such as a wide area network (WAN) or a local area network (LAN) or a combination thereof. An example of WAN includes the Internet and an example of LAN includes an Intranet.

In one embodiment, instead of the analytical controller 106 and the process controller 116, a single controller is used.

In an embodiment, a transceiver is sometimes referred to herein as a data transceiver and vice versa.

In one embodiment, the variable is voltage instead of power.

In one embodiment, the system 100 includes more or less than the number of RF generators other than that illustrated in FIG. 1A. For example, instead of the RF generators RFGa1 through RFGan, a single RF generator is used, and the chuck 118 is coupled to the ground potential. As another example, instead of the RF generators RFGa(n+1) through RFGa(n+m), a single RF generator is used, and the RF coil 112 is coupled to the ground potential.

In an embodiment, instead of the plasma chamber 114, a conductively coupled plasma (CCP) chamber is used. For example, instead of the RF coil system 102 and the dielectric window 120, a top electrode is used. The top electrode is a plate that is fabricated from the metal, such as aluminum or its alloy. A top wall of the CCP chamber is located above the top electrode.

In one embodiment, instead of a match system, separate match systems are coupled to the RF generators of FIG. 1A. For example, a first match system is coupled to the RF generator RFGa1, and a second match system is coupled to the RF generator RFGa2. As another example, a first match system is coupled to the RF generator RFGa(n+1), and a second match system is coupled to the RF generator RFGa(n+2).

In an embodiment, one of the RF sensors a1 through a(n+m) is coupled at any point between an output of a corresponding RF generator and an input of a corresponding match system. For example, the RF sensor a1 is coupled at the output Oa1 of the RF generator RFGa1 or at the input Ia1 of the match system 108. As another example, the RF sensor a(n+m) is coupled at the output Oa(n+m) or at the input Ia(n+m).

In one embodiment, one or more additional RF sensors are coupled to the RF transmission line 138. For example, a first RF sensor is coupled at the output O108. As another example, a first RF sensor is coupled to the RF rod of the RF transmission line 138 and a second RF sensor is coupled at the output O108. As yet another example, an RF sensor is coupled proximate to the RF coil 112 compared to the output O108. The one or more additional RF sensors are coupled to the ADC 104 to provide analog metric data to the ADC 104. The ADC 104 samples the analog metric data to output digital metric data, and sends the digital metric data to the processor 124. The processor 124 determines values of the variable based on the digital metric data.

In one embodiment, instead of the processor 124, the processor 132 analyzes the digital metric data 144 to determine to control the ADC 104 to change one or more locations and one or more time windows for which additional analog metric data output by one or more of the RF sensors a1 through a(n+m) is to be collected by the ADC 104. For example, the processor 124 provides the digital metric data 144 to the communication controller 130. The communication controller 130 applies the network communication protocol to the digital metric data 144 to generate one or more data packets and sends the data packets to the communication controller 136. Upon receiving the one or more data packets, the communication controller 136 applies the network communication protocol to extract the digital metric data 144 and provides the digital metric data 144 to the processor 132 for the analysis. The processor 132, instead of the processor 124, generates and sends the control signal to the ADC 104 via the communication controller 136, the communication controller 130, the processor 124, the transceiver 128, and the transceiver 122 of the DPS 102.

In one embodiment, one or more additional RF sensors are coupled to an RF transmission line that is coupled to an edge ring. The edge ring surround the chuck 118 and is coupled to a match system via the RF transmission line. The one or more additional RF sensors are coupled to the ADC 104 to provide analog metric data to the ADC 104. The ADC 104 samples the analog metric data to output digital metric data, and sends the digital metric data to the processor 124. The processor 124 determines values of the variable based on the digital metric data.

In an embodiment, multiple RF coils are located besides the plasma chamber 104. For example, a first RF coil is located above the dielectric window 120 and a second RF coil is located at a level below a level of the top wall TW to surround the side wall SW. In the example, a first match system is coupled via a first RF transmission line to the first RF coil and a second match system is coupled via a second RF transmission line to the second RF coil. Also, in the example, one or more RF generators are coupled to the first match system and one or more RF generators are coupled to the second match system.

In one embodiment, instead of the plasma chamber 114, another plasma chamber is used in the system 100. The other plasma chamber includes the edge ring that surrounds the chuck 118. The edge ring is fabricated from the metal. One or more RF generators are coupled to the edge ring via a match system in the same manner in which the RF generators a(n+1) through a(n+m) are coupled via the match system 110 to the chuck 118. Also, one or more RF sensors, similar to the RF sensors a(n+1) through a(n+m), are coupled to RF cables that couple the RF generators to the edge ring. The one or more RF sensors measure data regarding RF signals that are sent by the one or more RF generators to output analog metric data and provide the analog metric data to the ADC 104. The ADC 104 generates digital metric data from the analog metric data in the same manner as that described above and provide the digital metric data to the processor 124. The processor 124 analyzes the digital metric data to determine to control the ADC 104 to change one or more locations and one or more time windows for which additional analog metric data output by the one or more RF sensors is to be collected by the ADC 104.

FIG. 1B is a diagram of an embodiment of a matchless plasma system 150. The matchless plasma system 150 is similar to the plasma system 100 except that the matchless plasma system 150 does not include the match systems 108 and 110 (FIG. 1A). Also, the matchless plasma system 150 includes a plasma chamber 152. The matchless plasma system 150 further includes multiple matchless plasma sources (MPSs) a1 through a(n+m), the RF sensors a1 through a(n+m), the DPS 102, the analytical controller 106, and the process controller 116.

The plasma chamber 152 includes the chuck 118, the dielectric window 120, and multiple RF coils 154A, 154B, and 154C. The RF coils 154A, 154B, and 154C are located above the dielectric window 120. The plasma chamber 152 includes an edge ring 156, such as a lower electrode extension. The edge ring 156 surrounds the chuck 118.

The matchless plasma source MPSa1 is coupled via an RF connection **158*a*1 to the RF coil 154C. Examples of an RF connection include a conductor, an RF strap, a cylinder, and a combination thereof. Similarly, the matchless plasma source MPSa2 is coupled via an RF connection 158*a*2 to the RF coil 154B and the matchless plasma source MPSan is coupled via an RF connection 158*an* to the RF coil 154A. Also, the matchless plasma source MPSa(n+1) is coupled via an RF connection 158*a*(n+1) to the chuck 118 and the matchless plasma source MPSa(n+m) is coupled via an RF connection 158*a*(n+m) to the chuck 118**.

The RF sensor a1 is coupled to a point PT1 on the RF connection **158*a*1. For example, the RF sensor a1 is coupled to a point on a conductor of the RF connection 158*a*1. Similarly, the RF sensor a2 is coupled to a point PT2 on the RF connection 158*a*2, the RF sensor an is coupled to a point PTn on the RF connection 158*an*, the RF sensor a(n+1) is coupled to a point PT(n+1) on the RF connection 158*a*(n+1), and the RF sensor a(n+m) is coupled to a point PT(n+m) on the RF connection 158*a*(n+m). The RF sensors a1, a2, an, a(n+1), and a(n+m) are coupled to the ADC 104 in the manner described above with reference to FIG. 1**A.

The matchless plasma source MPSa1 generates the RF signal **140*a*1 and sends the RF signal 140*a*1 to the RF coil 154C. Similarly, the matchless plasma source MPSa2 generates the RF signal 140*a*2 and sends the RF signal 140*a*2 to the RF coil 154B and the matchless plasma source MPSan generates the RF signal 140*an* and sends the RF signal 140*an* to the RF coil 154A. Also, the matchless plasma source MPSa(n+1) generates the RF signal 140*a*(n+1) and sends the RF signal 140*a*(n+1) to the chuck 118 and the matchless plasma source MPSa(n+m) generates the RF signal 140*a*(n+m) and sends the RF signal 140*a*(n+m) to the edge ring 156**.

When the one or more process gases are supplied to the plasma chamber 152 in addition to the RF signals **140*a*1 through 140*a*(n+m), plasma is generated or maintained within the plasma chamber 152. When the plasma is generated or maintained, the RF sensors a1 through a(n+m) measure data of the RF signals 140*a*1 through 140*a*(n+m) transferred via the RF connections 158*a*1 through 158*a*(n+m) to output analog metric data. For example, the RF sensor a1 measures data of the RF signal 140*a*1 to output the analog metric data 142*a*1, the RF sensor a2 measures data of the RF signal 140*a*2 to output the analog metric data 142*a*2, the RF sensor an measures data of the RF signal 140*an* to output the analog metric data 142*an*, the RF sensor a(n+1) measures data of the RF signal 140*a*(n+1) to output the analog metric data 142*a*(n+1), and the RF sensor a(n+m) measures data of the RF signal 140*a*(n+m) to output the analog metric data 142*a*(n+m). The remaining operations performed on the analog metric data 142*a*1 through 142*a*(n+m) are described above with reference to FIG. 1**A.

In one embodiment, another plasma chamber that includes a different number, such as a higher or a lower number, of RF coils than that illustrated in FIG. 1B is used instead of the plasma chamber 152. For example, the other plasma chamber excludes the RF coil 154B or the RF coil 154A.

FIG. 2A is a diagram of an embodiment of a system 200 to illustrate functionality of an RF sensor 201, the DPS 102, and the analytical controller 106. The RF sensor 201 is an example of any of the RF sensors a1 through a(n+m) (FIG. 1A or 1B). The ADC 104 includes an ADC processor 210 and a memory device 212. The ADC processor 210 is coupled to the memory device 212. The transceiver 122 of the DPS 102 is coupled to the ADC processor 210.

The ADC processor 210 receives analog metric data 202 sensed by the RF sensor 201 and collects, such as samples, the analog metric data 202 to output digital metric data 204. For example, the ADC processor 210 converts the analog metric data 202 from the analog form to the digital form. To illustrate, the ADC processor 210 samples the analog metric data 202 at a sampling rate (SR) to output the digital metric data 204. As another illustration, the ADC processor 210 captures a snapshot of the analog metric data 202 at various times to output the digital metric data 204. The analog metric data 202 is an example of the analog metric data output from any of the RF sensors a1 through a(n+m) (FIGS. 1A and 1B). For example, the analog metric data 202 is an example of the analog metric data 142*an* or 142*a*(n+m) (FIGS. 1A and 1B).

The ADC processor 210 stores the digital metric data 204 in the memory device 212. The ADC processor 210 accesses the digital metric data 204 from the memory device 212 and provides the digital metric data 204 to the transceiver 122.

The transceiver 122 applies the transfer protocol to the digital metric data 204 to generate one or more data transfer units and provides the one or more data transfer units to the transceiver 128 of the DPS 102. The transceiver 128 applies the transfer protocol to extract the digital metric data 204 from the one or more data transfer units and sends the digital metric data 204 to the processor 124 of the analytical controller 106. The processor 124 analyzes the digital metric data 204 to determine a location and a time window for which additional analog metric data 222 (FIG. 2B) is to be collected. For example, the processor 124 determines that the digital metric data 204 has a rising edge and a falling edge. In the example, the processor 124 determines to collect the additional analog metric data 222 at a location of a start of the rising edge for a time window, which ends at an end of the rising edge. Also, in the example, the processor 124 determines to collect the additional analog metric data 222 at a location of a start of the falling edge for a time window, which ends at an end of the falling edge. The end of the falling edge can be an end point or a process point of processing of the substrate S. The processor 124 determines not to sample the additional analog metric data 222 outside the time window. To illustrate, when the location is A1, illustrate below with reference to FIG. 2E and the time window is between times t1 and t2, also illustrated below with reference to FIG. 2E, the additional analog metric data 222 outside the time window is not collected. To further illustrate, with reference to FIG. 2E below, the additional analog metric data 222 between a time t0 and the time t1 and between times t2 and t4 is not collected during a cycle 1 of the clock signal. Also, in the further illustration, the additional analog metric data 222 between the time t4 and a time t5 and between a time t6 and a time t7 is not collected during a cycle 2 of the clock signal. In the further illustration, the additional analog metric data 222 is collected at the location A1 during the cycle 2 and for a time window between the times t5 and t6. In the example, the falling edge is consecutive to the rising edge. To illustrate, there are no edges between the rising edge and the falling edge. As another example, the processor 124 determines to collect the additional analog metric data 222 at a location that is between the end of the rising edge and the start of the falling edge. In the example, the additional analog metric data 222 is collected for a time window during which the analog metric data 222 has a steady state.

It should be noted that the additional analog metric data 222 is a continuation of the analog metric data 202. For example, the additional analog metric data 222 is output from the RF sensor 202 within one or more cycles of the clock signal after the analog metric data 202 is output from the RF sensor 202.

The processor 124 generates a control signal 206 having the location and the time window. The processor 124 sends the control signal 206 to the transceiver 128 of the analytical controller 106. The control signal 206 is transferred from the transceiver 128 to the transceiver 122 of the DPS 102. The transceiver 122 provides the control signal 206 to the ADC processor 210. Processing of the control signal 206 by the ADC processor 210 is described below with reference to FIG. 2B.

It should be noted that in one embodiment, the functions described herein as being performed by the processor 124 of analytical controller 106 are instead being performed by the processor 132 of the process controller 116 (FIGS. 1A and 1B). For example, instead of the processor 124, the processor 132 analyzes the digital metric data 204 to determine the location and time window for which the additional analog metric data 222 is to be sampled. In this example, the digital metric data 204 is sent from the processor 124 via the communication controller 130 and 136 to the processor 132 of the process controller 116 (FIGS. 1A and 1B) for analyzing the digital metric data 204 to determine the location and time window.

Figure 2B:
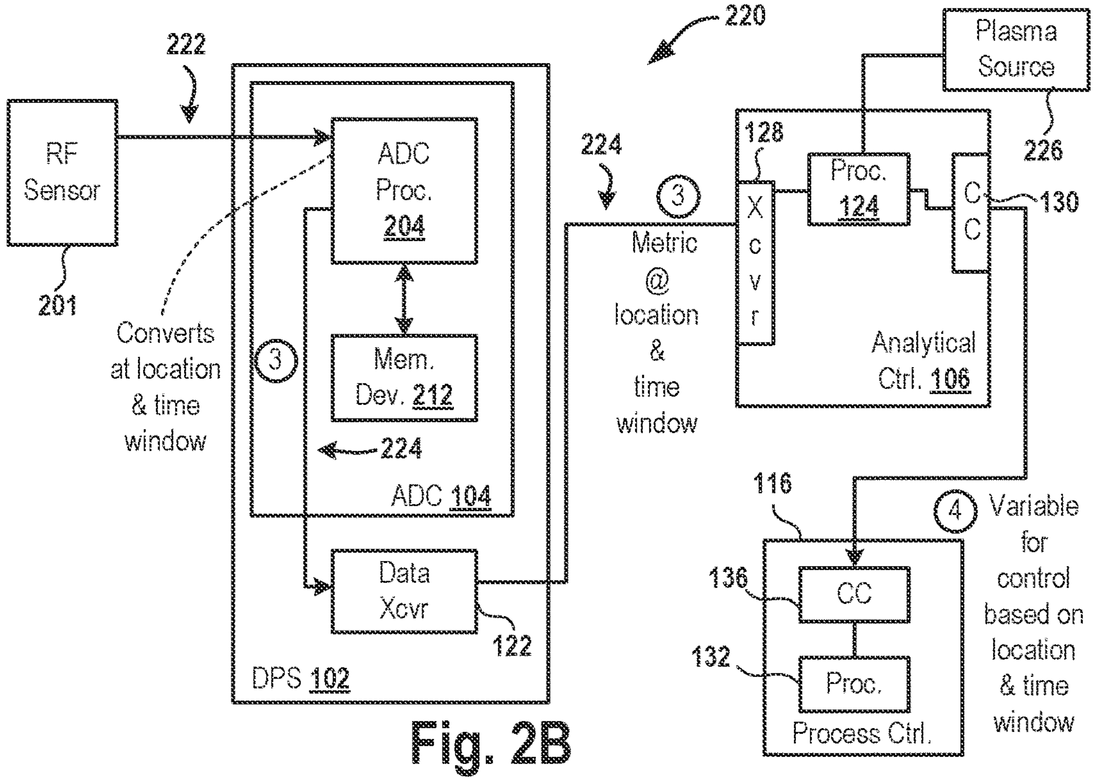
FIG. 2B is a diagram of an embodiment of a system to illustrate use of additional digital metric data by the analytical controller.

FIG. 2B is a diagram of an embodiment of a system 220 to illustrate use of additional digital metric data 224 by the analytical controller 106. The system 220 includes the DPS 102, the analytical controller 106, the process controller 116, and a plasma source 226. An example of the plasma source 226 includes any of the RF generators RFGa1 through RFGa(n+m) (FIG. 1A). To illustrate, when the RF sensor 201 is the RF sensor an, the plasma source 226 is the RF generator an and when the RF sensor 201 is the RF sensor a(n+m), the plasma source 226 is the RF generator RFGa (n+m) (FIG. 1A). Another example of the plasma source 226 includes any of the matchless plasma sources MPSa1 through MPSa(n+m) (FIG. 1B). To illustrate, when the RF sensor 201 is the RF sensor an, the plasma source 226 is the matchless plasma source MPSan and when the RF sensor 201 is the RF sensor a(n+m), the plasma source 226 is the matchless plasma source MPSa(n+m) (FIG. 1B).

Upon receiving the control signal 206 (FIG. 2A) indicating the location and the time window, the ADC processor 210 samples the additional analog metric data 222 at the location for the time window to output the additional digital metric data 224. The ADC processor 210 provides the additional digital metric data 224 to the transceiver 122. The transceiver 122 applies the transfer protocol to the additional digital metric data 224 to generate one or more data transfer units and sends the one or more data transfer units to the transceiver 128 of the analytical controller 106.

The transceiver 128 applies the transfer protocol to the one or more data transfer units to obtain the additional digital metric data 224 from the data transfer units and provides the additional digital metric data 224 via the processor 124 and the communication controller 130 to the process controller 116. For example, the processor 124 of the analytical controller 106 receives the additional digital metric data 224 from the transceiver 128 of the analytical controller 106, and provides the additional digital metric data 224 to the communication controller 130. In the example, the communication controller 130 applies the network communication protocol to the additional digital metric data 224 to generate one or more data packets, and transfers the one or more data packets to the communication controller 136 of the process controller 116. Further, in the example, the communication controller 136 applies the network communication protocol to the one or more data packets to extract the additional digital metric data 224 from the data packets and sends the additional digital metric data 224 to the processor 132.

The processor 132 generates an instruction to control the plasma source 226 based on the additional digital metric data 224. For example, the processor 132 generates one or more values of the variable based on the additional digital metric data 224. To illustrate, upon determining that an amplitude of the additional digital metric data 224 is greater than a pre-determined threshold, the processor 132 generates one or more values of the variable to increase or reduce an amplitude of the metric. As another illustration, upon determining that an amplitude of the additional digital metric data 224 is less than a pre-determined threshold, the processor 132 generates one or more values of the variable to increase or reduce an amplitude of the metric.

The instruction including the one or more values of the variable is sent from the processor 132 via the communication controllers 136 and 130 to the processor 124 of the analytical controller 106. Upon receiving the instruction, the processor 124 controls the plasma source 226 according to the one or more values of the variable. For example, the processor 124 controls the RF generator RFGan to modify a frequency or power or a duty cycle of a state or a number of states of operation or a combination thereof of the RF generator RFGan. As another example, the processor 124 controls the RF generator RFGa(n+m) to modify a frequency or power or a duty cycle of a state or a number of states of operation or a combination thereof of the RF generator RFGa(n+m). As another example, the processor 124 controls the matchless plasma source MPSan to modify a frequency or power or a duty cycle of a state or a number of states of operation or a combination thereof of the matchless plasma source MPSan. As yet another example, the processor 124 controls the matchless plasma source MPSa(n+m) to modify a frequency or power or a duty cycle of a state or a number of states of operation or a combination thereof of the matchless plasma source MPSa(n+m).

Referring back to FIG. 2A, the processor 124 determines to modify the location and time window for which the additional digital metric data 224 is collected. For example, the processor 124 determines that the additional analog metric data 222 is collected, such as sampled or converted from the analog form to the digital form, at a first location and for a first time window. In the example, the first location is at a start of a first edge, such as the rising edge or the falling edge. Also, in the example, the processor 124 analyzes the additional digital metric data 224 to determine that the additional digital metric data 224 is changing at a rate faster than a pre-determined rate during the first time window. Upon determining that the additional digital metric data 224 is changing at the rate faster than the pre-determined rate, the processor 124 determines to modify the first location to a second location between the first edge and a second edge. The second edge is consecutive to the first edge. The second location is between an end of the first edge and a start of the second edge. Also, in the example, the processor 124 determines to modify the first time window to a second time window, which is a time period greater than or less than the first time window. In the example, the processor 124 generates a control signal 228 (FIG. 2A) including the second location and the second time window, and sends the control signal 228 via the transceiver 128 and the transceiver 122 to the ADC processor 210. In response to receiving the control signal 228, the ADC processor 210 samples further analog metric data 230 that is received from the RF sensor 210 at the second location for the second time window to output further digital metric data 232.

In the example, the ADC processor 210 sends the further digital metric data 232 to the transceiver 122. The transceiver 122 applies the transfer protocol to the further digital metric data 232 to generate one or more transfer units and sends the transfer units to the transceiver 128. The transceiver 122 applies the transfer protocol to the transfer units to extract the further digital metric data 232 and provides the further digital metric data 232 to the processor 124. The processor 124 sends the further digital metric data 232 via the communication controllers 130 and 136 to the processor 132 in the same manner in which the additional digital metric data 224 (FIG. 2B) is sent to the processor 132. In the example, the processor 132 controls the plasma source 226 based on the further digital metric data 232 in the same manner in which the processor 132 controls the plasma source 226 according to the additional digital metric data 224.

As another example, the processor 124 determines that the analog metric data 202 is collected at a first location for a first time window. The first location is at an end of a first edge, such as the rising edge or the falling edge. The first time window ends before a start of a second edge, which is consecutive to the first edge. In the example, the processor 124 analyzes the digital metric data 204 to determine that the digital metric data 204 is changing at a rate slower than the pre-determined rate during the first time window. Upon determining that the digital metric data 204 is changing at the rate slower than the pre-determined rate, the processor 124 determines to modify the first location to a second location, which is at a start of the first edge or a start of the second edge. The second edge is consecutive to the first edge. Also, in the example, the processor 124 determines to modify the first time window to a second time window, which is a time period greater than or less than the first time window. To illustrate, the second time window is until an end of the first edge or an end of the second edge.

In one embodiment, instead of the processor 132, the processor 124 controls the plasma source 226 based on the additional digital metric data 224. For example, the additional digital metric data 224 is not sent from the analytical controller 106 to the process controller 116. Rather, in the example, the processor 124 controls any of the RF generators RFGa1 through RFGa(n+m) or any of the matchless plasma sources MPSa1 through MPS (n+m) based on the additional digital metric data 224.

In one embodiment, instead of the processor 132, the processor 124 controls the plasma source 226 based on the further digital metric data 232. For example, the further digital metric data 232 is not sent from the analytical controller 106 to the process controller 116. Rather, in the example, the processor 124 controls any of the RF generators RFGa1 through RFGa(n+m) or any of the matchless plasma sources MPSa1 through MPS (n+m) based on the further digital metric data 232.

Figure 2C:
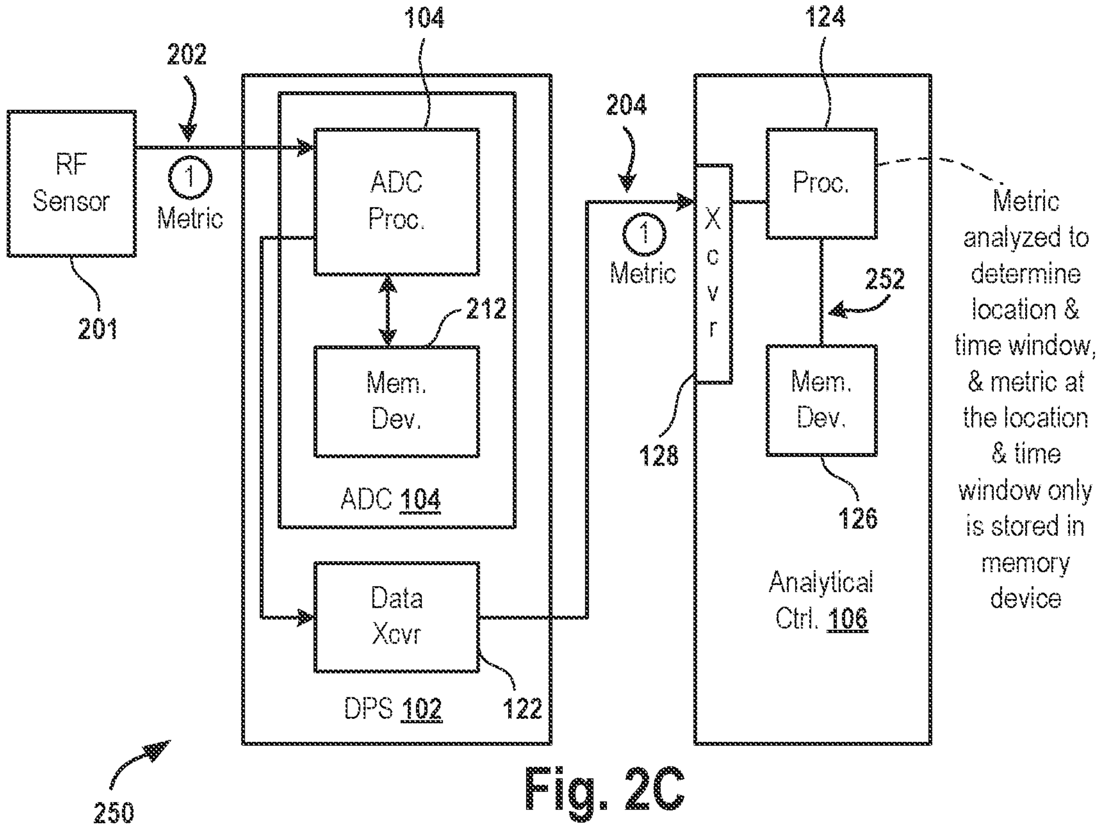
FIG. 2C is a diagram of an embodiment of a system to illustrate that digital metric data of FIG. 2A is received and analyzed by the analytical controller to determine a location and time window for which to store a portion of the digital metric data in a memory device of the analytical controller.

FIG. 2C is a diagram of an embodiment of a system 250 to illustrate that the digital metric data 204 received is analyzed by the processor 124 of the analytical controller 106 to determine a location and time window for which to store a portion of the digital metric data 204 in the memory device of the analytical controller 106. The system 250 includes the RF sensor 201, the DPS 102, and the analytical controller 106. The processor 124 receives the digital metric data 204 and determines based on the digital metric data 204, the location and time window. The processor 124 stores a portion 252 of the digital metric data 204 at the location and the time window in the memory device 126 of the analytical controller 106. The processor 124 does not store the remaining portion of the digital metric data 204 within the memory device 126 of the analytical controller 106. For example, the processor 124 does not store portions of the digital metric data 204 outside the location and the time window.

In one embodiment, the processor 124 stores the digital metric data 204 within the memory device 126 for a pre-set period of time, and erases portions of the digital metric data 204 outside the location and time window after the pre-set period of time.

It should be noted that in one embodiment, the functions described herein as being performed by the processor 124 of analytical controller 106 are instead being performed by the processor 132 of the process controller 116. For example, instead of the processor 124, the processor 132 analyzes the digital metric data 204 to determine the location and time window for which the portion 252 is to be stored in the memory device 134 of the process controller 116. In this example, the digital metric data 204 is sent from the analytical controller 106 to the process controller 116 via the communication controller 130 of the analytical controller 106 and the communication controller 136 of the process controller 116 for analyzing the digital metric data 204.

Figure 2D:
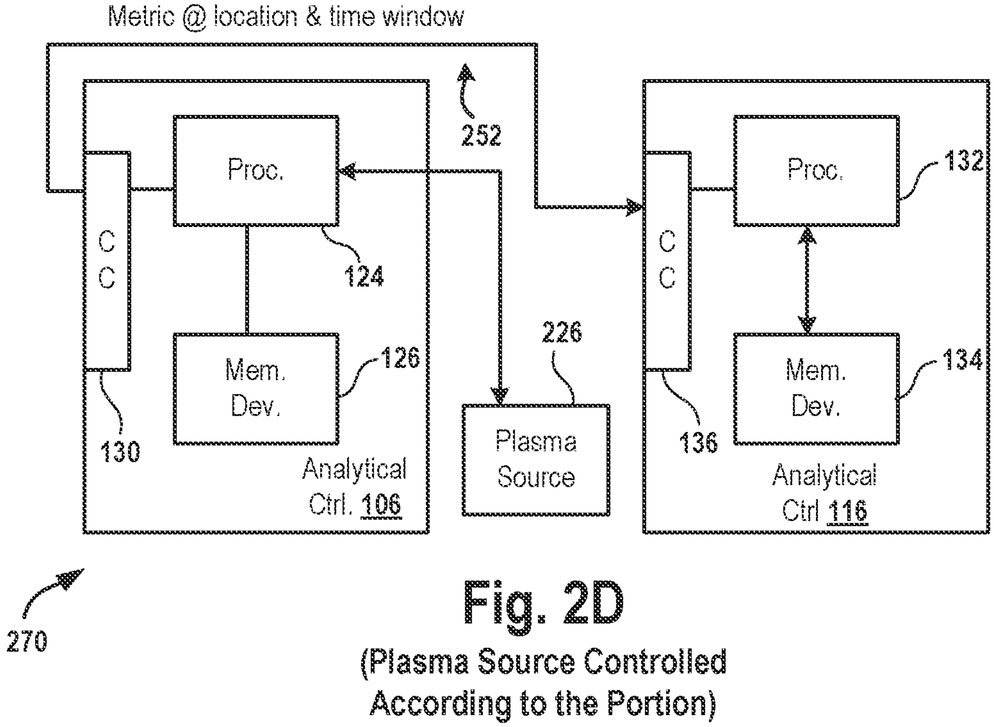
FIG. 2D is a diagram of an embodiment of a system to illustrate that a portion of metric data is sent from the analytical controller to a process controller to control a plasma source.

FIG. 2D is a diagram of an embodiment of a system 270 to illustrate that the portion 252 is sent from the analytical controller 106 to the process controller 116 to control the plasma source 226. The system 270 includes the analytical controller 106, the process controller, and the plasma source 226.

The processor 124 of the analytical controller 106 accesses the portion 252 from the memory device 134. The processor 124 sends the portion 252 to the communication controller 130. The communication controller 130 applies the network communication protocol to the portion 252 to generate one or more data packets and sends the data packets to the communication controller 136 of the process controller 136. The process controller 136 applies the network communication protocol to the data packets to extract the portion 252 and provides the portion 252 to the processor 132. The processor 132 generates the instruction including the one or more values of the variable to control the plasma source 226 based on the portion 252. The processor 132 sends the instruction via the communication controllers 136 and 130 to the processor 124 of the analytical controller 106. The processor 124 controls the plasma source 226 according to the instruction.

FIG. 2E is a diagram to illustrate a method 280 for using the additional digital metric data 224 (FIG. 2B) to determine a value of the variable for a state. The method 280 is illustrated with respect to a graph 282. The graph 282 includes a plot 284 of the metric versus time t. The time t has units, such as microseconds (μs) or milliseconds (ms). The plot 284 is of metric data, such as the digital metric data 204 (FIG. 2A). For example, the plot 284 is constructed by the processor 124 of the analytical controller 106 from the digital metric data 204 that is generated from the analog metric data 202 (FIG. 2A). To illustrate, the processor 124 connects samples, such as sample points, of the digital metric data 204 to generate the plot 284. As an example, the plot 284 is an envelope of forward power of an RF signal 290 that is supplied by an RF generator or by a matchless plasma source. For example, the plot 284 is an envelope of forward or supplied power of the RF signal 140*an* or 140*a*(n+m) (FIGS. 1A & 1B). As another example, the plot 284 is an envelope of delivered power of the RF signal 290. The metric of the plot 284 is plotted on an x-axis and the time t is plotted on an x-axis.

The x-axis of the graph 282 is divided into multiple time intervals or time periods. For example, the x-axis of the graph 282 is divided into a first time interval between the time t0 and the time t1, a second time interval between the time t1 and the time t2, a third time interval between the time t2 and a time t3, a fourth time interval between the time t3 and the time t4, a fifth time interval between the time t4 and a time t5, a sixth time interval between the time t5 and a time t6, a seven time interval between the time t6 and a time t7, an eighth time interval between the time t7 and a time t8, a ninth time interval between the time t8 and a time t9, and a tenth time interval between the time t9 and a time t10, and so on. The time intervals of the x-axis of the graph 282 are equal. For example, the first time interval is equal to the second time interval, which is equal to the third time interval. The third time interval is equal to the four time interval and so on.

Each time along the x-axis of the graph 282 provides a location. For example, the time t0 is the location A0. Similarly, the time t1 is a location A1, the time t2 is a location A2, and the time t3 is a location A3. The locations repeat with each cycle of the clock signal. For example, the locations A0 through A3 occur during the cycle 1 of the clock signal and the locations A0 through A3 occur again during the cycle 2 of the clock signal. The cycle 2 is consecutive to the cycle 1. The locations A0 through A3 are times at which the metric of the RF signal 290 is collected, such as sampled or converted from the analog form to the digital form, by the ADC processor 210 (FIG. 2A) to output the sample points.

As shown in FIG. 2E, the metric data of the plot 284 repeats for each cycle of the clock signal. For example, the metric data of the plot 284 has a state S1, a state S2, a state S3, and a state S4 during the cycle 1 of the clock signal. During the state S1, the metric data of the plot 284 has values that range between values M7 and −M7, during the state S2, the metric data has values that range between values M5 and −M5, during the state S3, the metric data has values that range between values M3 and −M3, and during the state S4, the metric data has values that range between values M1 and −M1. The value M3 is greater than the value M1, the value M5 is greater than the value M3, and the value M7 is greater than the value M5. The value M1 is a positive value. The states S1 through S4 of the metric data of the plot 284 repeat during the cycle 2 of the clock signal. In such a manner, the states S1 through S4 of the metric data of the plot 284 repeat during additional clock cycles of the clock signal. The metric data of the plot 284 transitions from the state S1 to the state S2, transitions from the state S2 to the state S3, and from the state S3 to the state S4 during the cycle 1 of the clock signal. The metric data of the plot 284 transitions from the state S4 during the cycle 1 of the clock signal to the state S1 during the cycle 2 of the clock signal, and the transitions from the state S2 through S4 repeat during the cycle 2 of the clock signal.

The method 280 is executed by the processor 124 of the analytical controller 106 (FIG. 1A). In an operation 286 of the method 280, the processor 124 obtains the metric data of the plot 284 starting at the location A1 for a time window, such as a time interval, between the times t1 and t2. For example, a portion of the metric data of the plot 284 is obtained by the processor 124 of the analytical controller 106 from the ADC processor 210 (FIG. 2A). The portion of the metric data between the times t1 and t2 starting at the location A1 of the plot 284 represents the state S2 of the metric data. Also, the portion of the metric data of the plot 284 is an example of the additional digital metric data 224 (FIG. 2B).

In an operation 288 of the method 280, the processor 124 of the analytical controller 106 controls the variable for the state S2 based on the metric data for the state S2 of the plot 284. For example, the processor 124 determines whether the metric data for the state S2 is within a pre-determined range from a pre-stored value of the metric. The pre-determined range and the pre-stored value of the metric are stored in the memory device 126 of the analytical controller 106. In response to determining that the metric data collected for the state S2 is not within the predetermined range from the pre-stored value of the metric, the processor 124 controls the variable of the plasma source 226 (FIG. 2B). The processor of the analytical controller 106 controls the plasma source 226 until metric data for the state S2 obtained from the ADC processor 210 is within the pre-determined range from the pre-stored value of the metric. To illustrate, the variable is controlled to achieve a processing rate, such as an etch rate or a deposition rate, of processing the substrate S within the plasma chamber 114 of FIG. 1A or the plasma chamber 152 of FIG. 1B.

The variable for the state S2 is of the RF signal 290 that is generated by the plasma source 226 (FIG. 2B) and the plasma source 226 corresponds to, e.g., has a one-to-one relationship with, the RF sensor 201 (FIG. 2A). For example, when the metric data of the plot 284 is generated based on the analog metric data 202 (FIG. 2A) output from the RF sensor an, the variable is of the RF signal 140*an* generated by the RF generator RFGan (FIG. 1A) or the matchless plasma source MPSan (FIG. 1B). As another example, when the metric data of the plot 284 is generated based on the analog metric data 202 received from the RF sensor a(n+m), the variable is of the RF signal 140*a*(n+m) generated by the RF generator RFGa(n+m) (FIG. 1A) or the matchless plasma source MPSa(n+m) (FIG. 1B). The RF sensor 201 measures data regarding the RF signal 290 to output the metric data of the plot 284 and one or more values of the variable are determined based on the metric data.

In one embodiment, the method 280 is executed by the processor 132 of the process controller 116 instead of by the processor 124 of the analytical controller 106. For example, the processor 124 sends the metric data at the location A1 for the time window between the times t1 and t2 via the communication controllers 130 and 136 to the processor 132 of the process controller 116. Upon obtaining the metric data at the location A1 for the time window between the times t1 and t2 from the processor 124, the processor 132 of the process controller 116 executes the operation 288 of the method 280.

In one embodiment, instead of the location A1, which defines a start of the state S2, a location associated with a fall transition, such as a falling edge, between two consecutive states of the plot 284 is used to execute the method 200. For example, the location is at a start of the fall transition between the states S1 and S2 or occurs during the fall transition between the states S1 and S2. Also, in the embodiment, instead of the time window between the times t1 and t2, a time window from the location is used. For example, the time window is from the start of the fall transition to a time within the fall transition. As another example, the time window is from the location within the fall transition to an end of the fall transition. It should be noted that the fall transition occurs from a state at a higher metric level to a state at a lower metric level. The state at the lower metric level has a lower amount of power or voltage compared to an amount of power or voltage of the state at the higher metric level.

Similarly, in an embodiment, a location associated with a rise transition, such as a rising edge, between two consecutive states of a plot of metric data is used for executing the method 200. For example, a location is at a start of the rise transition between two consecutive states. In the example, there is no state between the two consecutive states. Also, in the embodiment, a time window from the location is used. For example, the time window is from the start of the rise transition to a time within the rise transition. As another example, the time window is from the location within the rise transition to an end of the rise transition. It should be noted that the rise transition that occurs from a state at a lower metric level to a state at a higher metric level. The state at the lower metric level has a lower amount of power or voltage compared to an amount of power or voltage of the state at the higher metric level.

In an embodiment, instead of the state S2, another state, such as the state S1, S3, or S4 can be used to execute the method 200. For example, instead of obtaining, in the operation 286, the metric data of the plot 284 starting at the location A1 for the time window between the times t1 and t2, the metric data of the plot 284 starting at the location A2 for a time window between the times t2 and t3 is obtained. The operation 288 is performed based on the metric data of the plot 284 at the location A2 for the time window between the times t2 and t3.

In one embodiment, instead of the state S2, a sub-state or a slice can be used to execute the method 200. Examples of the sub-state and slice are provided below.

In an embodiment, the processor 124 of the analytical controller 106 determines that a plasma system having the plasma source 226 is faulty upon determining that the metric data for the state S2 obtained in the operation 286 is not within the predetermined range. In the embodiment, the processor 124 controls a display device of the analytical controller 106 to display an alarm to indicate that the plasma system is faulty or controls a speaker of the analytical controller 106 to sound an alarm to indicate that the plasma system is faulty. The display device and the speaker of the analytical controller 106 are coupled to the processor 124.

In one embodiment, a processor, such as the processor 124 or the processor 132, determines a parameter from the metric data that is obtained in the operation 286. For example, the processor determines ion energy, wafer bias, a reflection ratio, or a processing rate. An illustration of the processing rate include an etch rate or a deposition rate. In the example, the reflection ratio is a ratio of reverse power to forward power. To illustrate, the processor accesses a table from a memory device, such as the memory device 126 or 134, to determine one or more parameter values corresponding to, such as having a unique relationship with, the metric for which the metric data is obtained in the operation 286. As another illustration, the processor calculates the reflection ratio based on the forward power and the reverse power. The processor determines whether the one or more parameter values are within a pre-set range stored in the memory device. The processor controls the plasma source 226 until the one or more parameter values are within the pre-set range.

In one embodiment, one or more RF generators are controlled in the operation 288 based on the metric that is measured by the RF sensor 201. For example, one or more of the RF generators RFGa1, RFGa2, and RFGan are controlled based on the metric measured by the RF sensor an (FIG. 1A). As another example, one or more of the RF generators RFGa(n+1), RFGa(n+2), and RFGa(n+m) are controlled based on the metric measured by the RF sensor a2 (FIG. 1A).

Figure 3A:
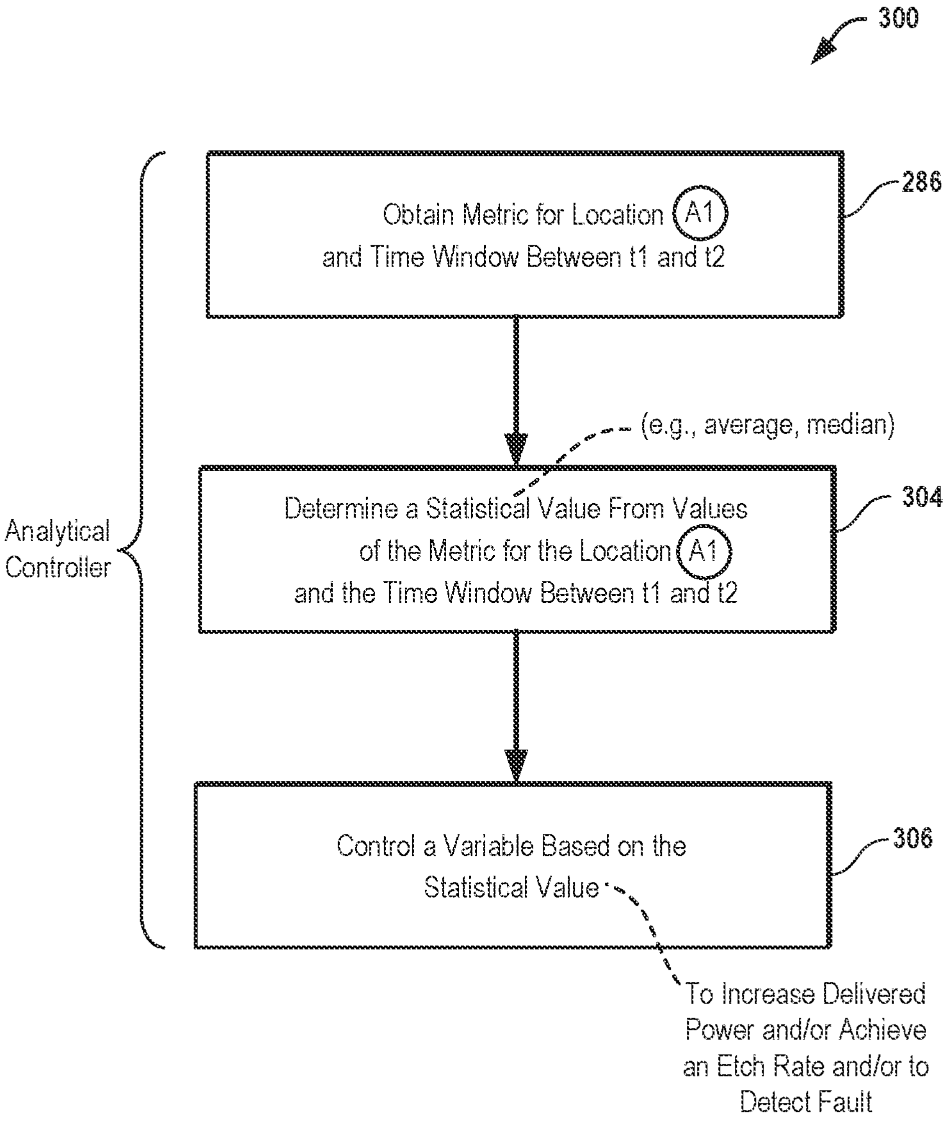
FIG. 3A is a diagram of an embodiment of a method to illustrate use of a statistical value of a metric to determine a value of the variable.

FIG. 3A is a diagram of an embodiment of a method 300 to illustrate use of a statistical value of the metric to determine a value of the variable. The method 300 includes the operation 286 and is executed by the processor 124 of the analytical controller 106 (FIG. 2B). For example, the processor 124 receives digital metric data 224 (FIG. 2B) for the location A1 and the time window between the times t1 and t2 from the ADC processor 210 of the DPS 102 (FIG. 2C).

In the method 300, an operation 304 is performed after the operation 286. In the operation 304, once the digital metric data 224 at the location A1 for the time window between the times t1 and t2 is received, a statistical value of the digital metric data 224 is determined. For example, the processor 124 of the analytical controller 106 calculates the statistical value from the digital metric data 224. Examples of the statistical value include an average of the digital metric data 224, a median of the digital metric data 224, a maximum value of the digital metric data 224, and a minimum value of the digital metric data 224. The statistical value is determined to reduce an amount of the digital metric data 224 for determining the variable of the plasma source 226.

In an operation 306 of the method 300, the processor 124 controls the variable based on the statistical value. For example, upon determining that the statistical value determined in the operation 304 is outside a pre-set range, the processor 124 controls the variable of the plasma source 226 until the statistical value of the metric is within the pre-set range. Upon determining that the statistical value determined in the operation 304 is within the pre-set range, a value of the variable is maintained by the processor 124. To illustrate, the processor 124 controls the plasma source 226 until a statistical value of the digital metric data 224 for the state S2 obtained from the ADC processor 210 is within the pre-set range. As another example, the variable is controlled by the processor 124 until a statistical value of the processing rate of processing the substrate S within the plasma chamber 114 of FIG. 1A or the plasma chamber 152 of FIG. 1B is achieved.

In an embodiment, the processor of the analytical controller 106 determines that a plasma system having the plasma source 226 is faulty upon determining that the statistical value determined in the operation 304 is outside the pre-set range.

In an embodiment, the method 300 is executed with respect to a location, other than the location A1, within the cycle 1 of the clock signal, and for a time window other than the time window between the times t1 and t2. For example, the method 300 is executed with respect to the location A2 and for a time window between the times t2 and t3 (FIG. 2E).

In one embodiment, the method 300 is executed by the processor 132 of the process controller 116 instead of by the processor 124. In the embodiment, the method 300 includes the operation 286 of obtaining values of the metric for the location A1 and the time window between the times t1 and t2 (FIG. 2E) from the processor 124 of the analytical controller 106.

In one embodiment, instead of the location A1, a location associated with a fall transition is used to execute the method 300.

Similarly, in an embodiment, instead of the location A1, a location associated with a rise transition is used for executing the method 300.

In one embodiment, instead of the state S2, a sub-state or a slice can be used to execute the method 300.

Figure 3B:
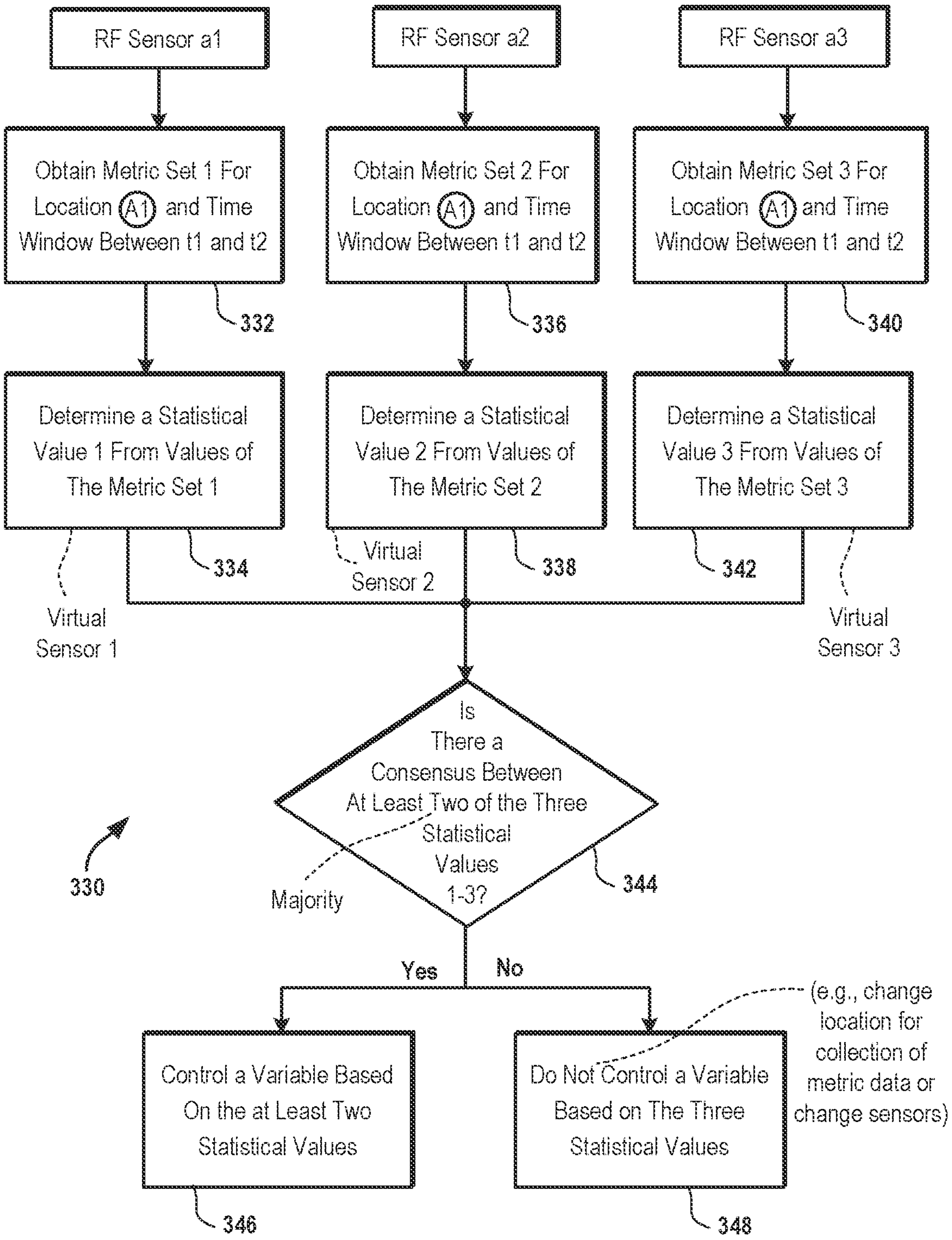
FIG. 3B is an embodiment of a flowchart of a method to illustrate use of consensus between metric data that is sensed by multiple RF sensors.

FIG. 3B is an embodiment of a flowchart of a method 330 to illustrate use of consensus between the metric that is sensed by multiple RF sensors. The method 330 is executed by the processor 124 of the analytical controller 106.

In an operation 332 of the method 330, a metric set 1 at the location A1 for the time window between the times t1 and t2 is obtained in the same manner in which the operation 286 (FIG. 2E) is performed. The metric set 1 includes digital metric data that is output from the ADC processor 210 (FIG. 2A). The ADC processor 210 outputs the digital metric data of the metric set 1 by sampling analog metric data received from the RF sensor a1.

In an operation 334 of the method 330, a statistical value 1 of the metric is determined from the metric set 1 in the same manner in which the operation 304 (FIG. 3A) is performed. For example, the processor 124 calculates a mean value or a median value of the metric from the metric set 1.

In an operation 336 of the method 330, a metric set 2 at the location A1 for the time window between the times t1 and t2 is obtained (FIG. 2E) in the same manner in which the metric set 1 is obtained. For example, the ADC processor 210 receives analog metric data from the RF sensor a2 and samples the analog metric data to output the digital metric data of the metric set 2. In the example, the processor 124 of the analytical controller 106 obtains the metric set 2 from the ADC processor 210. The metric set 2 is has different amplitudes than the metric set 1. To illustrate, the metric set 2 has a different amplitude at the location A1 and different amplitudes between the times t1 and t2 compared to that of the metric set 1.

In an operation 338 of the method 330, a statistical value 2 of the metric is determined from the metric set 2 in the same manner in which the processor 124 determines the statistical value 1 from the metric set 1. For example, the processor 124 calculates a mean value or a median value of the metric from the metric set 2.

In an operation 340 of the method 330, a metric set 3 at the location A1 for the time window between the times t1 and t2 is obtained (FIG. 2E) in the same manner in which the metric set 1 is obtained. For example, the ADC processor 210 receives analog metric data from the RF sensor a3 and samples the analog metric data to output the digital metric data of the metric set 3. In the example, the processor 124 of the analytical controller 106 obtains the metric set 3 from the ADC processor 210. The metric set 3 is has different amplitudes than the metric set 1. To illustrate, the metric set 3 has a different amplitude at the location A1 and different amplitudes between the times t1 and t2 compared to that of the metric set 1 and the metric set 2.

In an operation 342 of the method 330, a statistical value 3 of the metric is determined from the metric set 3 in the same manner in which the processor 124 determines the statistical value 1 from the metric set 1. For example, the processor 124 calculates a mean value or a median value of the metric from the metric set 3.

In an operation 344 of the method 330, it is determined by the processor 124 whether there is consensus between a majority of the statistical values determine the operations 334, 338, and 342. For example, the processor 124 determines whether at least two of the three statistical values 1 through 3 are within a pre-stored range. The pre-stored range is stored in the memory device 126 of the analytical controller 106. Upon determining that the at least two of the three statistical values 1 through 3 are within the pre-stored range, the processor 124 determines that there is consensus between the majority of the statistical values 1 through 3 and executes an operation 346. On the other hand, upon determining that the at least two of the three statistical values 1 through 3 are outside the pre-stored range, the processor 124 determines that there is lack of consensus between the majority of the statistical values 1 through 3 and executes an operation 348.

In the operation 346 of the method 330, the processor 124 controls the variable of the plasma source 226 (FIG. 2B) when the consensus is determined to exist. For example, upon determining that the statistical values 1 and 2 are within the pre-stored range, the processor 124 controls the variable of the RF generator RFGa1 or the variable of the RF generator RFGa2 or both the variables. In the example, the variable of the RF generator RFGa1 is controlled until the statistical value 1 is within a pre-set range and the variable of the RF generator RFGa2 is controlled until the statistical value 2 is within the pre-set range. As another example, upon determining that the statistical values 1 and 2 are within the pre-stored range, the processor 124 controls the variable of the matchless plasma source MPSa1 or the variable of the matchless plasma source MPSa2 or both the variables. In the example, the variable of the matchless plasma source MPSa1 is controlled until the statistical value 1 is within the pre-set range and the variable of the matchless plasma source MPSa2 is controlled until the statistical value 2 is within the pre-set range.

In an operation 348 of the method 330, a value of the variable is not controlled based on the statistical values 1 through 3. For example, the processor 124 determines not to apply the statistical values 1 through 3 to control the value of the variable. Rather, in the example, the processor 124 generates an indication to change one or more of the RF sensors a1 through a3. To illustrate, the indication is displayed by the processor 124 on a display device of the analytical controller 106 or is output as sound via the speaker of the analytical controller 106. As another example, the processor 124 determines to change a location from the location A1 or a time window from the time window between the times t1 and t2 or a combination thereof for which a metric set is to be collected by the RF sensor a1, a metric set is to be collected by the RF sensor a2, and a metric set is to be collected by the RF sensor a3. To illustrate, the location is changed from A1 to A2 (FIG. 2E) or the time window is changed from between the times t1 and t2 to a time window between the times t2 and t3.

In one embodiment, the method 330 is executed by the processor 132 of the process controller 116 instead of by the processor 124. For example, the processor 132 obtains the metric sets 1, 2, and 3 from the processor 124 via the communication controllers 130 and 136, and executes the method 330.

In an embodiment, a statistical value is a value generated by a virtual sensor implemented within an RF sensor. For example, a processor of the RF sensor a1 generates the statistical value. As another example, a combination of the processor of the RF sensor a1 and the processor 124 generates the statistical value. As another example, a combination of the processor of the RF sensor a1 and the processor 132 generates the statistical value.

In one embodiment, the method 330 is executed for analog metric data that is output from the RF sensors a(n+1) through a(n+3) instead of the RF sensors a1 through a3.

In an embodiment, the method 330 is executed for any other number of metric sets. For example, the method 330 is executed for analog metric data that is output from the RF sensors a1 through an. As another example, the method 330 is executed for analog metric data that is output from the RF sensors a(n+1) through a(n+m).

Figure 3C:
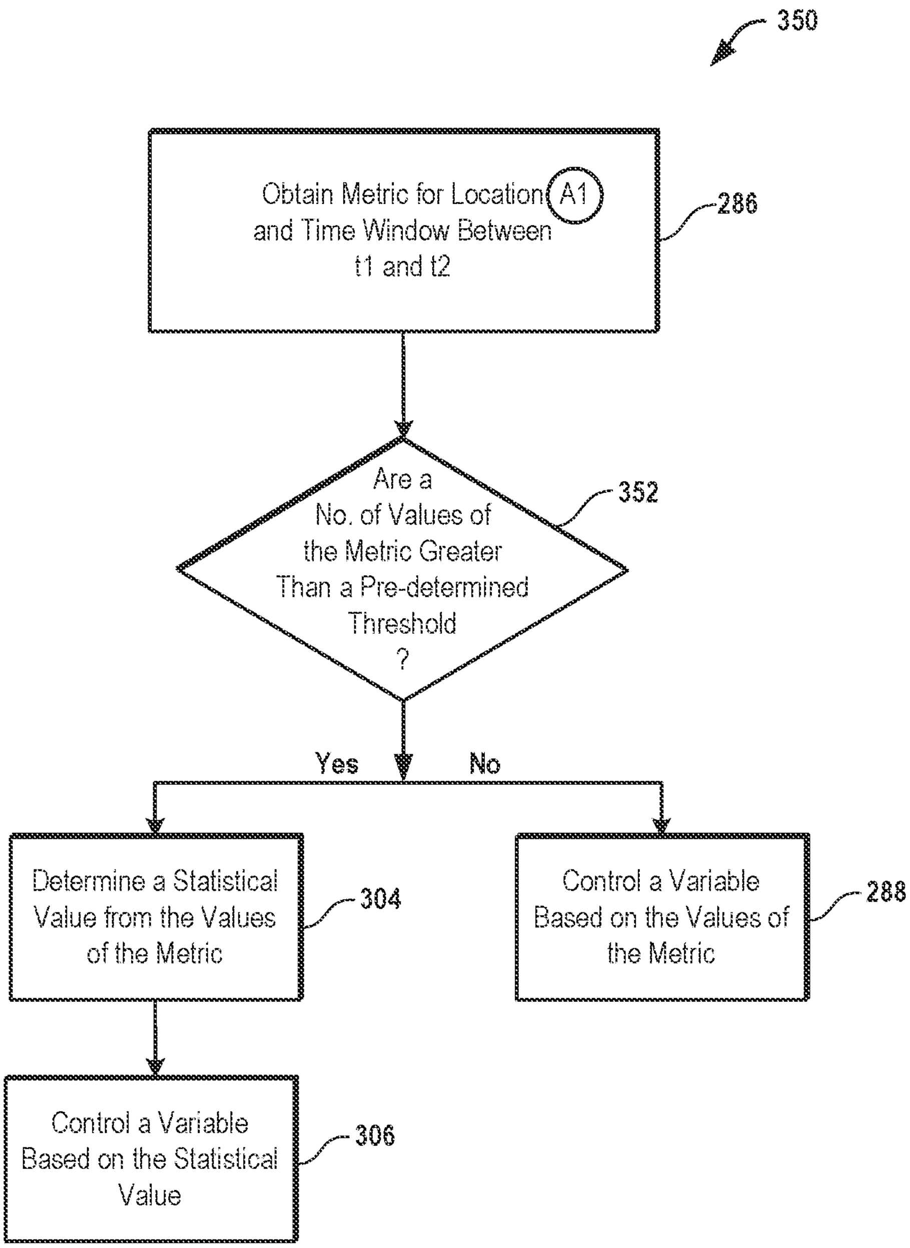
FIG. 3C is a flowchart of an embodiment of a method to illustrate use of a statistical value of the metric instead of all values of the metric for a location and a time window.

FIG. 3C is a flowchart of an embodiment of a method 350 to illustrate use of the statistical value of the metric instead of all values of the metric obtained for a location and a time window. The method 350 is executed by the processor 124.

The method 350 includes the operation 286. In an operation 352 of the method, it is determined by the processor 124 whether a number of values of the metric at the location A1 and the time window between the times t1 and t2 is greater than a pre-determined threshold. As an example, the processor 124 counts the number of values, such as samples, of the digital metric data 224 (FIG. 2B) at the location A1 for the time window between the times t1 and t2 and compares the number of values with the pre-determined threshold. As another example, a counter and a comparator of the analytical controller 106 are coupled to the processor 124. In the example, upon receiving the values of the digital metric data 224 at the location A1 and the time window between the times t1 and t2, the processor 124 provides the values to the counter. Further, in the example, the counter counts the number of values at the location A1 and the time window between the times t1 and t2 to output a count, and the comparator receives the count from the counter. In the example, the comparator determines whether the count is greater than the pre-determined threshold. The pre-determined threshold is stored in the memory device 126.

Upon determining that the count, such as the number of values of the metric at the location A1 and the time window between the times t1 and t2, is greater than the pre-determined threshold, the operation 304 of the method 350 is executed. The operation 306 of the method 350 is executed after the operation 304 is executed. On the other hand, upon determining that the number of values of the metric at the location A1 and the time window between the times t1 and t2 is not greater than the pre-determined threshold, the operation 288 of the method 350 is executed.

In an embodiment, the method 350 is executed by the processor 132 of the process controller 116 (FIG. 2D) instead of by the processor 124. In the embodiment, the pre-determined threshold is stored in the memory device 134 of the process controller 116.

In one embodiment, the operation 352 is performed by a counter and a comparator of the process controller 116 instead of the counter and the comparator of the analytical controller 106. The counter and the comparator of the process controller 116 are coupled to the processor 132. Upon receiving the values of the metric at the location A1 and the time window between the times t1 and t2 from the processor 124, the processor 132 provides the values to the counter of the process controller 116. The counter of the process controller 116 and the comparator of the process controller 116 perform the same operations, described above, as being performed by the counter and the comparator of the analytical controller 106.

FIG. 4 is a diagram of an embodiment of a method 400 to illustrate that a location and a time window for collection of analog metric data can change with a pre-determined number of cycles of the clock signal. The method 400 is executed by the processor 124 of the analytical controller 106. Digital metric data is obtained at a location and time window during each of the pre-determined number of cycles, such as the cycle 1, of the clock signal. The processor 124 modifies the location or the time window or a combination thereof for a pre-set number of cycles, such as the cycle 2 or a cycle 3 or both the cycles 2 and 3, during which additional digital metric data is to be obtained. The cycle 3 of the clock signal is consecutive to the cycle 2. The pre-determined and pre-set number of cycles are stored in the memory device 126 of the analytical controller 106.

The method 400 is illustrated with respect to the graph 282. The method 400 includes an operation 402 in which digital metric data is obtained by the processor 124 from the ADC processor 104 (FIG. 2C) for each of the pre-determined number of cycles of the clock signal. For example, in the operation 402, digital metric data starting at the location A1 for the time window between the times t1 and t2 of the plot 284 is output from the ADC processor 210 and sent to the processor 124. The times t1 and t2 occur during the cycle 1 of the clock signal. It should be noted that the time window between the times t1 and t2 correspond to the state S2 of the metric data of the plot 284. As another example, the operation 402 is the same as the operation 286 (FIG. 2E) except the operation 402 applies to the pre-determined number of cycles of the clock signal.

The method 400 further includes an operation 404 of controlling the variable during the pre-set number of cycles of the clock signal that follow the pre-determined number of cycles of the clock signal. The variable is controlled based on the digital metric data obtained during the operation 402. For example, the operation 404 is the same as the operation 288 (FIG. 2E) except that the operation 404 is performed based on the digital metric data obtained during the cycle 1 of the clock signal. To illustrate, during the state S2 of the metric data of the plot 284, the processor 124 controls the variable of the plasma source 226 based on the metric data obtained in the operation 402. The state S2 of the metric data occurs during the pre-set number of cycles, such as the cycle 2 of the clock signal.

The method 400 also includes an operation 406 of obtaining the metric data of the plot 284 starting at the location A0 for a time window between the times t4 and t5 of each of the pre-set number of cycles of the clock signal. For example, during the cycle 2 of the clock signal, instead of sampling the analog metric data 222 (FIG. 2B) to generate the plot 284 at the location A1 for a time window between the times t5 and t6, the analog metric data 222 is sampled by the ADC processor 104 for a time interval between the times t4 and t5. The analog metric data 222 is sampled by the ADC processor 104 at the location A0 for the time interval between the times t4 and t5 to output the digital metric data 224, which is sent from the ADC processor 104 to the processor 124 of the analytical controller 106. It should be noted that the time window between the times t4 and t5 correspond to the state S1 of the metric data of the plot 284 and the time window between the times t5 and t6 correspond to the state S2 of the metric data of the plot 284.

The method 400 includes an operation 408 of controlling the variable of the plasma source 226 based on the metric data obtained during the operation 406. For example, the operation 408 is the same as the operation 288 (FIG. 2E) except that the operation 408 is performed based on the metric data of the state S1 sampled during the cycle 2 of the clock signal. The variable is controlled during a pre-stored number of cycles of the clock signal that follow the pre-set number of cycles of the clock signal. The pre-set number of cycles is stored in the memory device 126 of the analytical controller 106.

In an embodiment, the method 400 is executed by the processor 132 of the process controller 116 instead of by the processor 124 of the analytical controller 106. For example, during the operation 402, the digital metric data used to generate the plot 284 is output from the ADC processor 104 during the cycle 1 of the clock signal, sent from the ADC processor 104 to the processor 124, and further sent from the analytical controller 106 to the processor 132 of the process controller 116. In the embodiment, the pre-determined number of cycles of the clock signal, the pre-set number of cycles of the clock signal, and the pre-stored number of cycles of the clock signal are stored in the memory device 134 of the process controller 116.

In one embodiment, the method 400 is executed according to each sub-state or each slice instead of each state of the metric data of the plot 284.

It should be noted that although the operations 406 and 408 are described with reference to the location A0 and the time window between the times t4 and t5, in one embodiment, the operations 406 and 408 apply to other locations, such as the location A2, and other time windows, such as a time window between the times t6 and t7.

FIG. 5A is an embodiment of a graph 500 to illustrate a state, a sub-state, and a slice of metric data of the metric. As an example, a time interval of a slice of metric data is in microseconds. To illustrate, a slice of metric data of the metric occurs for a time interval of 5 microseconds (μs) to 7 microseconds. As another illustration, the slice occurs for a time interval of 6 microseconds. As another illustration, the slice occurs for a time interval of 6.5 microseconds. As yet another illustration, the slice occurs for a time interval of 7 microseconds. It should be noted that a sub-state has a smaller time interval than a state and a slice is a smaller time interval than the sub-state.

The graph 500 includes a plot 502 of the metric versus the time t. The metric of the plot 502 is plotted on a y-axis and the time t is plotted on an x-axis. The plot 502 is an example of the digital metric data 204 (FIG. 2C). For example, the plot 502 is constructed by the processor 124 of the analytical controller 106 (FIG. 1A) or by the processor 132 of the process controller 116 from sample points of the digital metric data 204.

During the cycle 1 of the clock signal, the metric data of the plot 502 has a state S1. For example, during a time window between the time t0 and a time t0.5, the metric data of the plot 502 has multiple metric values that range from a metric value M0.5 to a metric value M8. To illustrate, the plot 502 includes metric values M0.5, M1, M2, M3, M4, M5, M6, M7, and M8 during the state S1. The metric value M0.5 is half of the metric value M1 and the time t0.5 is at half of a time interval between the times t0 and t1. As another illustration, the metric data of the plot 502 transitions from the metric value M0.5 to the metric value M8 during the state S1 of the metric data of the plot 502. The transition from the metric value M0.5 to the metric value M8 is an example of a rise transition.

The metric value M1 is greater than a metric value M0 and less than the metric value M2. The metric value M2 is less than the metric value M3. The metric value M4 is greater than the metric value M3 and the metric value M5 is greater than the metric value M4. The metric value M6 is greater than the metric value M5 and the metric value M7 is greater than the metric value M6. The metric value M8 is greater than the metric value M7.

Also, during the cycle 1 of the clock signal, the metric data of the plot 502 has a state S2. As an example, during a time window between the time t0.5 and a time t1.5, the metric data of the plot 502 has multiple metric values, and each of the metric values range from a metric value M7.5 to the metric value M8. The time t1.5 is at half of a time interval between the times t1 and t2. The metric value M7.5 is between the metric value M8 and the metric value M7. For example, the metric value M7.5 is at a half point between the metric value M7 and M8. The state S2 of the metric data of the plot 502 is an example of a steady state.

During the cycle 1 of the clock signal, the metric data of the plot 502 has a state S3. For example, during a time window between the time t1.5 and the time t2, the metric data of the plot 502 has multiple metric values that range from the metric value M8 to the metric value M4. The metric value M8 is greater than the metric value M7.5. The metric data of the plot 502 transitions from the metric value M8 to the metric value M4 during the state S1 of the metric data. The transition from the metric value M8 to the metric value M4 is an example of a fall transition.

Moreover, during the cycle 1 of the clock signal, the metric data of the plot 502 has a state S4. For example, during a time window between the time t2 and a time t2.5, the metric data of the plot 502 has the metric value M4. The time t2.5 is at half of a time interval between the times t2 and t3. The state S4 of the metric data of the plot 502 is an example of a steady state.

Further, during the cycle 1 of the clock signal, the metric data of the plot 502 has a state S5. For example, during a time window between the time t2.5 and the time t3, the metric data of the plot 502 has multiple metric values that range from the metric value M4 to a metric value M1.3. The metric value M1.3 is greater than the metric value M1 and less than the metric value M2. The metric value M1.3 is 30% greater than the metric value M1. The metric data of the plot 502 transitions from the metric value M4 to the metric value M1.3 during the state S5 of the metric data. The transition from the metric value M4 to the metric value M1.3 is an example of a fall transition.

During the cycle 1 of the clock signal, the metric data of the plot 502 has a state S6. For example, during a time window between the time t3 and the time t4, the metric data of the plot 502 has multiple metric values that range from the metric value M1.3 to the metric value M0.5.

The states S1 through S6 of the metric data of the plot 502 repeat during each additional cycle of the plot 502. For example, during each cycle 2 and 3 of the clock signal, the metric data of the plot 502 has the states S1 through S6.

During the cycle 2 of the clock signal, sub-states within each state of the metric data of the plot 502 are illustrated, and each of the sub-states has a smaller time interval than the state. For example, during the state S2 of the cycle 2 of the clock signal, the metric data of the plot 502 has a sub-state S2a. To illustrate, during a time window between a time t4.5 and a time t4.75, the metric data of the plot 502 has the metric value M8. The time t4.5 is at 50 percent of a time interval between the times t4 and t5 and the time t4.75 is at 75 percent of the time interval between the times t4 and t5. In the sub-state S2a of the state S2 of the cycle 2 of the clock signal, metric values of the metric data range from M8 to M7.8, where the metric value M7.8 is between the metric values M7.5 and M8. As another example, during the state S2 of the cycle 2 of the clock signal, the metric data of the plot 502 has a sub-state S2b. To illustrate, during a time window between the time t4.75 and a time t5.3, the metric data of the plot 502 has the metric value M7.5. The time t5.3 is at 30 percent of a time interval between the times t5 and t6. During the sub-state S2b, metric values of the metric data range from M7.8 to M7.5. As yet another example, during the state S2 of the cycle 2 of the clock signal, the metric data of the plot 502 has the sub-state S2a. To illustrate, during a time window between the time t5.3 and a time t5.5, the metric data of the plot 502 has the metric value M8. The time t5.5 is at half of the time interval between the times t5 and t6.

As yet another example, during the state S6 of the cycle 2 of the clock signal, the metric data of the plot 502 has a sub-state S6a. To illustrate, during a time window between the time t7 and a time t7.5, the metric data of the plot 502 has the metric value M1. The time t7.5 is at half of a time interval between the times t7 and t8. In the sub-state S6a, metric values of the metric data range from M1.3 to M1. As another example, during the state S6 of the cycle 2 of the clock signal, the metric data of the plot 502 has a sub-state S6b. To illustrate, during a time window between the time t7.5 and the time t8, the metric data of the plot 502 has the metric value M0.5. In the sub-state S2b, metric values of the metric data range from M1 to M0.5.

During the cycle 3 of the clock signal, slices within each sub-state or each state of the metric data of the plot 502 are illustrated, and each of the slices has a smaller time interval than a time interval for which the sub-state occurs. For example, during the state S1 of the cycle 3 of the clock signal, the metric data of the plot 502 has multiple slices. To illustrate, during a time window between the time t8 and a time t8.5, the metric data of the plot 502 is divided into four portions. Each portion of the state S1 during the cycle 3 occurs for an equal time interval. A first slice of the state S1 during the cycle 3 occurs for is sampled during a time interval between the time t8 and a time t8.125 and a second slice of the state S1 during the cycle 3 occurs for or is sampled during a time interval between the time t8.125 and a time t8.25. The time 8.125 is at a location A0.125 within the cycle 3. As another example, during the sub-state S2a of the cycle 3 of the clock signal, the metric data of the plot 502 has multiple slices. To illustrate, during a time window between the time t8.5 and a time t8.75, the metric data of the plot 502 is divided into two portions, which include a first portion and a second portion. Each portion of the sub-state S2a of the cycle 3 of the clock signal occurs for an equal time interval. The first portion of the sub-state S2a has metric values that lie within a sub-range of the range of metric values of the sub-state S2a and the second portion of the sub-state S2b has metric values that lie within a sub-range of the range of metric values of the sub-state S2a. The metric values of the first portion range from M8 to M7.9, where the metric value M7.9 is less than the metric value M8 and greater than the metric value M7.8. The metric values of the second portion range from M7.9 to M7.8. As yet another example, during the sub-state S6b of the cycle 3 of the clock signal, the metric data of the plot 502 has multiple slices. To illustrate, during a time window between a time t11.5 and the time t12, the metric data of the plot 502 is divided into four portions. Each portion of the sub-state S6b of the cycle 3 of the clock signal occurs for an equal time interval. A fourth slice of the sub-state S6b of the cycle 3 starts at a time t11.875 and ends at the time t12. The time 11.875 is at a location A3.875 within the cycle 3.

It should be noted that although various embodiments are described herein with reference to a state of metric data of the metric, the embodiments are applicable to a sub-state. For example, the method 280 applies to the sub-states S2a and S2b. In the example, instead of the operation 286 of the method 280 (FIG. 2E), the processor 124 of the analytical controller 106 obtains the metric data of the plot 502 starting at a location A0.5 for a time window, such as a time interval, between the times t4.5 and t4.75. The location A0.5 is at the time t4.5 during the sub-state S2a and the time t4.75 is at a location A0.75. To illustrate, a portion of the metric data of the plot 502 is obtained by the processor 124 from the ADC processor 210 (FIG. 2A). The portion of the metric data of the plot 502 represents the sub-state S2a of the metric data and is an example of the additional digital metric data 224 (FIG. 2B).

Moreover, in the example, instead of the operation 288 of the method 280, the processor 124 controls the variable during the sub-state S2a based on the metric data for the sub-state S2a of the plot 502. For example, the processor 124 determines whether the metric data for the sub-state S2a is within a pre-determined range from a pre-stored value of the metric. In response to determining that the metric data collected for the sub-state S2a is not within the predetermined range from the pre-stored value of the metric, the processor 124 controls the variable of the plasma source 226 (FIG. 2B). The processor of the analytical controller 106 controls the plasma source 226 until metric data for the sub-state S2a obtained from the ADC processor 210 is within the pre-determined range from the pre-stored value of the metric. To illustrate, the variable is controlled to achieve the processing rate of processing the substrate S within the plasma chamber 114 of FIG. 1A or the plasma chamber 152 of FIG. 1B.

In the example, the variable for the sub-state S2a is of an RF signal that is generated by the plasma source 226 (FIG. 2B) and the plasma source 226 corresponds to the RF sensor 201. The RF sensor 201 measures data regarding the RF signal to output the metric data of the plot 502 and one or more values of the variable are determined based on the metric data. For example, when the metric data of the plot 502 is generated based on the analog metric data 202 (FIG. 2A) output from the RF sensor an, the variable is of the RF signal 140*an* generated by the RF generator an (FIG. 1A) or the matchless plasma source MPSan (FIG. 1B). As another example, when the metric data of the plot 502 is generated based on the analog metric data 202 received from the RF sensor a(n+m), the variable is of the RF signal 140*a*(n+m) generated by the RF generator a(n+m) (FIG. 1A) or the matchless plasma source MPSa(n+m) (FIG. 1B).

As another example, the method described in the preceding example is executed by the processor 132 of the process controller 116 instead of by the processor 124 of the analytical controller 106. For example, the processor 124 sends the metric data at the location A0.5 for the time window between the times t4.5 and t4.75 via the communication controllers 130 and 136 to the processor 132 of the process controller 116. Upon obtaining the metric data at the location A0.5 for the time window between the times t4.5 and t4.75 from the processor 124, the processor 132 of the process controller 116 controls the variable of the plasma source 226.

In an embodiment, instead of the sub-state S2a, another sub-state, such as the sub-state S2b, S6a, or S6b can be used to execute the method described in the preceding embodiment. For example, instead of obtaining the metric data of the plot 502 starting at the location A0.5 for the time window between the times t4.5 and t4.75, the metric data of the plot 502 starting at the location A0.75 for a time window between the times t4.75 and t5.3 is obtained. Also, the metric data of the plot 502 starting at the location A0.75 for the time window between the times t4.75 and t5.3 is an example of the additional digital metric data 224 (FIG. 2B). The operation of controlling the variable of the sub-state S2b is performed based on the metric data of the plot 502 at the location A0.75 for the time window between the times t4.75 and t5.3.

In one embodiment, the method 400 described above with reference to FIG. 4 applies to a sub-state of the plot 502. For example, instead of the operation 402 of the method 400, during the cycle 1 of the clock signal, the metric data of the plot 502 starting at the location A0.5 for the time window between the time t0.5 and a time t0.75 is obtained. The time t0.75 occurs before the time t1 and after the time t0.5. To illustrate, the metric data of the plot 502 sampled by the ADC processor 104 (FIG. 2C) at the location A0.5 for the time window between the time t0.5 and the time t0.75 is received by the processor 124 of the analytical controller 106 from the DPS 102. It should be noted that the time window between the times t0.5 and t0.75 correspond to the sub-state S2a of the metric data of the plot 502. As another example, during the pre-determined number of cycles of the clock signal, the metric data of the plot 502 for the sub-state S2a is obtained.

Continuing with the example, instead of the operation 404 of the method 400, an operation of controlling the variable during the pre-set number of cycles of the clock signal that follow the pre-determined number of cycles of the clock signal is performed. The variable is controlled based on the metric data obtained during the pre-determined number of cycles for the sub-state S2a. To illustrate, during the sub-state S2a of the cycle 2 of the metric data of the plot 502, the processor 124 controls the variable of the plasma source 226 based on the metric data obtained during the sub-state S2a of the cycle 1. The cycle 2 is an example of the pre-set number of cycles.

Continuing further with the example, instead of the operation 406 of the method 400, an operation of obtaining the metric data of the plot 502 starting at the location A0.75 for a time window between the times t4.75 and t5.3 of each of the pre-set number of cycles of the clock signal. To illustrate, during the cycle 2 of the clock signal, instead of sampling the metric data of the plot 502 at the location A0.5 for a time window between the times t4.5 and t4.75, the metric data of the plot 502 is sampled by the ADC processor 104 for a time interval between the times t4.75 and t5.3. The metric data of the plot 502 sampled by the ADC processor 104 at the location A0.75 for the time interval between the times t4.75 and t5.3 is sent from the ADC processor 104 to the processor 124 of the analytical controller 106. It should be noted that the time window between the times t4.5 and t4.75 correspond to the sub-state S2a of the metric data of the plot 502 and the time window between the times t4.75 and t5.3 correspond to the sub-state S2b of the metric data of the plot 502.

Continuing with the example, instead of the operation 408 of the method 400, an operation of controlling the variable of the plasma source 226 based on the metric data obtained during the pre-set number of cycles is performed. To illustrate, the variable is controlled during the sub-state S2b of the cycle 3 of the clock signal. In the example, the variable is controlled during the pre-stored number of cycles of the clock signal that follow the pre-set number of cycles of the clock signal.

In an embodiment, the method described in the preceding embodiment is executed by the process controller 116 instead of by the processor 124 of the analytical controller 106. For example, metric data of the plot 502 sampled by the ADC processor 104 during the cycle 1 of the clock signal is received by the processor 132 of the process controller 116 from the analytical controller 106. In the embodiment, the pre-determined number of cycles of the clock signal, the pre-set number of cycles of the clock signal, and the pre-stored number of cycles of the clock signal are stored in the memory device 134 of the process controller 116.

It should further be noted that although various embodiments are described herein with reference to a state of metric data of the metric, the embodiments are applicable to a slice of the metric. For example, the method 280 applies to slices 1, 2, and 3. In the example, instead of the operation 286 of the method 280 (FIG. 2E), the processor 124 of the analytical controller 106 obtains the metric data of the plot 502 starting at a location A0.5 for a time window, such as a time interval, between the time t8.5 and a time t8.625. The time t8.625 comes after the time t8.5 and before the time t8.75. The location A0.5 is at the time t8.5 during the sub-state S2a and the time t8.625 is at a location A0.625. To illustrate, a portion of the metric data of the plot 502 is obtained by the processor 124 from the ADC processor 210 (FIG. 2A). The portion of the metric data of the plot 502 represents a slice 1 of the sub-state S2a of the metric data and is an example of the additional digital metric data 224 (FIG. 2B).

Moreover, in the example, instead of the operation 288 of the method 280, the processor 124 controls the variable during a time period of the slice 1 of the state S2a based on the metric data for the slice 1 of the plot 502. For example, the processor 124 determines whether the metric data collected during the slice 1 of the sub-state S2a is within the pre-determined range from the pre-stored value of the metric. In response to determining that the metric data collected during the slice 1 of the sub-state S2a is not within the predetermined range from the pre-stored value of the metric, the processor 124 controls the variable of the plasma source 226 (FIG. 2B). The processor of the analytical controller 106 controls the plasma source 226 until metric data collected during the slice 1 of the sub-state S2a obtained from the ADC processor 210 is within the pre-determined range from the pre-stored value of the metric. To illustrate, the variable is controlled to achieve the processing rate of processing the substrate S within the plasma chamber 114 of FIG. 1A or the plasma chamber 152 of FIG. 1B.

In the example, the variable controlled during the slice 1 of the sub-state S2a is of an RF signal that is generated by the plasma source 226 (FIG. 2B) and the plasma source 226 corresponds to an RF sensor. The correspondence to the RF sensor is described above with respect to controlling the variable during the sub-state S2a.

As another example, the method described in the preceding example is executed by the processor 132 of the process controller 116 instead of by the processor 124 of the analytical controller 106. For example, the processor 124 sends the metric data at the location A0.5 for the time window between the times t8.5 and t8.625 via the communication controllers 130 and 136 to the processor 132 of the process controller 116. Upon obtaining the metric data at the location A0.5 for the time window between the times t8.5 and t8.625 from the processor 124, the processor 132 of the process controller 116 controls the variable of the plasma source 226 based on the metric data.

In an embodiment, instead of the slice 1, another slice, such as a slice 2 or a slice 3 can be used to execute the method described in the preceding embodiment. For example, instead of obtaining the metric data of the plot 502 starting at the location A0.5 for the time window between the times t8.5 and t8.625, the metric data of the plot 502 starting at the location A0.625 for a time window between the times t8.625 and t8.75 is obtained. Also, the metric data of the plot 502 starting at the location A0.625 for the time window between the times t8.625 and t8.75 is an example of the additional digital metric data 224 (FIG. 2B). The operation of controlling the variable during the slice 2 is performed based on the metric data of the plot 502 at the location A0.625 for the time window between the times t8.625 and t8.75.

In one embodiment, the method 400 described above with reference to FIG. 4 applies to a slice of the plot 502. For example, instead of the operation 402 of the method 400, during the cycle 1 of the clock signal, the metric data of the plot 502 starting at the location A0.5 for the time window between the time t0.5 and a time t0.625 is obtained. The time t0.625 occurs before the time t0.75 and after the time t0.5. To illustrate, the metric data of the plot 502 sampled by the ADC processor 104 (FIG. 2C) at the location A0.5 for the time window between the time t0.5 and the time t0.625 is received by the processor 124 of the analytical controller 106 from the DPS 102. It should be noted that the time window between the times t0.5 and t0.625 correspond to the slice 1 during the sub-state S2a of the metric data of the plot 502. As another example, during the pre-determined number of cycles of the clock signal, the metric data of the plot 502 for slice 1 during the sub-state S2a is obtained.

Continuing with the example, instead of the operation 404 of the method 400, an operation of controlling the variable during the pre-set number of cycles of the clock signal that follow the pre-determined number of cycles of the clock signal is performed. The variable is controlled based on the metric data obtained during the pre-determined number of cycles during the slice 1 of the sub-state S2a. To illustrate, during a slice 1 of the sub-state S2a of the cycle 2 of the metric data of the plot 502, the processor 124 controls the variable of the plasma source 226 based on the metric data obtained during the slice 1 of the sub-state S2a of the cycle 1. The slice 1 of the sub-state S2a of the cycle 2 occurs between the time t4.5 and a time 4.625. The time t4.625 occurs after the time t4.5 and before the time t4.75. The cycle 2 is an example of the pre-set number of cycles.

Continuing further with the example, instead of the operation 406 of the method 400, an operation of collecting the metric data of the plot 502 for a different slice than that for which the metric data is obtained during the pre-determined number of cycles is performed. The metric data is collected for the different slice during the pre-set number of cycles. To illustrate, the metric data is collected during the cycle 2 starting at the location A0.625 for a time window between the times t4.625 and t4.75. In the illustration, during the cycle 2 of the clock signal, instead of sampling the metric data of the plot 502 at the location A0.5 for a time window between the times t4.5 and t4.625, the metric data of the plot 502 is sampled by the ADC processor 104 for a time interval between the times t4.625 and t4.75. The metric data of the plot 502 sampled by the ADC processor 104 at the location A0.625 for the time interval between the times t4.625 and t4.75 is sent from the ADC processor 104 to the processor

124 of the analytical controller 106. It should be noted that the time window between the times t4.625 and t4.75 correspond to a slice 2 of the sub-state S2a of the metric data of the plot 502.

Continuing with the example, instead of the operation 408 of the method 400, an operation of controlling the variable of the plasma source 226 based on the metric data obtained during the pre-set number of cycles is performed. To illustrate, the variable is controlled during the slice 2 of the sub-state S2a of the cycle 3 of the clock signal. In the example, the variable is controlled during the pre-stored number of cycles of the clock signal that follow the pre-set number of cycles of the clock signal.

In an embodiment, the method described in the preceding embodiment is executed by the process controller 116 instead of by the processor 124 of the analytical controller 106. For example, metric data of the plot 502 sampled by the ADC processor 104 during the cycle 1 of the clock signal is received by the processor 132 of the process controller 116 from the analytical controller 106. In the embodiment, the pre-determined number of cycles of the clock signal, the pre-set number of cycles of the clock signal, and the pre-stored number of cycles of the clock signal are stored in the memory device 134 of the process controller 116.

In one embodiment, the metric value M0 is a positive metric value.

In an embodiment, the metric value M0 is zero.

In one embodiment, each slice includes a pre-stored number of sample points that are sampled by the ADC processor 210 (FIG. 2A) during a time interval that ranges between 6 microseconds and 7 microseconds. For example, each slice includes 512 samples that are sampled during a time interval of 6.5 microseconds.

In one embodiment, a state is defined by a location and a time window from the location. For example, the state S1 includes the location A0 and a time window between the times t0 and t1. Also, a sub-state is defined by a location and a time window from the location. As an example, the sub-state S2a includes the location A0.5, which is at the time t4.5, and a time window from the location. In the example, the time window extends from the time t4.5 to the time t4.75. Further, a slice is defined by a location and a time window from the location. As an example, the slice 1 includes the location A0.5, which is at the time t4.5, and a time window from the location. In the example, the time window extends from the time t4.5 to the time t4.625.

It should be noted that although some of the embodiments are described herein with respect to a metric value during a time interval for a state, a sub-state, or a slice, in one embodiment, instead of the metric value, the metric has multiple metric values for the state, the sub-state, or the slice. For example, the metric values for the state, the sub-state, or the slice are within a pre-determined standard deviation of one of the metric values.

Figure 5B:
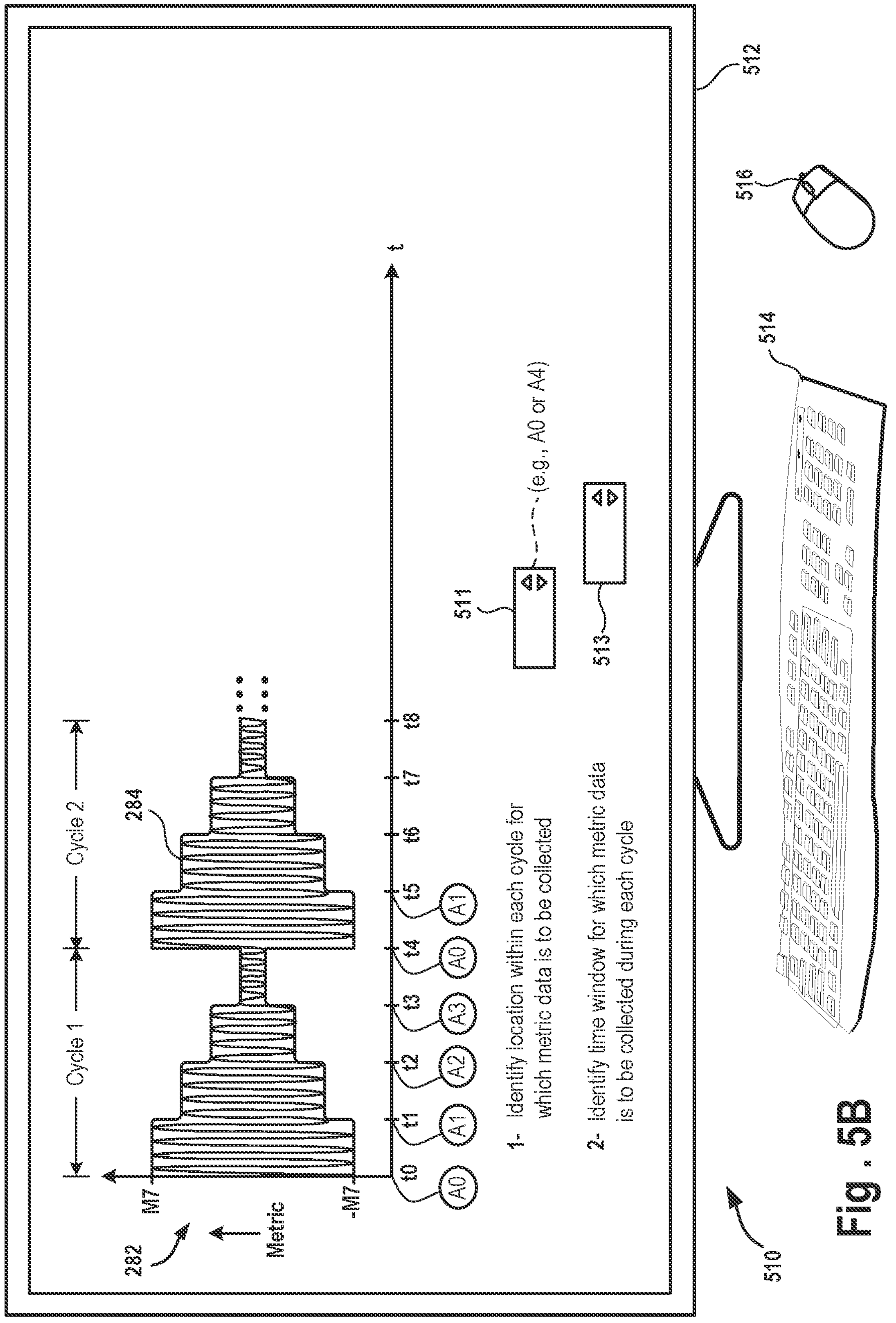
FIG. 5B is a diagram of an embodiment of a desktop computer to illustrate a selection of a location and a time window.

FIG. 5B is a diagram of an embodiment of a desktop computer 510 to illustrate a selection of a location and a time window. Examples of the location and the time window include a state of the metric, a sub-state of the metric, and a slice of the metric. The desktop computer 510 is an example of the process controller 116 or of the analytical controller 106 (FIG. 1A). The desktop computer 510 includes a monitor 512, a keyboard 514, and a mouse 516. The keyboard 514 is wirelessly coupled to a computer processor located within a housing of the monitor 512. Also, the mouse 516 is wirelessly coupled to the computer processor. The computer processor is an example of the processor 124 of the analytical controller 106 or of the processor 132 of the process controller 116. The monitor 512 includes a display device, such as a liquid crystal display (LCD) device, a light emitting diode (LED) device, or a plasma display device. The display device includes a display screen.

The graph 282 is displayed by a graphical processing unit (GPU) of the monitor 512 on the display screen. The GPU is coupled to the computer processor and is controlled by the computer processor. The display screen displays the plot 284. As an example, the plot 284 is constructed by the computer processor by connecting sample points or sample values of the digital metric data 204, and is rendered by the GPU on the display screen.

The GPU further renders a field 511 on the display screen for receiving a location at which the additional analog metric data 222 (FIG. 2B) is to be sampled by the ADC processor. A user uses the keyboard 514 and the mouse 516 for identifying, such as providing, the location at which the additional analog metric data 222 is to be sampled. An example of the location is a time at which a state of the metric starts. For example, the computer processor receives any of the locations A0, A1, A2, and A3 within the field 511 from the user at which analog metric data 222 is to be collected during each cycle of the clock signal.

In addition, the GPU displays another field 513 for receiving a time window that starts at the location received within the field 511. The user uses the keyboard 514 and the mouse 516 for identifying, such as providing, the time window, such as a number of seconds, or a number of milliseconds, or a number of microseconds, within the field 513.

Upon receiving the location within the field 511 and the time window within the field 513, the computer processor generates the control signal 206 (FIG. 2A) indicating the location and the time window. Upon receiving the control signal 206 from the desktop computer 510, the ADC processor 210 (FIG. 2A) collects, such as samples, the additional analog metric data 222 (FIG. 2B) at the location received within the field 511 for the time window during each cycle of the clock signal to output the additional digital metric data 224 (FIG. 2B). For example, analog metric data outside the time window is not sampled by the ADC processor 210 during each cycle of the clock signal to output the additional digital metric data 224.

Figure 5C:
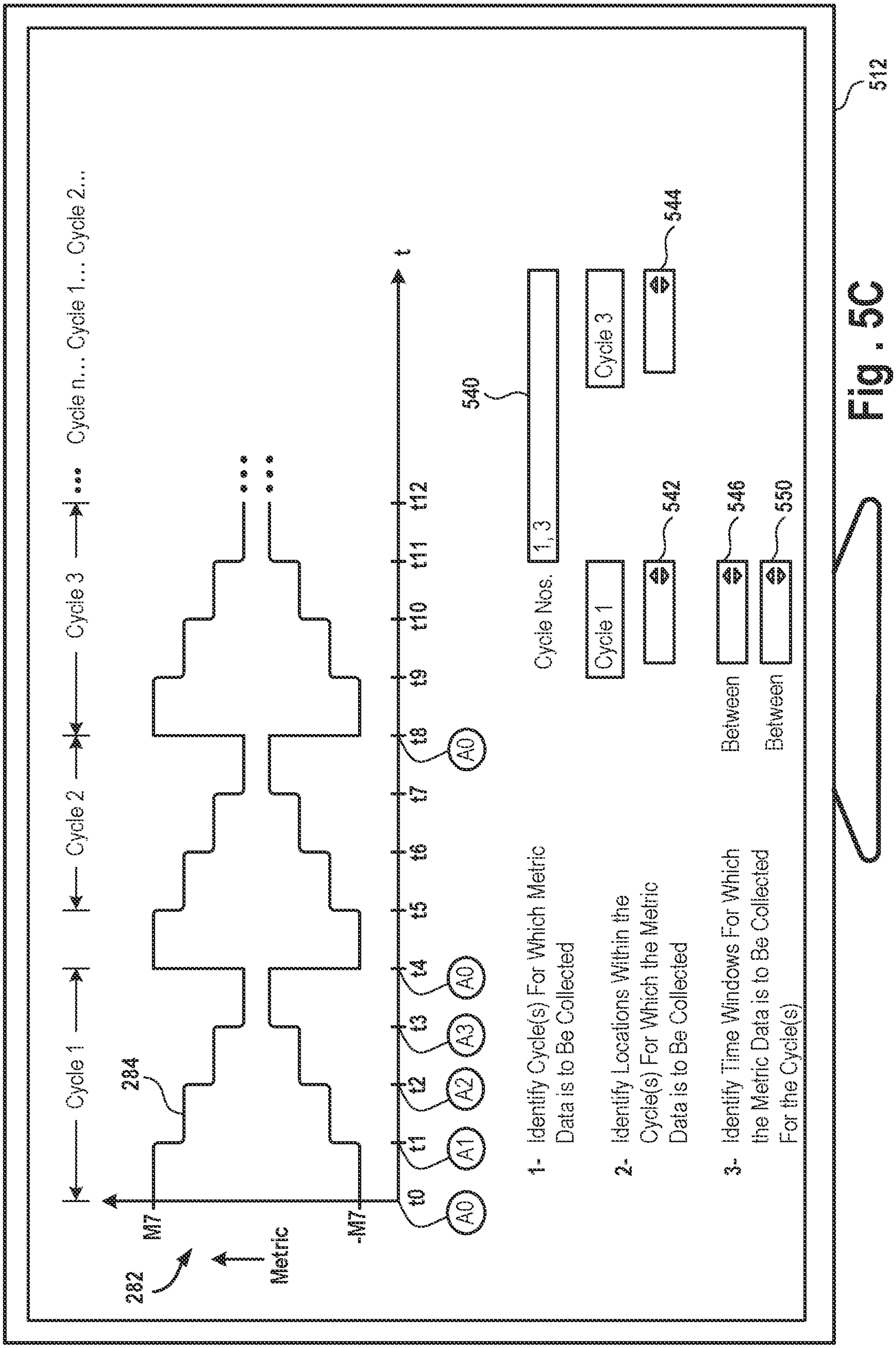
FIG. 5C is a diagram of an embodiment of a monitor to illustrate that different locations or time windows or a combination thereof can be provided for different cycles of the clock signal.

FIG. 5C is a diagram of an embodiment of the monitor 512 to illustrate that different locations or time windows or a combination thereof can be provided for different cycles of the clock signal. The monitor 512 displays the graph 282. The GPU displays a field 540 for receiving an identity, such as an identification number, of a cycle of the clock signal for which the additional analog metric data 222 (FIG. 2B) is to be sampled by the ADC processor. The user uses the keyboard 514 and the mouse 516 for identifying, such as providing, one or more identities of one or more cycles of the clock signal for which the additional analog metric data 222 is to be sampled. For example, the computer processor receives numbers 1 and 3 within the field 540 from the user identifying the cycles 1 and 3 of the clock signal for which the analog metric data 222 is to be collected.

The GPU further displays a field 542 for receiving a location at which the additional analog metric data 222 (FIG. 2B) is to be sampled by the ADC processor 210 during the cycle 1 of the clock signal. The cycle 1 is identified in the field 540. The user uses the keyboard 514 and the mouse 516 for identifying, such as providing, the location at which the additional analog metric data 222 is to be sampled during the cycle 1 of the clock signal.

The GPU further displays another field 544 for receiving a location at which the additional analog metric data 222 (FIG. 2B) is to be sampled by the ADC processor 210 during the cycle 3 of the clock signal. The cycle 3 is identified in the field 540. The user uses the keyboard 514 and the mouse 516 for identifying, such as providing, the location at which the additional analog metric data 222 is to be collected during the cycle 3 of the clock signal.

In addition, the GPU displays another field 546 for receiving a first time window during which the analog metric data 222 is to be sampled during the cycle 1 of the clock signal. The first time window covers a state, or a sub-state, or a slice of the analog metric data 222. The analog metric data 222 is to be sampled from the location received within the field 542. The user uses the keyboard 514 and the mouse 516 for identifying, such as providing, the first time window within the field 546.

Also, the GPU displays another field 550 for receiving a second time window during which the analog metric data 222 is to be sampled during the cycle 3 of the clock signal. The user uses the keyboard 514 and the mouse 516 for identifying, such as providing, the second time window within the field 550. The second time window covers a state, or a sub-state, or a slice of the analog metric data 222. The analog metric data 222 is to be sampled from the location received within the field 544. The user uses the keyboard 514 and the mouse 516 for identifying, such as providing, the second time window within the field 550.

Upon receiving the cycles 1 and 3 within the field 540, the locations within the fields 542 and 544, and the first and second time windows within the fields 546 and 550, the computer processor generates the control signal 206 (FIG. 2A) having the cycles, the locations and the first and second time windows. Upon receiving the control signal 206 from the desktop computer 510, the ADC processor 210 (FIG. 2A) samples the additional analog metric data 222 (FIG. 2B) starting at the location received within the field 542 and for the first time window within the field 546 during the cycle 1 of the clock signal to output the additional digital metric data 224. For example, the metric data outside the first time window received within the field 546 is not sampled by the ADC processor 210 during the cycle 1 of the clock signal to output the additional digital metric data 224 (FIG. 2B).

Also, in response to receiving the control signal 206 from the desktop computer 510, the ADC processor 210 (FIG. 2A) samples the additional analog metric data 222 (FIG. 2B) starting at the location received within the field 544 and for the second time window within the field 546 during the cycle 3 of the clock signal to output the additional digital metric data 224. For example, the metric data outside the second time window received within the field 550 is not sampled by the ADC processor 210 during the cycle 3 of the clock signal to output the additional digital metric data 224 (FIG. 2B).

In one embodiment, instead of the cycle 1, multiple cycles, such as 1 and 2 of the clock signal are received within the field 540. Also, instead of the cycle 3, multiple cycles, such as 3, 4, and 5, of the clock signal are received within the field 540. Further, for each cycle 1, 2, 3, 4, and 5, a field is provided for receiving a location within the cycle at which digital metric data, such as the digital metric data 224 (FIG. 2B), is to be output by the ADC processor 210. Also, for each cycle 1 through 5, a field is provided for receiving a time window during which the digital metric data is to be output.

Figure 6A:
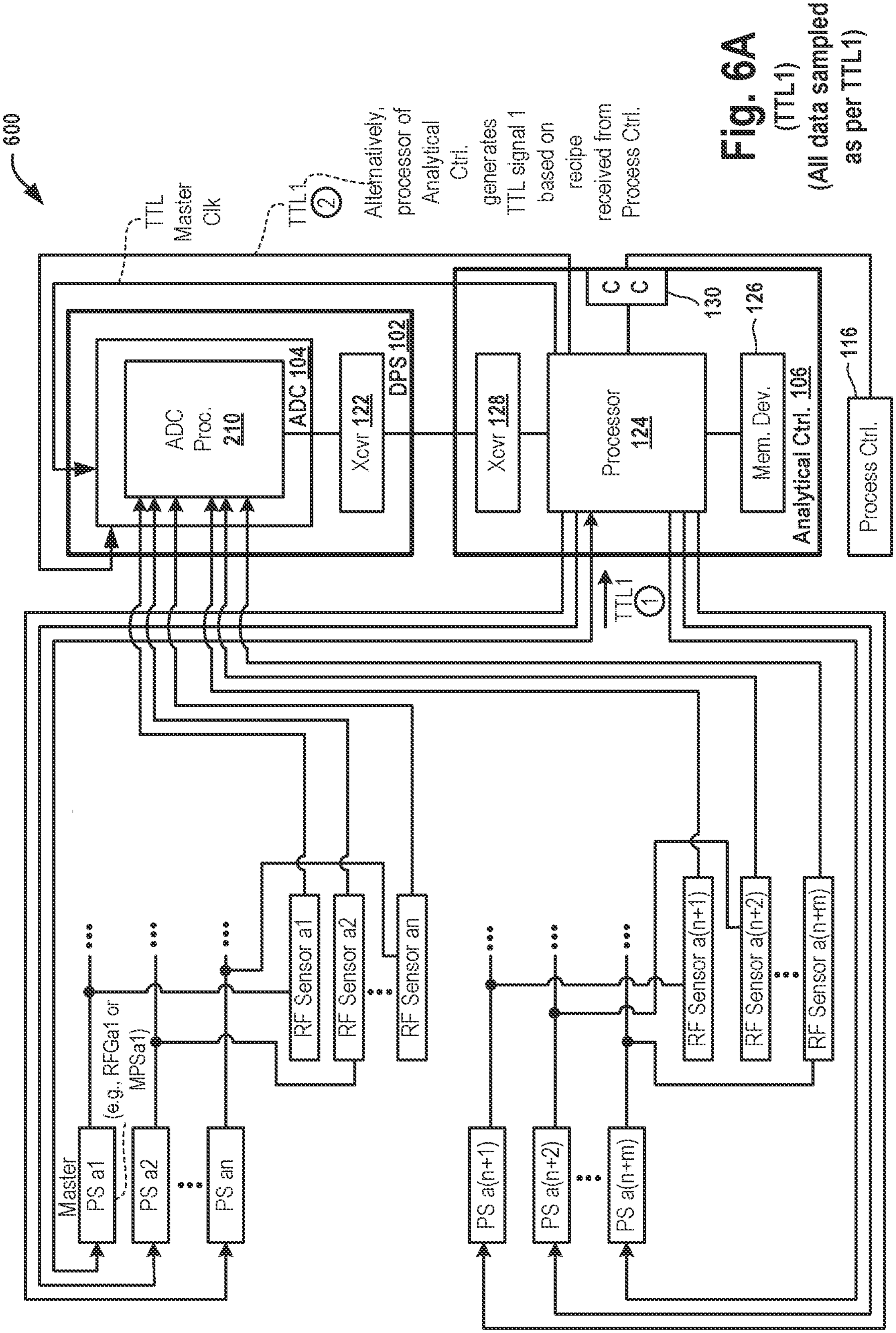
FIG. 6A is a diagram of an embodiment of a system to illustrate use of a single digital pulsed signal to sample metric data of the metric from the RF sensors.

FIG. 6A is a diagram of an embodiment of a system 600 to illustrate use of a single digital pulsed signal to sample analog metric data received from the RF sensors a1 through a(n+m) (FIGS. 1A and 1B). An example of the single digital pulsed signal is a transistor-transistor logic (TTL) signal. To illustrate, the single digital pulsed signal is a TTL1 signal. In the illustration, the TTL1 signal transitions between a logic level 1 and a logic level 0 in a periodic manner.

The system 600 includes a plasma source (PS) a1, a plasma source a2, and so on until a plasma source an. The system 600 further includes a plasma source PSa(n+1), PSa plasma source PSa(n+2) and so on until a plasma source PSa(n+m). Examples of a plasma source, as used herein, include an RF generator or a matchless plasma source. To illustrate, examples of the plasma source an include the RF generator RFGan and the matchless plasma source MPSan and examples of the plasma source PSa(n+m) include the RF generator RFGa(n+m) and the matchless plasma source MPSa(n+m).

The system 600 further includes the RF sensors a1 through a(n+m), the DPS 102, the analytical controller 106, and the process controller 116. As an example, the system 600 includes components of the system 100 of FIG. 1A. As another example, the system 600 includes components of the system 150 of FIG. 1B.

The plasma source PSa1 is an example of a master plasma source, which generates the TTL1 signal. The plasma source PSa1 supplies the TTL1 signal to the processor 124 of the analytical controller 106. The processor 124 receives the TTL1 signal from the plasma source a1 and sends the TTL1 signal to the ADC processor 210 of the DPS 102. The ADC processor 210 receives analog metric data, such as the analog metric data 222 (FIG. 2B), from the RF sensors a1 through a(n+m), and samples the analog metric data in synchronization with the TTL1 signal to output digital metric data. For example, the analog metric data is sampled during each rising edge or each falling edge or a combination thereof of the TTL1 signal. The analog metric data is sampled at a location of metric data of the metric for a time window. The time window corresponds to a state of the metric, or a sub-state of the metric, or a slice of the metric.

In one embodiment, the processor 124 generates the clock signal and sends the clock signal to the ADC processor 210. Metric data of the metric received from the RF sensors a1 through an is sampled in synchronization with the clock signal. For example, the TTL1 signal is synchronized to the clock signal. To illustrate, a pre-created number of cycles of the TTL1 signal occur during each cycle of the clock signal.

Also, in the embodiment, the clock signal is supplied by the analytical controller 106 to all components of the plasma system 600. Examples of the components of the plasma system 600 include the plasma sources PSa1 through PSa (n+m), and the DPS 102. In case the match systems are used in the plasma system 600, the components of the plasma system 600 include the match systems.

In one embodiment, the processor 124 of the analytical controller 106 generates the TTL1 signal as per recipe information that is received from the user via the mouse 516 and the keyboard 514 (FIG. 5B). The processor 124 of the analytical controller 106 sends the TTL1 signal to the ADC processor 210, which samples analog metric data in synchronization with rising and falling edges of the TTL1 signal.

In an embodiment, the processor 124 of the analytical controller 106 generates the TTL1 signal as per recipe information received from the process controller 116. The processor 132 of the process controller 116 receives the recipe information from the user via the mouse 516 and the keyboard 514 (FIG. 5B). The processor 124 of the analytical controller 106 sends the TTL1 signal to the ADC processor 210.

In an embodiment, the processor 132 of the process controller 116 generates the TTL1 signal as per recipe information that is received from the user via the mouse 516 and the keyboard 514 (FIG. 5B). The processor 132 sends the TTL1 signal to the processor 124 of the analytical controller 106. The processor 124 sends the TTL1 signal to the ADC processor 210.

In one embodiment, any plasma source, other than the plasma source PSa1, of the system 600 is the master plasma source that generates the TTL1 signal.

Figure 6B:
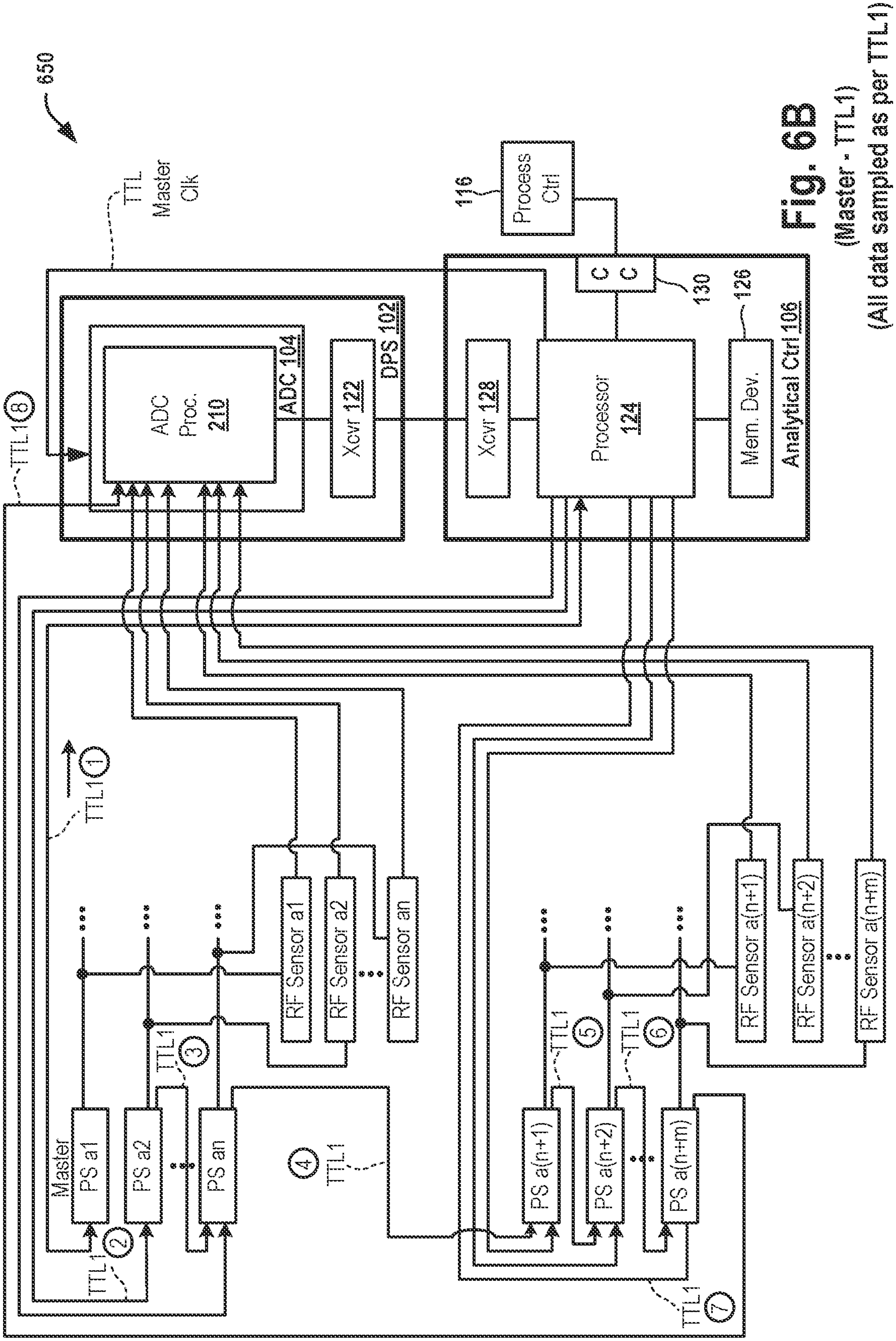
FIG. 6B is a diagram of an embodiment of a system to illustrate a different route for reception of a transistor-transistor logic 1 (TTL1) signal by a processor of an analog-to-digital converter (ADC).

FIG. 6B is a diagram of an embodiment of a system 650 to illustrate a different route for reception of the TTL1 signal by the ADC processor 210 than that illustrated in FIG. 6A. The system 650 includes the plasma sources PSa1 through PSa(n+m), the RF sensors a1 through a(n+m), the DPS 102, the analytical controller 106, and the process controller 116. As an example, the system 650 includes components of the system 100 of FIG. 1A. As another example, the system 650 includes components of the system 150 of FIG. 1B.

The plasma source PSa1 generates the TTL1 signal and sends the TTL1 signal to the processor 124 of the analytical controller 106. The processor 124 sends the TTL1 signal to the plasma source PSa2, which relays the TTL1 signal to the plasma source PSa3, and so on until the TTL1 signal is sent from a plasma source PSa(n+m−1) to the plasma source PSa(n+m). The plasma source PSa(n+m) sends the TTL1 signal to the ADC processor 210. The ADC processor 210 samples metric data of the metric received from the RF sensors a1 through a(n+m) in synchronization with the TTL1 signal.

In an embodiment, instead of the plasma source PSa1, the processor 132 of the process controller 116 generates the TTL1 signal as per recipe information that is received from the user via the mouse 516 and the keyboard 514 (FIG. 5B). The processor 132 sends the TTL1 signal to the processor 124 of the analytical controller 106. The processor 124 sends the TTL1 signal to the plasma source PSa1, which relays the TTL1 signal to the plasma source PSa2 and so on until the TTL1 signal is relayed to the plasma source PSa(n+m). The plasma source PSa(n+m) sends the TTL1 signal to the ADC processor 210.

In one embodiment, the plasma source PSa1 generates the TTL1 signal and relays the TTL1 signal to the plasma source a2 and so on until the TTL1 signal is replayed to the plasma source PSa(n+m). The TTL1 signal is not sent from the plasma source PSa1 to the processor 124.

In an embodiment, the clock signal is generated by the processor 124 and supplied by the analytical controller 106 to all components of the plasma system 650. Examples of the components of the plasma system 650 include the plasma sources PSa1 through PSa(n+m), and the DPS 102. In case the match systems are used in the plasma system 650, the components of the plasma system 650 include the match systems.

FIG. 7A is an embodiment of a graph 700 to illustrate a plot 702. The plot 702 is an example of the TTL1 signal (FIGS. 6A and 6B). The graph 700 includes a logic level of the plot 702 on a y-axis and the time t on an x-axis. The plot 702 transitions between a logic level 1 and a logic level 0 in a periodic manner. For example, the plot 702 transitions from the logic level 0 to the logic level 1 at the time to, remains at the logic level 1 between the times t0 and t1.5, transitions from the logic level 1 to the logic level 0 at the time t1.5, remains at the logic level 0 between the times t1.5 and t4, transitions from the logic level 0 to the logic level 1 at the time t4, remains at the logic level 1 between the times t4 and t5.5, transitions from the logic level 1 to the logic level 0 at the time t5.5, remains at the logic level 0 between the times t5.5 and t8, and transitions from the logic level 0 to the logic level 1 at the time t8.

FIG. 7B is an embodiment of a graph 704 to illustrate a plot 706 of metric data, such as analog metric data, of the metric that is output from the RF sensor a1 (FIGS. 6A and 6B). The graph 704 includes a metric level of the metric of the plot 706 on a y-axis and the time t on an x-axis. The plot 706 transitions between the metric level M4 and the metric level M0 in a periodic manner. For example, the plot 706 transitions from the metric level M0 to the metric level M4 at the time to, remains at the metric level M4 between the times t0 and t1.5, transitions from the metric level M4 to the metric level M0 at the time t1.5, remains at the metric level M0 between the times t1.5 and t4, transitions from the metric level M0 to the metric level M4 at the time t4, remains at the metric level M4 between the times t4 and t5.5, transitions from the metric level M4 to the metric level M0 at the time t5.5, remains at the metric level M0 between the times t5.5 and t8, and transitions from the metric level M0 to the metric level M4 at the time t8. The metric level M4 defines a state S1 of the metric measured by the RF sensor a1 and the metric level M0 defines a state S2 of the metric measured by the RF sensor a1.

It should be noted that a metric level of the metric includes one or more metric values of the metric. For example, the metric level M4 has the metric value M4. As another example, the metric level M4 has the metric value M4 and additional values that are within a pre-determined standard deviation of the metric value M4.

It should further be noted that a first metric level has metric values that are exclusive of metric values of a second metric level. For example, a minimum of the metric values of the first metric level is greater than a maximum of the metric values of the second metric level. In this example, the first metric level is greater than the second metric level.

The metric data of the plot 706 is sampled by the ADC processor 210 (FIGS. 6A and 6B) in synchronization with the plot 702 (FIG. 7A), which is an example of the TTL1 signal. For example, the plot 706 is sampled periodically at a rising edge of the plot 702. To illustrate, the metric data of the plot 706 is converted from the analog form to the digital form at the time t0 during the cycle 1 of the clock signal and at the time t4 during the cycle 2 of the clock signal. As another example, the plot 706 is sampled periodically at a falling edge of the plot 702. To illustrate, the metric data of the plot 706 is converted from an analog form to a digital form at the time t1.5 during the cycle 1 of the clock signal and at the time t5.5 during the cycle 2 of the clock signal. As another example, the plot 706 is sampled periodically at the falling edge of the plot 702 and is sampled periodically at the rising edge of the plot 702.

In one embodiment, the plot 706 is generated from metric data of the metric that is measured by any of the RF sensors a2, a3, and a4 through a(n+m) instead of the RF sensor a1.

FIG. 7C is an embodiment of a graph 708 to illustrate a plot 710 of metric data of the metric that is measured by the RF sensor a2 (FIGS. 6A and 6B). The graph 708 includes a metric level of the metric of the plot 710 on a y-axis and the time t on an x-axis. The plot 710 transitions among the metric level M5, the metric level M4, and the metric level M1 in a periodic manner. For example, the plot 710 transitions from the metric level M0 to the metric level M5 at the time to, remains at the metric M5 from the time t0 to the time t1, transitions from the metric level M5 to the metric level M4 at the time t1, remains at the metric level M4 from the time t1 to the time t2.5, transitions from the metric level M4 to the metric level M1 at the time t2.5, remains at the metric level M1 from the time t2.5 to the time t4, transitions from the metric level M4 to the metric level M5 at the time t4, remains at the metric level M5 from the time t4 to the time t5, transitions from the metric level M5 to the metric level M4 at the time t5, remains at the metric level M4 from the time t5 to the time t6.5, transitions from the metric level M4 to the metric level M1 at the time t6.5, remains at the metric level M1 from the time t6.5 to the time t8, and transitions from the metric level M1 to the metric level M5 at the time t8. The metric level M5 defines a state S1 of the metric measured by the RF sensor a2, the metric level M4 defines a state S2 of the metric measured by the RF sensor a2, and the metric level M1 defines a state S3 of the metric measured by the RF sensor a2.

The metric data, such as analog metric data, represented by the plot 710 is sampled by the ADC processor 210 (FIGS. 6A and 6B) in synchronization with the plot 702 (FIG. 7A), which is an example of the TTL1 signal. For example, the plot 710 is sampled periodically at a rising edge of the plot 702. To illustrate, the metric data of the plot 710 is converted from the analog form to the digital form at the time t0 during the cycle 1 of the clock signal and at the time t4 during the cycle 2 of the clock signal. As another example, the plot 710 is sampled periodically at a falling edge of the plot 702. To illustrate, the metric data of the plot 710 is converted from the analog form to the digital form at the time t1.5 during the cycle 1 of the clock signal and at the time t5.5 during the cycle 2 of the clock signal. As another example, the plot 710 is sampled periodically at the falling edge of the plot 702 and is sampled periodically at the rising edge of the plot 702.

In one embodiment, the plot 710 is generated from metric data of the metric that is measured by any of the RF sensors a1, a3, and a4 through a(n+m) instead of the RF sensor a2.

FIG. 7D is an embodiment of a graph 712 to illustrate a plot 714 of metric data that is measured by the RF sensor an (FIGS. 6A and 6B). The graph 712 includes a metric level of the metric the plot 714 on a y-axis and the time t on an x-axis. The plot 714 transitions among the metric level M7, the metric level M6, the metric level M5, the metric level M4, and the metric level M1 in a periodic manner during each cycle of the clock signal. For example, during the cycle 1 of the clock signal, the plot 714 transitions from the metric level M1 to the metric level M7 at the time to, remains at the metric level M7 from the time t0 to the time t0.5, transitions from the metric level M7 to the metric level M6 at the time t0.5, remains at the metric level M6 from the time t0.5 to the time t1, transitions from the metric level M6 to the metric level M5 at the time t1, remains at the metric level M5 from the time t1 to the time t2, transitions from the metric level M5 to the metric level M4 at the time t2, remains at the metric level M4 from the time t2 to the time t2.5, and transitions from the metric level M4 to the metric level M1 at the time t2.5. Also, in the example, during the cycle 1 of the clock signal, the plot 714 remains at the metric level M1 from the time t2.5 to the time t4. In the example, during the cycle 2 of the clock signal, the plot 714 transitions from the metric level M1 to the metric level M7 at the time t4. In the example, the transitioning among the metric levels M7 to M1 repeats during the cycle 2 of the clock signal. The metric level M7 defines a state S1 of the metric measured by the RF sensor a3, the metric level M6 defines a state S2 of the metric measured by the RF sensor a3, and the metric level M5 defines a state S3 of the metric measured by the RF sensor a3. Also, the metric level M4 defines a state S4 of the metric measured by the RF sensor a3 and the metric level M1 defines a state S5 of the metric measured by the RF sensor a3.

The metric data of the plot 714 is sampled by the ADC processor 210 (FIGS. 6A and 6B) in synchronization with the plot 702 (FIG. 7A), which is an example of the TTL1 signal. For example, the plot 714 is sampled periodically at a rising edge of the plot 702. To illustrate, the metric data of the plot 714 is converted from the analog form to the digital form at the time t0 during the cycle 1 of the clock signal and at the time t4 during the cycle 2 of the clock signal. As another example, the plot 714 is sampled periodically at a falling edge of the plot 702. To illustrate, the metric data of the plot 714 is converted from the analog form to the digital form at the time t1.5 during the cycle 1 of the clock signal and at the time t5.5 during the cycle 2 of the clock signal. As another example, the plot 714 is sampled periodically at the falling edge of the plot 702 and is sampled periodically at the rising edge of the plot 702. In the manner illustrated with reference to FIGS. 7A-7D, metric data of the metric received from the RF sensors a1 through an is sampled in synchronization with the single TTL1 signal.

In one embodiment, the plot 714 is generated from metric data of the metric that is measured by any of the RF sensors a1, a2 through a(n−1) and a(n+1) through a(n+m) instead of the RF sensor an.

Figure 8:
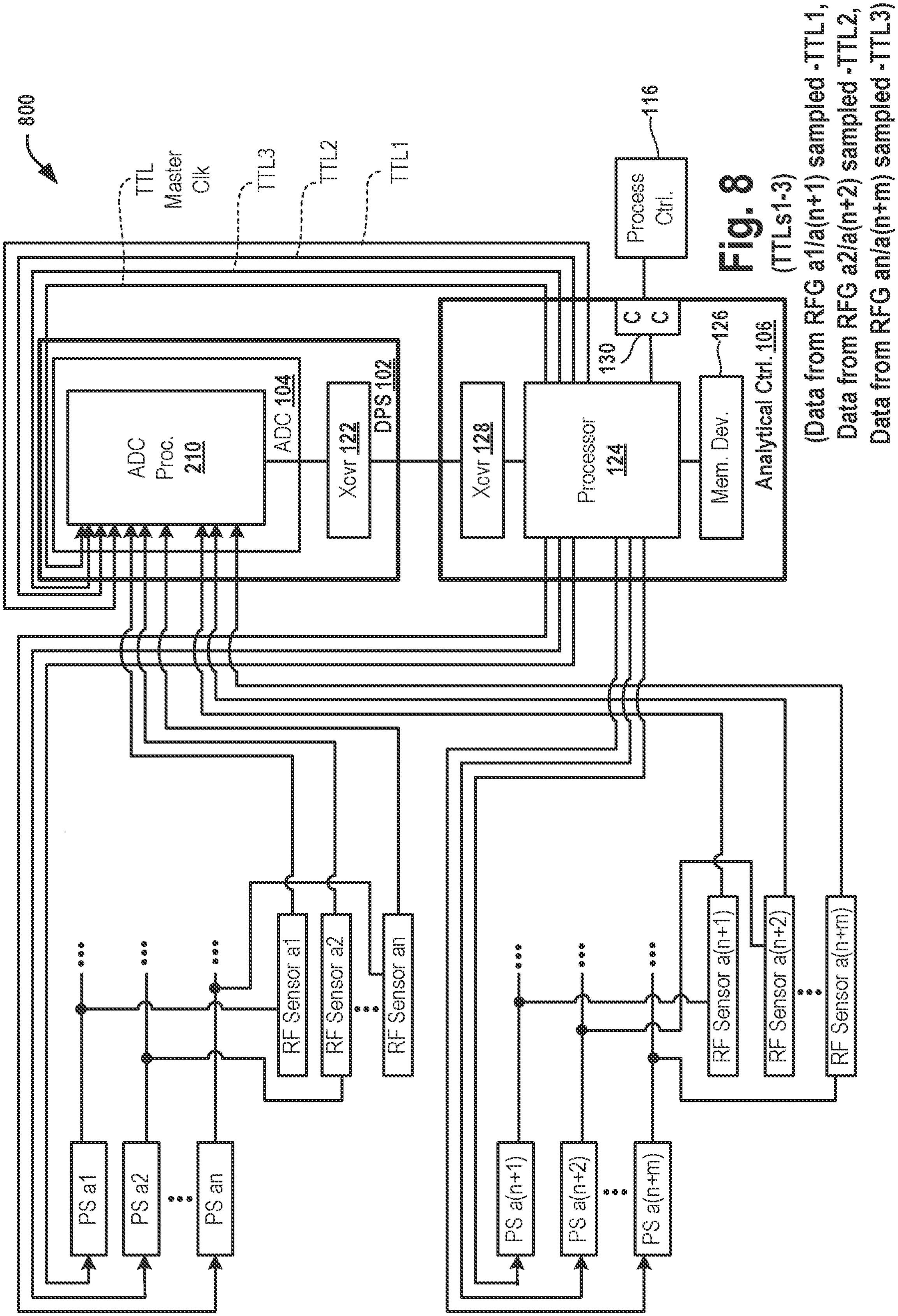
FIG. 8 is a diagram of an embodiment of a system to illustrate use of multiple digital pulsed signals, such as TTL signals, to sample metric data of the metric that is received from the RF sensors.

FIG. 8 is a diagram of an embodiment of a system 800 to illustrate use of multiple digital pulsed signals, such as TTL signals, to sample metric data of the metric that is received from the RF sensors a1 through a(n+m). For example, the processor 124 of the analytical controller 106 generates multiple digital pulsed signals for sampling analog metric data received from the RF sensors a1 through a(n+m). To illustrate, a first one of the digital pulsed signals is used to sample analog metric data received from the RF sensor a1 at each state of the metric data. In the illustration, a second one of the digital pulsed signals is used to sample analog metric data received from the RF sensor a2 at each sub-state of the metric data. Also, in the illustration, a third one of the digital pulsed signals is used to sample analog metric data received from the RF sensor a3 at each slice of the metric data.

The system 800 includes the plasma sources PSa1 through PSa(n+m), the RF sensors a1 through a(n+m), the DPS 102, the analytical controller 106, and the process controller 116. As an example, the system 800 has the same structure as the system 100 of FIG. 1A. As another example, the system 800 is the same structure as that of the system 150 of FIG. 1B.

The processor 124 of the analytical controller 106 generates the TTL signals, such as the TTL1 signal, a TTL2 signal, and a TTL3 signal. The processor 124 supplies the TTL signals to the ADC processor 210. The ADC processor 210 receives analog metric data from the RF sensors a1 through a3. The ADC processor 210 samples the analog metric data of the metric received from the RF sensor a1 in synchronization with the TTL1 signal to output digital metric data. Also, the ADC processor 210 samples the metric data of the metric received from the RF sensor a2 in synchronization with the TTL2 signal to output digital metric data and the ADC processor 210 samples the metric data of the metric received from the RF sensor a3 in synchronization with the TTL3 signal to output digital metric data.

Also, the processor 124 generates the clock signal, and sends the clock signal to the ADC processor 210. The analog metric data received from the RF sensors a1 through an is sampled in synchronization with the clock signal. For example, each of the TTL1, TTL2, and TTL3 signal is synchronized to the clock signal. To illustrate, a first pre-created number of cycles of the TTL1 signal occur during each cycle of the clock signal, a second pre-created number of cycles of the TTL1 signal occur during each cycle of the clock signal, and a third pre-created number of cycles of the TTL3 signal occur during each cycle of the clock signal.

Also, the clock signal is generated and supplied by the processor 124 of the analytical controller 106 to all components of the plasma system 800. Examples of the components of the plasma system 800 includes the plasma sources PSa1 through PSa(n+m), and the DPS 102. In case the match systems are used in the plasma system 800, the components of the plasma system 800 include the match systems.

In one embodiment, the processor 124 of the analytical controller 106 generates each of the TTL1, TTL2 and TTL3 signals as per recipe information that is received from the user via the mouse 516 and the keyboard 514 (FIG. 5B). The processor of the analytical controller 106 sends the TTL1, TTL2 and TTL3 signals to the ADC processor 210.

In an embodiment, the processor 132 of the process controller 116 (FIG. 1A) generates each of the TTL1, TTL2 and TTL3 signals as per recipe information that is received from the user via the mouse 516 and the keyboard 514 (FIG. 5B). The processor 132 sends the TTL1, TTL2 and TTL3 signals to the processor 124 of the analytical controller 106, and the processor 124 of the analytical controller 106 sends the TTL1, TTL2 and TTL3 signals to the ADC processor 210.

FIG. 9A is a graph 900 to illustrate a plot 902 of the clock signal. The graph 900 plots a logic level of the plot 902 on a y-axis and the time t on an x-axis. The clock signal, as illustrated in the plot 902, periodically transitions between the logic level 1 and the logic level 0. For example, the cycle 1 of the plot 902 occurs between the time t0 and the time t4 and the cycle 2 of the plot 902 occurs between the time t4 and the time t8. To illustrate, during the cycle 1, the plot 902 transitions from the logic level 0 to the logic level 1 at the time t0 and remains at the logic level 1 from the time t0 to the time t2. In the illustration, during the cycle 1 of the clock signal, the plot 902 transitions from the logic level 1 to the logic level 0 at the time t2, and remains at the logic level 0 from the time t2 to the time t4. Continuing further with the illustration, during the cycle 2 of the clock signal, the plot 902 transitions from the logic level 0 to the logic level 1 at the time t4 and remains at the logic level 1 from the time t4 to the time t6. Also, during the cycle 2 of the clock signal, the plot 902 transitions from the logic level 1 to the logic level 0 at the time t6 and remains at the logic level 0 from the time t6 to the time t8. During the cycle 3 of the clock signal, the plot 902 transitions from the logic level 0 to the logic level 1 at the time t8.

In one embodiment, a transition from the logic level 0 to the logic level 1 during a current cycle of the clock signal is a portion of a preceding cycle of the clock cycle. For example, the transition of the plot 902 at the time t0 from the logic level 0 to the logic level 1 is a portion of a cycle 0, which precedes the cycle 1 of the clock signal. The cycle 0 is of the clock signal. As another example, the transition of the plot 902 at the time t4 from the logic level 0 to the logic level 1 is a portion of a cycle 1, which precedes the cycle 2 of the clock signal.

FIG. 9B is an embodiment of the graph 700 to illustrate the plot 702 of the TTL1 signal of FIG. 8.

FIG. 9C is an embodiment of the graph 704 to illustrate the plot 706 of the metric data that is output from the RF sensor a1 (FIG. 8).

FIG. 9D is an embodiment of a graph 904 to illustrate a plot 906. The plot 906 is an example of the TTL2 signal (FIG. 8). The graph 904 includes a logic level of the plot 906 on a y-axis and the time t on an x-axis. The plot 906 periodically transitions between the logic level 1 and the logic level 0. For example, the plot 906 transitions from the logic level 0 to the logic level 1 at the time t0 and remains at the logic level 1 from the time to to the time t1. The plot 906 transitions from the logic level 1 to the logic level 0 at the time t1 and remains at the logic level 0 from the time t1 to the time t1.5. The plot 906 transitions from the logic level 0 to the logic level 1 at the time t1.5 and remains at the logic level 1 from the time t1.5 to the time t2.5. The plot 906 transitions from the logic level 1 to the logic level 0 at the time t2.5 and remains at the logic level 0 from the time t2.5 to the time t4. Also, the plot 906 transitions from the logic level 0 to the logic level 1 at the time t4 and remains at the logic level 1 from the time t4 to the time t5. Moreover, the plot 906 transitions from the logic level 1 to the logic level 0 at the time t5 and remains at the logic level 0 from the time t5 to the time t5.5. The plot 906 transitions from the logic level 0 to the logic level 1 at the time t5.5 and remains at the logic level 1 from the time t5.5 to the time t7. The plot 906 transitions from the logic level 1 to the logic level 0 at the time t7 and remains at the logic level 0 from the time t7 to the time t8. The plot 906 transitions from the logic level 0 to the logic level 1 at the time t8. It should be noted that a frequency of transitions between the logic levels 1 and 0 of the plot 906 is greater than a frequency of transitions between the logic levels 1 and 0 of the plot 702 (FIG. 9B).

FIG. 9E is an embodiment of a graph 908 to illustrate a plot 910 of metric data, such as analog metric data, of the metric that is output from the RF sensor a2 (FIG. 8). The graph 908 includes a metric level of the metric of the plot 910 on a y-axis and the time t on an x-axis. The plot 910 transitions among the metric level M4, a metric level M3.7, the metric level M2, and a metric level M2.3 in a periodic manner. For example, the plot 901 transitions at the time t0 from the metric level M2.3 to the metric level M4 and remains at the metric level M4 from the time t0 to the time t1. Moreover, the plot 901 transitions at the time t1 from the metric level M4 to the metric level M3.7 and remains at the metric level M3.7 from the time t1 to the time t1.5. The plot 901 transitions at the time t1.5 from the metric level M3.7 to the metric level M2 and remains at the metric level M2 from the time t1.5 to the time t3. Also, the plot 901 transitions at the time t3 from the metric level M2 to the metric level M2.3 and remains at the metric level M2.3 from the time t3 to the time t4. The plot 901 repeats the transitions among the metric levels M4, M3.7, M2, and M2.3 during the cycle 2 of the clock signal.

The metric level M4 defines a sub-state Sla of the metric measured by the RF sensor a2, the metric level M3.7 defines a sub-state S1b of the metric measured by the RF sensor a2, the metric level M2 defines a sub-state S2a of the metric measured by the RF sensor a2, and the metric level M2.3 defines a sub-state S2b of the metric measured by the RF sensor a2. The metric level 3.7 is less than the metric level M4 but greater than the metric level M3. Also, the metric level M2.3 is greater than the metric level M2 but less than the metric level M3.

It should be noted that the sub-states S1a and S1b of the plot 910 belong to a state S1 of the plot 910. Similarly, the sub-states S2a and S2b of the plot 910 belong to a state S2 of the plot 910.

The metric data of the plot 910 is sampled by the ADC processor 210 (FIG. 8) in synchronization with the plot 906

(FIG. 7A). For example, the plot 910 is sampled periodically at a rising edge and falling edge of the plot 910. To illustrate, the analog metric data illustrated in the plot 910 is converted from the analog form to the digital form at the time t0 during the cycle 1 of the clock signal to sample the sub-state Sla of the plot 910. In the illustration, the analog metric data illustrated in the plot 910 is converted from the analog form to the digital form at the time t1 during the cycle 1 of the clock signal to sample the sub-state S1b of the plot 910. Continuing with the illustration, the analog metric data illustrated in the plot 910 is converted from the analog form to the digital form at the time t1.5 during the cycle 1 of the clock signal to sample the sub-state S2a of the plot 910. The analog metric data illustrated in the plot 910 is converted from the analog form to the digital form at the time t3 during the cycle 1 of the clock signal to sample the sub-state S2b of the plot 910. Similarly, the analog data illustrated in the plot 910 is sampled during the cycle 2 of the clock signal to sample the sub-states Sla, S1b, S2a, and S2b of the plot 910.

In one embodiment, the plot 910 is generated from analog metric data that output from any of the RF sensors a1, a3, and a4 through a(n+m) instead of the RF sensor a2.

In an embodiment, the plot 906 is used to sample the plot 706 of the analog metric data that is output from the RF sensor a1 instead of or in addition to sampling the plot 910 of the analog metric data that is output from the RF sensor a2.

In one embodiment, both plots 702 and 906 are used to sample the plot 706 of the analog metric data that is output from the RF sensor a2.

Figure 9F:
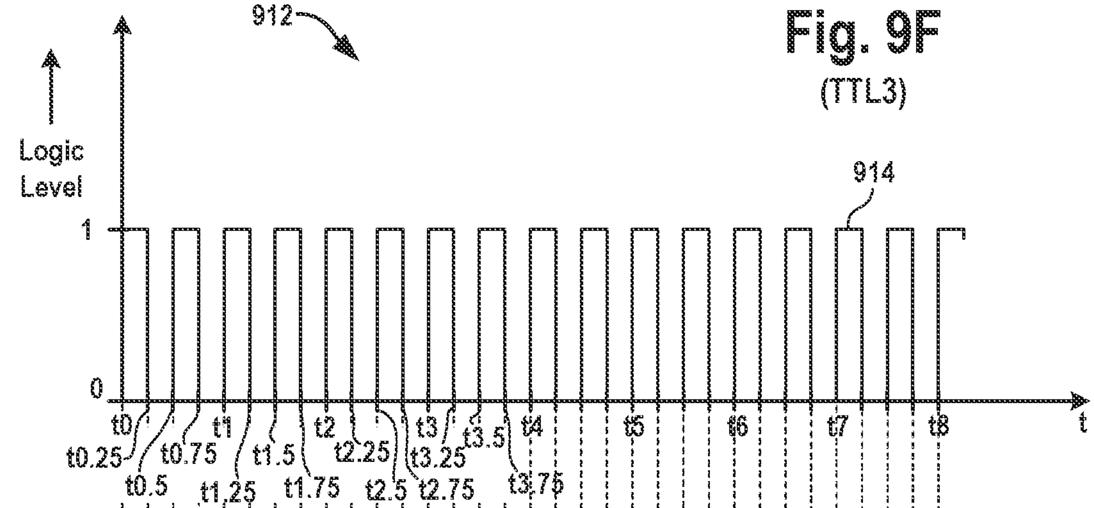
FIG. 9F is an embodiment of a graph to illustrate a plot of a TTL3 signal of FIG. 8.

FIG. 9F is an embodiment of a graph 912 to illustrate a plot 914. The plot 914 is an example of the TTL3 signal (FIG. 8). The graph 912 includes a logic level of the plot 914 on a y-axis and the time t on an x-axis. The plot 914 transitions between the logic level and the logic level 0 in a periodic manner during each cycle of the clock signal. For example, the plot 914 transitions from the logic level 0 to the logic level 1 at the time t0 and remains at the logic level 1 from the time t0 to a time t0.25, which is between the times t0 and t0.5. The plot 914 transitions from the logic level 1 to the logic level 0 at the time t0.25 and remains at the logic level 0 from the time t0.25 to the time t0.5. The plot 914 transitions from the logic level 0 to the logic level 1 at the time t0.5 and remains at the logic level 1 from the time t0.5 to the time t0.75. The plot 914 further transitions from the logic level 1 to the logic level 0 at the time t0.75 and remains at the logic level 0 from the time t0.75 to the time t1. The plot 914 transitions from the logic level 0 to the logic level 1 at the time t1 and remains at the logic level 1 from the time t1 to a time t1.25, which is between the times t1 and t1.5. The plot 914 further transitions from the logic level 1 to the logic level 0 at the time t1.25 and remains at the logic level 0 from the time t1.25 to the time t1.5. The plot 914 transitions from the logic level 0 to the logic level 1 at the time t1.5 and remains at the logic level 1 from the time t1.5 to a time t1.75, which is between the times t1.5 and t2. The plot 914 further transitions from the logic level 1 to the logic level 0 at the time t1.75 and remains at the logic level 0 from the time t1.75 to the time t2.

In the example, the plot 914 transitions from the logic level 0 to the logic level 1 at the time t2 and remains at the logic level 1 from the time t2 to a time t2.25, which is between the times t2 and t2.5. The time t2.25 is at a quarter of a time interval between the times t2 and t3. The plot 914 transitions from the logic level 1 to the logic level 0 at the time t2.25 and remains at the logic level 0 from the time t2.25 to the time t2.5. The plot 914 transitions from the logic level 0 to the logic level 1 at the time t2.5 and remains at the logic level 1 from the time t2.5 to the time t2.75. The plot 914 further transitions from the logic level 1 to the logic level 0 at the time t2.75 and remains at the logic level 0 from the time t2.75 to the time t3. The plot 914 transitions from the logic level 0 to the logic level 1 at the time t3 and remains at the logic level 1 from the time t3 to a time t3.25, which is between the times t3 and t3.5. The plot 914 further transitions from the logic level 1 to the logic level 0 at the time t3.25 and remains at the logic level 0 from the time t3.25 to the time t3.5. The plot 914 transitions from the logic level 0 to the logic level 1 at the time t3.5 and remains at the logic level 1 from the time t3.5 to a time t3.75, which is between the times t3.5 and t4. The plot 914 further transitions from the logic level 1 to the logic level 0 at the time t3.75 and remains at the logic level 0 from the time t3.75 to the time t4. In this manner, the plot 914 transitions among the logic levels 1 and 0 during the cycle 2 of the clock signal. It should be noted that a frequency of transitions between the logic levels 1 and 0 of the plot 914 is greater than a frequency of transitions between the logic levels 1 and 0 of the plot 906 (FIG. 9D).

Figure 9G:
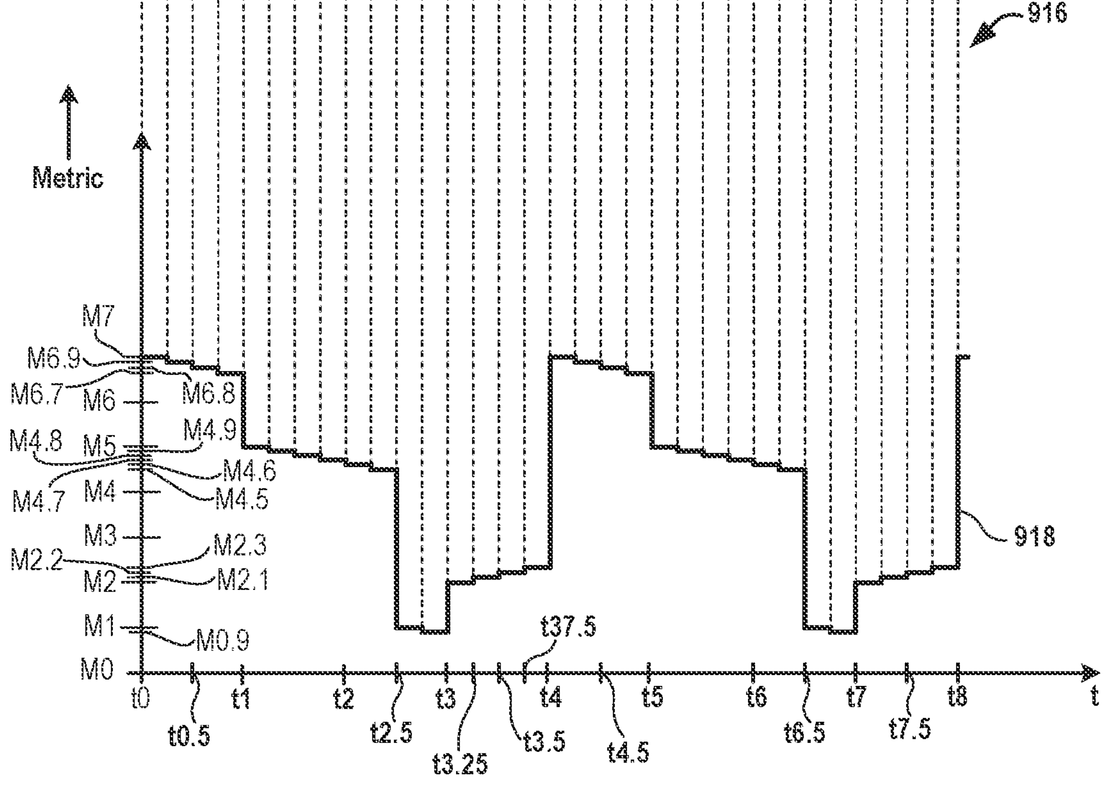
FIG. 9G is an embodiment of a graph to illustrate a plot of metric data of the metric that is output from the third RF sensor.

FIG. 9G is an embodiment of a graph 916 illustrate a plot 918 of metric data, such as analog metric data, of the metric that is output from the RF sensor an (FIG. 8). The graph 916 includes metric levels of the metric data of the plot 918 on a y-axis and the time t on an x-axis. The plot 918 transitions among the metric level M7, a metric level M6.9, a metric level M6.8, a metric level M6.7, the metric level M5, a metric level M4.9, a metric level M4.8, a metric level M4.7, a metric level M4.6, a metric level M4.5, the metric level M1, a metric level M0.9, the metric level M2, a metric level M2.1, a metric level M2.2, and the metric level M2.3 in a periodic manner. Each metric level M7, M6.9, M6.8, M6.7, M5, M4.9, M4.8, M4.7, M4.6, M4.5, M1, M0.9, M2, M2.1, M2.2, and M2.3 defines a slice of the plot 918. Each slice of the plot 918 occurs for a time interval of t0.5 units.

It should be noted that the metric level M0.9 is less than the metric level M1 and greater than the metric level M0.5. The metric level 2.1 is greater than the metric level M2 and less than the metric level M2.2. The metric level 2.3 is greater than the metric level M2.2 and less than the metric level M3. Also, the metric level M4.9 is less than the metric level M4.8 and greater than the metric level M4.7. The metric level M4.6 is less than the metric level M4.7 and greater than the metric level M4.5. The metric level M6.9 is less than the metric level M7 and greater than the metric level M6.8. The metric level M6.7 is less than the metric level M6.8 and greater than the metric level M6.

The metric level M7 defines a first slice of a sub-state Sla of the metric measured by the RF sensor an, and the metric level M6.9 defines a second slice of the sub-state S1a. The metric level M6.8 defines a first slice of a sub-state S1b and the metric level M6.7 defines a second slice of a sub-state S1b. The sub-states Sla and S1b of the plot 918 are portions of a state S1 of the plot 918.

Similarly, metric level M5 defines a first slice of a sub-state S2a of the metric measured by the RF sensor an, the metric level M4.9 defines a second slice of the sub-state S2a, and the metric level M4.8 defines a third slice of the sub-state S2a. The metric level M4.7 defines a first slice of a sub-state S2b, the metric level M4.6 defines a second slice of the sub-state S2b, and the metric level M4.5 defines a third slice of a sub-state S2b. The sub-states S2a and S2b of the plot 918 are portions of a state S2 of the plot 918.

Also, metric level M1 defines a first slice of a state S3 of the metric measured by the RF sensor an. The metric level M0.9 defines a second slice of the state S3.

In a similar manner, the metric level M2 defines a first slice of a sub-state S4a of the metric measured by the RF sensor an and a metric level M2.1 defines a second slice of the sub-state S4a. The metric level M2.2 defines a first slice of a sub-state S4b and the metric level M2.3 defines a second slice of the sub-state S4b. The sub-states S4a and S4b of the plot 918 are portions of a state S4 of the plot 918.

During the cycle 1 of the clock signal, the plot 918 transitions from the metric level M2.3 to the metric level M7 at the time t0 and remains at the metric level M7 from the time t0 to the time t0.25. Further, during the cycle 1 of the clock signal, the plot 918 transitions from the metric level M7 to the metric level M6.9 at the time t0.25 and remains at the metric level M6.9 from the time t0.25 to the time t0.5. Also, during the cycle 1 of the clock signal, the plot 918 transitions from the metric level M6.9 to the metric level M6.8 at the time t0.5 and remains at the metric level M6.8 from the time t0.5 to the time t0.75. Further, during the cycle 1 of the clock signal, the plot 918 transitions from the metric level M6.8 to the metric level M6.7 at the time t0.75 and remains at the metric level M6.7 from the time t0.75 to the time t1.

Further, during the cycle 1 of the clock signal, the plot 918 transitions from the metric level M6.7 to the metric level M5 at the time t1 and remains at the metric level M5 from the time t1 to the time t1.25. Further, during the cycle 1 of the clock signal, the plot 918 transitions from the metric level M5 to the metric level M4.9 at the time t1.25 and remains at the metric level M4.9 from the time t1.25 to the time t1.5. During the cycle 1 of the clock signal, the plot 918 transitions from the metric level M4.9 to the metric level M4.8 at the time t1.5 and remains at the metric level M4.8 from the time t1.5 to the time t1.75. Also, during the cycle 1 of the clock signal, the plot 918 transitions from the metric level M4.8 to the metric level M4.7 at the time t1.75 and remains at the metric level M4.7 from the time t1.75 to the time t2.

During the cycle 1 of the clock signal, the plot 918 transitions from the metric level M4.7 to the metric level M4.6 at the time t2 and remains at the metric level M4.6 from the time t2 to the time t2.25. Also, during the cycle 1 of the clock signal, the plot 918 transitions from the metric level M4.6 to the metric level M4.5 at the time t2.25 and remains at the metric level M4.5 from the time t2.25 to the time t2.5.

Further, during the cycle 1 of the clock signal, the plot 918 transitions from the metric level M4.5 to the metric level M1 at the time t2.5 and remains at the metric level M1 from the time t2.5 to the time t2.75. During the cycle 1 of the clock signal, the plot 918 transitions from the metric level M1 to the metric level M0.9 at the time t2.75 and remains at the metric level M0.9 from the time t2.75 to the time t3.

During the cycle 1 of the clock signal, the plot 918 transitions from the metric level M0.9 to the metric level M2 at the time t3 and remains at the metric level M2 from the time t3 to the time t3.25. Further, during the cycle 1 of the clock signal, the plot 918 transitions from the metric level M2 to the metric level M2.1 at the time t3.25 and remains at the metric level M2.1 from the time t3.25 to the time t3.5.

Also, during the cycle 1 of the clock signal, the plot 918 transitions from the metric level M2.1 to the metric level M2.2 at the time t3.5 and remains at the metric level M2.2 from the time t3.5 to the time t3.75. Further, during the cycle 1 of the clock signal, the plot 918 transitions from the metric level M2.2 to the metric level M2.3 at the time t3.75 and remains at the metric level M2.3 from the time t3.75 to the time t4. During the cycle 2 of the clock signal, the plot 918 transitions from the metric level M2.3 to the metric level M7 at the time t4. The metric levels M7, M6.9, M6.8, M6.7, M5, M4.9, M4.8, M4.7, M4.6, M4.5, M1, M0.9, M2, M2.1, M2.2, and M2.3 repeat during the cycle 2 of the clock signal.

The metric data of the plot 918 is sampled by the ADC processor 210 (FIG. 8) in synchronization with the plot 914 (FIG. 7A). For example, the plot 918 is sampled periodically at each rising edge and each falling edge of the plot 914. To illustrate, the analog metric data represented by the plot 918 is converted from the analog form to the digital form at the time t0 during the cycle 1 of the clock signal to sample the metric level M7, at the time t0.25 during the cycle 1 of the clock signal to sample the metric level M6.9, at the time t0.5 during the cycle 1 of the clock signal to sample the metric level M6.8, and at the time t0.75 during the cycle 1 of the clock signal to sample the metric level M6.7.

Also, in the illustration, the analog metric data represented by the plot 918 is converted from the analog form to the digital form at the time t1 during the cycle 1 of the clock signal to sample the metric level M5, at the time t1.25 during the cycle 1 of the clock signal to sample the metric level M4.9, at the time t1.5 during the cycle 1 of the clock signal to sample the metric level M4.8, at the time t1.75 during the cycle 1 of the clock signal to sample the metric level M4.7, at the time t2 during the cycle 1 of the clock signal to sample the metric level M4.6, and at the time t2.25 during the cycle 1 of the clock signal to sample the metric level M4.5.

Further, in the illustration, at the time t1, the analog metric data represented by the plot 918 is converted from the analog form to the digital form at the time t2.5 during the cycle 1 of the clock signal to sample the metric level M1 and at the time t2.75 during the cycle 1 of the clock signal to sample the metric level M0.9. In the illustration, the analog metric data of the plot 918 is converted from the analog form to the digital form at the time t3 during the cycle 1 of the clock signal to sample the metric level M2, at the time t3.25 during the cycle 1 of the clock signal to sample the metric level M2.1, at the time t3.5 during the cycle 1 of the clock signal to sample the metric level M2.2, and at the time t3.75 during the cycle 1 of the clock signal to sample the metric level M2.3.

It should be noted that the plots 702, 906, and 914 provide rates of sampling analog metric data. For example, the plot 914 has a rate that is greater than a rate of the plot 906, and the plot 906 has a rate greater than a rate of the plot 702. To illustrate, the metric data of the plot 706 is sampled at a first frequency when sampled in synchronization with rising and falling edges of the plot 914. In the illustration, the metric data of the plot 706 is sampled at a second frequency when sampled in synchronization with rising and falling edges of the plot 906. Also, in the illustration, the metric data of the plot 706 is sampled at a third frequency when sampled in synchronization with rising and falling edges of the plot 702. The first frequency is greater than the second frequency, which is greater than the third frequency.

In one embodiment, the plot 918 is generated from analog metric data that is measured by any of the RF sensors a1, a2, through a(n−1) and a(n+1) through a(n+m) instead of the RF sensor an.

In one embodiment, the plot 918 transitions from the metric level M2.3 to the metric level M7 at the time t0 during the cycle 0 of the clock signal instead of the cycle 1 of the clock signal. Also, in the embodiment, the plot 918 transitions from the metric level M2.3 to the metric level M7 at the time t4 during the cycle 1 of the clock signal instead of the cycle 2 of the clock signal.

In an embodiment, the plot 706 (FIG. 9C) is sampled in synchronization with the plot 914 in the same manner in which the plot 918 is sampled in synchronization with the plot 914. For example, the plot 706 is sampled at each rising edge and at each falling edge of the plot 914.

In one embodiment, the plot 910 (FIG. 9E) is sampled in synchronization with the plot 914 in the same manner in which the plot 918 is sampled in synchronization with the plot 914. For example, the plot 910 is sampled at each rising edge and at each falling edge of the plot 914.

Figure 10A:
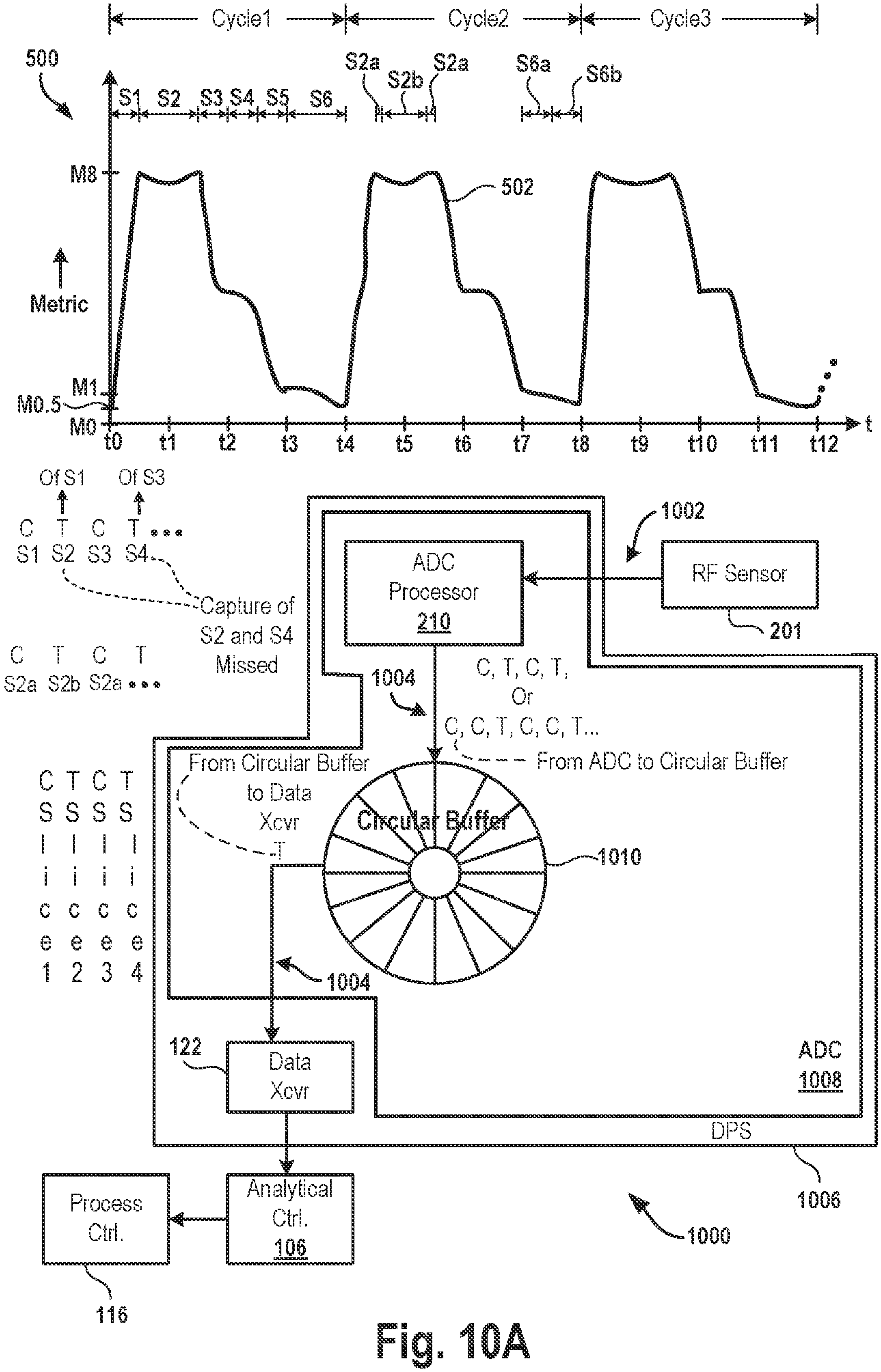
FIG. 10A is a diagram of an embodiment of a system to illustrate capture and transfer of metric data of the metric.

FIG. 10A is a diagram of an embodiment of a system 1000 to illustrate capture and transfer of metric data. The system 1000 includes a DPS 1006, which includes an ADC 1008 and the transceiver 122 of the DPS 102 (FIG. 1A). The ADC 1008 is an example of the ADC 104 (FIG. 1A) and the DPS 1006 is an example of the DPS 102. For example, the memory device 212 (FIG. 2A) of the ADC 104 is the circular buffer 1010. The ADC 1008 includes the ADC processor 210 and a circular buffer 101. The ADC processor 210 is coupled to the circular buffer 101, which is coupled to the data transceiver 122 of the DPS 1006.

Examples of the circular buffer 1010 include a first-in-first-out (FIFO) buffer, a ring buffer, a circular queue, and a cyclic buffer. To illustrate, digital metric data that is written first to the circular buffer 1010 is also read first or deleted first. When the circular buffer 1010 is full, the digital metric data this written first to the circular buffer 1010 is overwritten with digital metric data. The system 100 further includes the analytical controller 106, and the process controller 116. Also illustrated in FIG. 10A is the graph 500.

The ADC processor 210 samples analog metric data 1002 received from the RF sensor 201 to output digital metric data 1004, and sends the digital metric data 1004 to the circular buffer 1010. Examples of the analog metric data 1002 include the analog metric data 202 (FIG. 2A) and the analog metric data 222 (FIGS. 2A and 2B). Examples of the digital metric data 1004 include the digital metric data 204 and the digital metric data 224 (FIGS. 2A and 2B).

As operation of the system 1000 is described with reference to states and sub-states of the graph 500. For example, the ADC processor 210 of the ADC 1008 captures the digital metric data 1004 during a time window for a state to the circular buffer 1010, and the digital metric data 1004 is transferred from the circular buffer 1010 to the processor 124 of the analytical controller 106 during a following time window. An example of capturing the digital metric data 1004 includes converting analog metric data 1002 to the digital metric data 1004 and storing the digital metric data 1004 in the circular buffer 1010. Another example of capturing the digital metric data 1004 includes storing the digital metric data 1004 in the circular buffer 1010. An example of transferring the digital metric data 1004 is reading by the transceiver 122 of the digital metric data 1004 from the circular buffer 1010 and sending the digital metric data 1004 to the transceiver 128 (FIG. 2A) of the analytical controller 106. To illustrate, the transceiver 122 applies the transfer protocol to the digital metric data 1004 to generate one or more data transfer units and sends the data transfer units to the transceiver 128. In the illustration, the transceiver 128 applies the transfer protocol to the data transfer units received to extract the digital metric data 1004 and sends the digital metric data 1004 to the processor 124 of the analytical controller 106. During the following time window for a state in which the digital metric data 1004 is transferred from circular buffer 1010, there is no storage of a following state of the digital metric data 1004 received from the ADC processor 210 into the circular buffer 1010. As an example, the following time window is a time window of the following state. To illustrate, when the digital metric data 1004 is captured during a state S1 of the digital metric data 1004, there is no capture of a state S2 of the digital metric data 1004 during a state S2. The states S1 and S2 occur during the same clock cycle of the clock signal. As another example, the operations described in the preceding example apply to a sub-state or to a slice.

The capture and a transfer of the digital metric data 1004 from the circular buffer 1010 occurs in a consecutive manner. For example, there is no simultaneous capture and transfer of the digital metric data 1004 from the circular buffer 1010. To illustrate, during a first time interval, a first portion of the plot 502 having the state S1 is captured, such as stored, in the circular buffer 1010 by the ADC processor 210. During a second time interval, the first portion is transferred from the circular buffer 1010 to the transceiver 122 of the DPS 1006 for sending to the analytical controller 106 and there is no capture of a second portion of the plot 502 having the state S2. The second time interval is consecutive to the first time interval. There is no other time interval between two consecutive time intervals. In the illustration, during a third time interval, a third portion of the plot 502 having the state S3 is captured in the circular buffer 1010 by the ADC processor 210. In the illustration, the third time interval is consecutive to the second time interval. During a fourth time interval, the third portion is transferred from the circular buffer 1010 to the transceiver 122 of the DPS 1006 for sending to the analytical controller 106 and there is no capture of a fourth portion of the plot 502 having the state S4. In the illustration, the fourth time interval is consecutive to the third time interval.

As another illustration, during a first time interval, a first portion of the plot 502 having the sub-state S2a is captured, such as stored, in the circular buffer 1010 by the ADC processor 210. During a second time interval, the first portion is transferred from the circular buffer 1010 to the transceiver 122 of the DPS 1006 for sending to the analytical controller 106 and there is no capture of a second portion of the plot 502 having the sub-state S2b. In the illustration, the second time interval is consecutive to the first time interval. In the illustration, during a third time interval, a third portion of the plot 502 having the sub-state S2a is captured in the circular buffer 1010 by the ADC processor 210. In the illustration, the third time interval is consecutive to the second time interval.

As another illustration, during a first time interval, a first slice of the plot 502 is captured, such as stored, in the circular buffer 1010 by the ADC processor 210. During a second time interval, the first slice is transferred from the circular buffer 1010 to the transceiver 122 of the DPS 1006 for sending to the analytical controller 106 and there is no capture of a second slice of the plot 502. In the illustration, the second time interval is consecutive to the first time interval. In the illustration, during a third time interval, a third slice of the plot 502 is captured in the circular buffer 1010 by the ADC processor 210. The third time interval is consecutive to the second time interval. During a fourth time interval, the third slice is transferred from the circular buffer 1010 to the transceiver 122 of the DPS 1006 for sending to the analytical controller 106 and there is no capture of a fourth slice of the plot 502. The fourth time interval is consecutive to the third time interval.

As yet another illustration, a capture of a pre-determined number of consecutive states of the digital metric data 1004 or the pre-determined number of consecutive sub-states of the of digital metric data or the pre-determined number of consecutive slices of the digital metric data occurs, and the capture is followed by a transfer of the digital metric data 1004 from the circular buffer 1010 to the transceiver 122. To further illustrate, during a first time interval, a first portion of the plot 502 having the states S1 and S2 is captured, such as stored, in the circular buffer 1010 by the ADC processor 210. During a second time interval, the first portion is transferred from the circular buffer 1010 to the transceiver 122 of the DPS 1006 for sending to the analytical controller 106 and there is no capture of a second portion of the plot 502 having the states S3 and S4. The second time interval is consecutive to the first time interval. There is no other time interval between two consecutive time intervals.

As another further illustration, during a first time interval, a first portion of the plot 502 having first and second sub-states is captured, such as stored, in the circular buffer 1010 by the ADC processor 210. During a second time interval, the first portion is transferred from the circular buffer 1010 to the transceiver 122 of the DPS 1006 for sending to the analytical controller 106 and there is no capture of a second portion of the plot 502 having the states S3 and S4. The second portion of the plot 502 has third and fourth sub-states. The second time interval is consecutive to the first time interval. There is no other time interval between two consecutive time intervals.

As yet another further illustration, during a first time interval, a first portion of the plot 502 having a first slice and a second slice is captured, such as stored, in the circular buffer 1010 by the ADC processor 210. During a second time interval, the first portion is transferred from the circular buffer 1010 to the transceiver 122 of the DPS 1006 for sending to the analytical controller 106 and there is no capture of a second portion of the plot 502 having the states S3 and S4. The second portion of the plot 502 has third and fourth slices. The second time interval is consecutive to the first time interval. There is no other time interval between two consecutive time intervals.

Figure 10B:
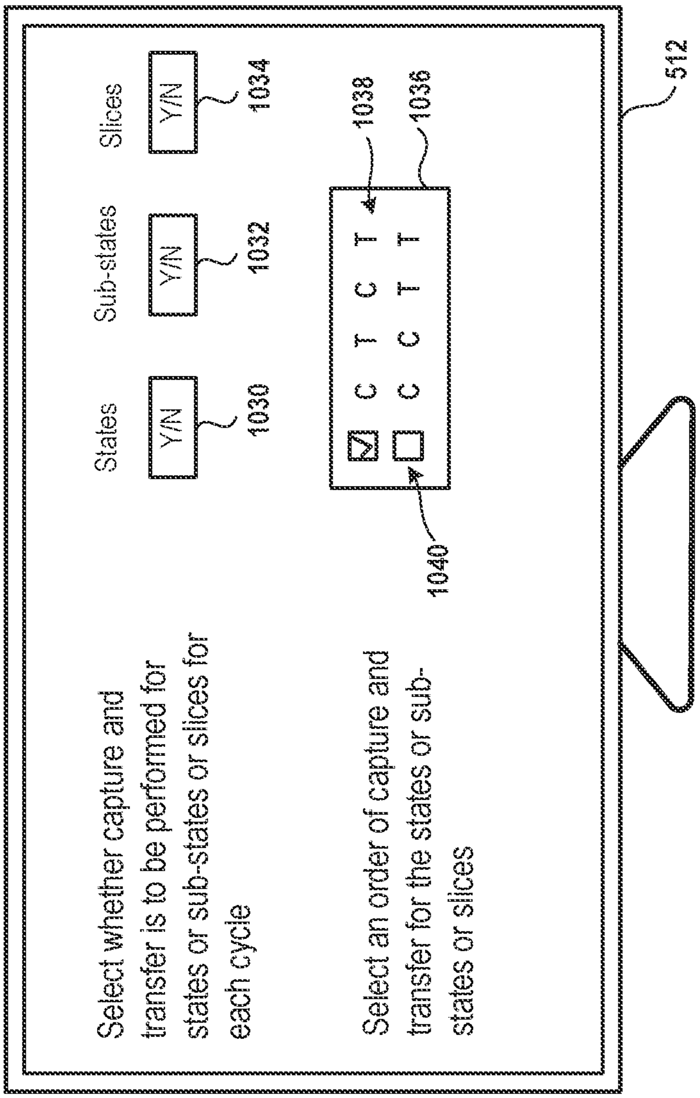
FIG. 10B is a diagram of an embodiment of the monitor to illustrate reception of instructions from a user for capture and transfer of digital metric data of FIG. 10A.

FIG. 10B is a diagram of an embodiment of the monitor 512 to illustrate reception of instructions from the user for capture and transfer of the digital metric data 1004 (FIG. 10A). The GPU of the monitor 512 displays a field 1030 for receiving an indication whether a capture and transfer of the digital metric data 1004 is to occur with reference to multiple states of the digital metric data 1004. For example, the user uses the mouse 516 or the keyboard 514 (FIG. 5B) to provide the indication to the computer processor located within the monitor 512. The GPU of the monitor 512 also displays a field 1032 for receiving an indication whether a capture and transfer of the digital metric data 1004 is to occur with reference to multiple sub-states of the digital metric data 1004. For example, the user uses the mouse 516 or the keyboard 514 (FIG. 5B) to provide the indication to the computer processor located within the monitor 512. Also, the GPU of the monitor 512 also displays a field 1032 for receiving an indication whether a capture and transfer of the digital metric data 1004 is to occur with reference to multiple slices of the digital metric data 1004. For example, the user uses the mouse 516 or the keyboard 514 (FIG. 5B) to provide the indication to the computer processor located within the monitor 512.

The GPU of the monitor 512 further displays a field 1036 for receiving an order in which capture and transfer of states or sub-states or slices of the digital metric data 1004 is to occur. For example, the field 1036 includes a first order 1038 and a second order 1040 in which states or sub-states or slices of the digital metric data 1004 are to be captured and transferred. For example, when an indication of a selection of the first order 1038 is received from the mouse 516 or the keyboard 514 or a combination thereof, a portion of the digital metric data 1004 is captured during a first time interval in the circular buffer 1010 and is transferred during a second time interval to the transceiver 122 (FIG. 10A). In the example, a second portion of the digital metric data 1004 cannot be captured during the second time interval. The second time interval is consecutive to the first time interval. As an illustration, the first time interval is a time window of a first state of the digital metric data 1004 and the second time interval is a time window of a second state of the digital metric data 1004. As another illustration, the first time interval is a time window of a first sub-state of the digital metric data 1004 and the second time interval is a time window of a second sub-state of the digital metric data 1004. As yet another illustration, the first time interval is a time window of a first slice of the digital metric data 1004 and the second time interval is a time window of a second slice of the digital metric data 1004.

As another example, when an indication of a selection of the second order 1040 is received from the mouse 516 or the keyboard 514 or a combination thereof, a first portion of the digital metric data 1004 is captured during a first time interval and a second time interval in the circular buffer 1010 and is transferred during a third time interval and a fourth time interval to the transceiver 122 (FIG. 10A). In the example, a second portion of the digital metric data 1004 cannot be captured during the third and fourth time intervals. The second time interval is consecutive to the first time interval. Also, the third time interval is consecutive to the second time interval and the fourth time interval is consecutive to the third time interval. As an illustration, the first time interval is a time window of a first state of the digital metric data 1004, the second time interval is a time window of a second state of the digital metric data 1004, the third time interval is a time window of a third state of the digital metric data 1004, and the fourth time interval is a time window of a fourth state of the digital metric data 1004. As another illustration, the first time interval is a time window of a first sub-state of the digital metric data 1004, the second time interval is a time window of a second sub-state of the digital metric data 1004, the third time interval is a time window of a third sub-state of the digital metric data 1004, and the fourth time interval is a time window of a fourth sub-state of the digital metric data 1004. As yet another illustration, the first time interval is a time window of a first slice of the digital metric data 1004, the second time interval is a time window of a second slice of the digital metric data 1004, the third time interval is a time window of a third slice of the digital metric data 1004, and the fourth time interval is a time window of a fourth slice of the digital metric data 1004.

Figure 11A:
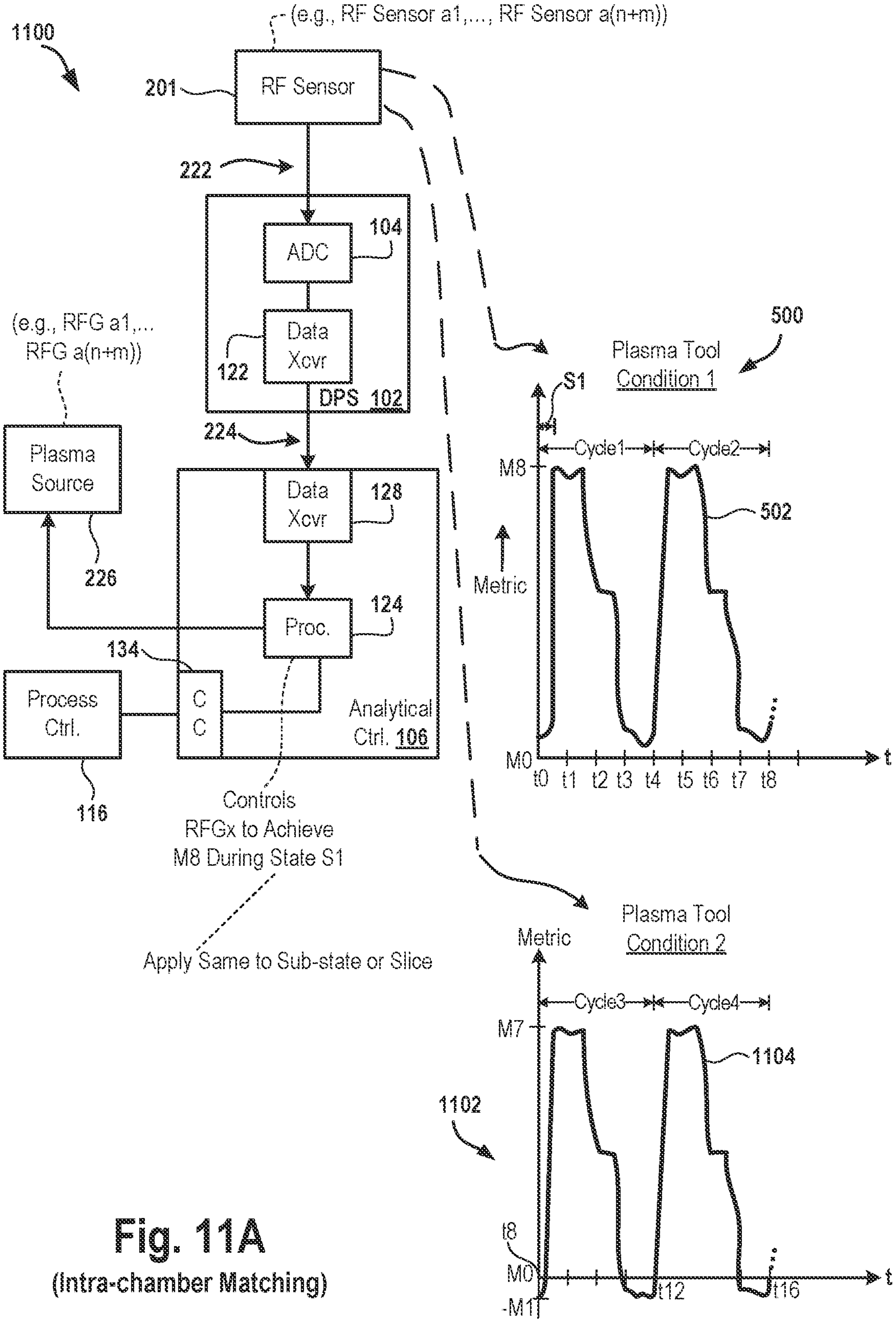
FIG. 11A is a diagram of an embodiment of a system to illustrate intra-chamber matching.

FIG. 11A is a diagram of an embodiment of a system 1100 to illustrate intra-chamber, such as within chamber, matching. The system 1100 includes the RF sensor 201, the DPS 102, the analytical controller 106, the process controller 116, and the plasma source 226.

An operation of the system 1100 is described with respect to the graph 500 and a graph 1102. The graph 500 plots metric data of the metric when a plasma system that includes the plasma source 226 is in a first condition, such as a condition 1. Examples of the plasma system that includes the plasma source 226 include the plasma system 100 (FIG. 1A) and the plasma system 150 (FIG. 1B).

The metric data from which the plot 502 is generated is measured by the RF sensor 201 during a first time period in which the plasma system has the condition 1. The graph 1102 plots metric data of the metric when the plasma system that includes the plasma source 226 is in a second condition, such as a condition 2. The graph 1102 includes a plot 1104 of metric data versus the time t. Analog metric data based on which the plot 1104 is generated is measured by the RF sensor 201 during a second time period in which the same plasma system has the condition 2. The second time period occurs after the first time period and is equal to the first time period. For example, the second time period extends from the time t8 to a time t16. A time period between the times t8 and t16 spans the cycle 3 and a cycle 4 of the clock signal. As such, the condition 2 occurs after an occurrence of the condition 1. The cycle 4 is consecutive to the cycle 3.

The plot 1104 is similar to the plot 502 except each metric value of the plot 1104 is lower by M1 compared to a corresponding metric value of the plot 502. For example, at a first time at which the plot 502 has the metric value M8, the plot 1104 has the metric value M7. As another example, at a second time at which the plot 502 has the metric value M1, the plot 1104 has the metric value M0. As an example, the metric value M0 is not zero but is a positive metric value. In the example, a metric value, such as a metric value-M1, which is lower than the metric value M0, is a positive metric value. As another example, the plot 1104 has the same states and sub-states and slices as the plot 502. To illustrate, when the plot 502 has the state S2 having the metric value M8, the plot 1104 has the state S2 having the metric value M7. As another illustration, when a metric value of a state S1 of the metric data of the plot 502 is M8, a metric value of a state S1 of the metric data of the plot 1104 is M7. As another illustration, when the plot 502 has the sub-state S2a having the metric value M8, the plot 1104 has the sub-state S2a having the metric value M7. As yet another illustration, when the plot 502 has a first slice of the sub-state S2a and the first slice of the plot 502 has the metric value M8, the plot 1104 has a sub-state S2a having the metric value M7 and a first slice of the sub-state S2a of the plot 1104 has the metric value M7.

The processor 132 compares the metric data of the plot 1104 with the metric data of the plot 502. For example, the processor 132 compares a state of the metric data of the plot 1104 with the same state of the metric data of the plot 502. As another example, the processor 132 compares a sub-state of a state of the metric data of the plot 1104 with the same sub-state of the same state of the metric data of the plot 502. As yet another example, the processor 132 compares a slice of a sub-state of a state of the metric data of the plot 1104 with the same slice of the same sub-state of the same state of the metric data of the plot 502.

The processor 132 determines, based on the comparison, where there is discrepancy between the metric data of the plot 1104 and the metric data of the plot 502. For example, the processor 132 determines whether the metric data of the plot 1104 is less than or greater than the metric data of the plot 502 by at least a pre-set amount. For example, the processor 132 determines whether a state of the metric data of the plot 1104 is greater than or less than the same state of the metric data of the plot 502 by at least the pre-set amount. As another example, the processor 132 determines whether a sub-state of a state of the metric data of the plot 1104 is greater than or less than the same sub-state of the same state of the metric data of the plot 502 by at least the pre-set amount. As yet another example, the processor 132 determines whether a slice of a sub-state of a state of the metric data of the plot 1104 is greater than or less than the same slice of the same sub-state of the same state of the metric data of the plot 502 by at least the pre-set amount.

Upon determining that the discrepancy exists between the metric data 1104 and 502, the processor 132 generates an instruction to control, such as increase or decrease, the variable when the plasma system is in the condition 2. The process controller 116 sends the instruction to the analytical controller 106. Upon receiving the instruction, the processor 124 of the analytical controller 106 controls the plasma source 226 of the plasma system in the condition 2 based on the instruction until the discrepancy between the metric data of the plot 1104 and the metric data of the plot 502 is reduced or eliminated. For example, the processor 124 controls the plasma source 226 of the plasma system in the condition 2 based on the instruction until the metric data of the plot 1104 for the state S1 changes from M7 to M8.

In one embodiment, the intra-chamber matching applies to a sub-state or a slice. For example, instead of controlling the plasma source 226 until a metric value of the state S1 of the plot 502 is within the pre-set range from the metric value M8 of the plot 502, the variable of the plasma source 226 is controlled until a first metric value of the sub-state S2a of the state S2 of the plot 1104 is within a pre-determined range from a second metric value of the same sub-state S2a of the plot 502. In this example, the first metric value is sampled by the ADC processor 210 (FIG. 2A) when the plasma system that includes the plasma source 226 is in the condition 2 and the second metric value is sampled by the ADC processor 210 when the plasma system that includes the plasma source 226 is in the condition 1. As another example, instead of controlling the plasma source 226 until a metric value of the state S1 of the plot 502 is within the pre-set range from the metric value M8 of the plot 502, the plasma source 226 is controlled until a first metric value of a first slice of the state S2 of the plot 1104 is within a pre-stored range from a second metric value of the first slice of the state S2 of the plot 502. In this example, the first metric value is sampled by the ADC processor 210 when the plasma system is in the condition 2 and the second metric value is sampled by the ADC processor 210 when the plasma system is in the condition 1.

In an embodiment, the intra-chamber matching described with reference to FIG. 11A is executed by the processor 124 of the analytical controller 106 instead of by the processor 132.

Figure 11B:
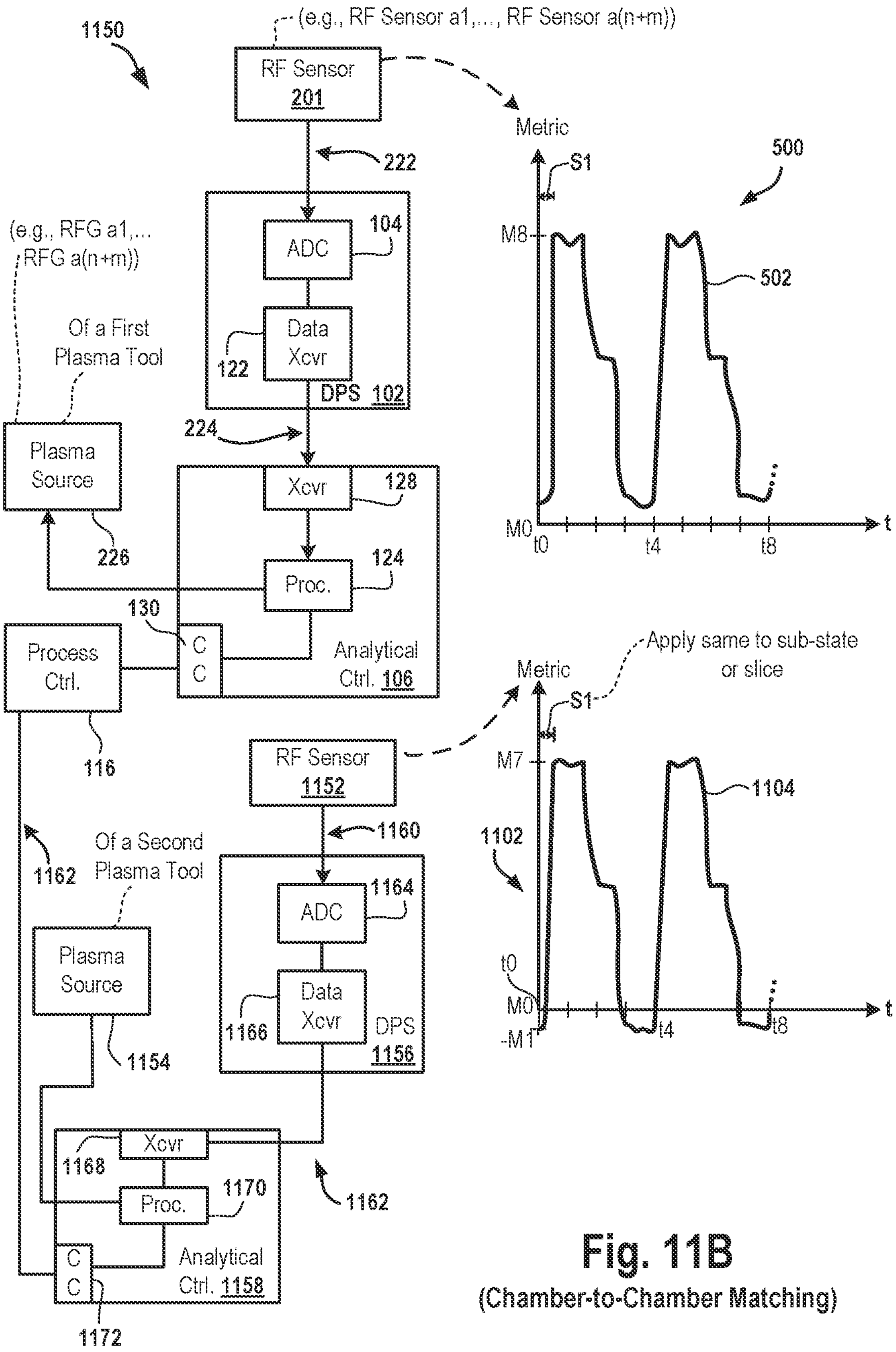
FIG. 11B is a diagram of an embodiment of a system to illustrate inter-chamber matching.

FIG. 11B is a diagram of an embodiment of a system 1150 to illustrate inter-chamber, such as chamber-to-chamber, matching. The system 1150 includes the RF sensor 201, the DPS 102, the analytical controller 106, an RF sensor 1152, a DPS 1156, an analytical controller 1158, a plasma source 1154, and the process controller 116. An operation of the system 1150 is described with respect to the graphs 500 and 1102. Examples of the plasma source 1154 include an RF generator and a matchless plasma source.

The DPS 1156 includes an ADC 1164 and a data transceiver 1166. As an example, the ADC 1164 is similar in structure and function to the ADC 104 and the data transceiver 1166 is similar in structure and function to the data transceiver 128.

The analytical controller 1158 includes a transceiver 1168, a processor 1170, and a communication controller 1172. As an example, the transceiver 1168 is similar in structure and function to the transceiver 122, the processor 1170 is similar in structure and function to the processor 124, and the communication controller 1172 is similar in structure and function to the communication controller 130.

The RF sensor 201 measures the analog metric data 222 of an RF signal that is transferred, such as supplied or reflected, via a component of the first plasma system and sends the analog metric data 222 to the DPS 102. The ADC processor 210 of the ADC 104 samples the analog metric data 222 to output the digital metric data 224 and provides the digital metric data 224 to the transceiver 122. For example, the analog metric data 222 is sampled at a location for a state of the metric data of the plot 502 to output the digital metric data 224. As another example, the analog metric data 222 is sampled at a location for a sub-state of the metric data of the plot 502 to output the digital metric data 224. As yet another example, the analog metric data 222 is sampled at a location for a slice of the metric data of the plot 502 to output the digital metric data 224. The transceiver 122 applies the transfer protocol to the digital metric data 224 to generate data transfer units and sends the data transfer units to the transceiver 128.

The transceiver 128 applies the transfer protocol to the data transfer units received from the transceiver 122 to extract the digital metric data 224 from the data transfer units and provides the digital metric data 224 to the processor 124 of the analytical controller 106. The processor 124 sends the digital metric data 224 to the communication controller 130. The communication controller 130 applies the network communication protocol to the digital metric data 224 to generate one or more data packets and sends the data packets to the communication controller 136 (FIG. 2B) of the process controller 116. Upon receiving the one or more data packets, the communication controller 136 applies the network communication protocol to extract the digital metric data 224 and provides the digital metric data 224 to the processor 132 of the process controller 116. The processor 132 generates a portion of the plot 502 by connecting sample points, such as metric data or metric values or sample data or sample values, of the digital metric data 224. An example of the portion of the plot 502 is a state of the plot 502, or a sub-state of the plot 502, or a slice of the plot 502.

Similarly, the RF sensor 1152, the plasma source 1154, the DPS 1156, and the analytical controller 1158 are components of a plasma system that is different from the plasma system that includes the RF sensor 201, the plasma source 226, the DPS 102, and the analytical controller 106. For example, the RF sensor 1152, the plasma source 1154, the DPS 1156, and the analytical controller 1158 are components of a second plasma system and the RF sensor 201, the plasma source 226, the DPS 102, and the analytical controller 106 are components of a first plasma system. An example of the second plasma system is one that is similar to the plasma system 100 or 150 (FIGS. 1A and 1B). The RF sensor 1152 is coupled to a component, such as an RF cable, or an output of the plasma source 1154, or an input of a match system, or an output of the match system, or an RF transmission line, of the second plasma system.

Also, the RF sensor 1152 is coupled to the ADC 1164, which is coupled to the transceiver 1166. The transceiver 1166 is coupled to the transceiver 1168, which is coupled to the processor 1170. The processor 1170 is coupled to the communication controller 1172, which is coupled to the communication controller 136 (FIG. 1B) of the process controller 116. The processor 1170 is also coupled to the plasma source 1154.

The RF sensor 1152 measures analog metric data 1160 of an RF signal that is transferred, such as supplied or reflected, via the component of the second plasma system and sends the analog metric data 1160 to the DPS 1156. An ADC processor of the ADC 1164 samples the analog metric data 1160 to output digital metric data 1162 and provides the digital metric data 1160 to the transceiver 1166. For example, the analog metric data 1160 is sampled at a location for a state of the metric data of the plot 1104 to output the digital metric data 1162. To illustrate, the analog metric data 1160 is sampled at the same location, such as A1, at which the analog metric data 222 is sampled, and for the same time window for which the analog metric data 222 is sampled. As another example, the analog metric data 1160 is sampled at a location for a sub-state of the metric data of the plot 1104 to output the digital metric data 1162. To illustrate, the analog metric data 1160 is sampled at the same location, such as A1, at which the analog metric data 222 is sampled, and for the same time window for which the analog metric data 222 is sampled. In the illustration, the time window extends across a sub-state of a state of the analog metric data 222 and 1160. As yet another example, the analog metric data 1160 is sampled at a location to cover a slice of the metric data of the plot 1104 to further output the digital metric data 1162. To illustrate, the analog metric data 1160 is sampled at the same location, such as A1, at which the analog metric data 222 is sampled, and for the same time window for which the analog metric data 222 is sampled. In the illustration, the time window extends across a slice of a sub-state of a state of the analog metric data 222 and 1160. The transceiver 1166 applies the transfer protocol to the digital metric data 1162 to generate data transfer units and sends the data transfer units to the transceiver 1168.

The transceiver 1168 applies the transfer protocol to the data transfer units received from the transceiver 1166 to extract the digital metric data 1162 from the data transfer units and provides the digital metric data 1162 to the processor 1170 of the analytical controller 1172. The processor 1170 of the analytical controller 1158 sends the digital metric data 1162 to the communication controller 1172. The communication controller 1172 applies the network communication protocol to the digital metric data 1162 to generate one or more data packets and sends the data packets to the communication controller 136 (FIG. 2B) of the process controller 116. Upon receiving the one or more data packets, the communication controller 136 applies the network communication protocol to extract the digital metric data 1162 and provides the digital metric data 1162 to the processor 132 of the process controller 116. The processor 132 generates a portion of the plot 1104 by connecting sample points, such as metric data or metric values or sample data or sample values, of the digital metric data 1162. An example of the portion of the plot 1104 is a state of the plot 1104, or a sub-state of the plot 1104, or a slice of the plot 1104.

The processor 132 of the process controller 116 receives the digital metric data 224 and 1162. The processor 132 compares the digital metric data 1162 starting at a location and covering a time window with the digital metric data 224 starting at the same location and covering the same time window to determine whether there is a discrepancy between the digital metric data 1162 and the digital metric data 224. For example, the processor 132 determines whether the digital metric data 1162 is within a pre-fixed range from the digital metric data 224. To illustrate, the processor 132 determines whether the digital metric data 1162 collected for a state of the metric data 502 is within the pre-fixed range from the same state of the digital metric data 224. As another illustration, the processor 132 determines whether the digital metric data 1162 collected for a sub-state of a state of the metric data 502 is within the pre-fixed range from the same sub-state of the same state of the digital metric data 224. As yet another illustration, the processor 132 determines whether the digital metric data 1162 collected for a slice of a sub-state or a state of the metric data 502 is within the pre-fixed range from the same slice of the same sub-state or the same state of the digital metric data 224.

In response to determining that the digital metric data 1162 for the location and the time window is not within the pre-fixed range from the digital metric data 224 for the same location and the same time window, the processor 132 generates an instruction to control the plasma source 1154 until the digital metric data 1162 is within the pre-fixed range from the digital metric data 224. The instruction includes one or more values of the variable. The process controller 116 sends the instruction to the analytical controller 1158, which controls the plasma source 1154 to achieve the one or more values of the variable. The variable of the plasma source 1154 is controlled until the digital metric data 1162 for the location and the time window is within the pre-fixed range from the digital metric data 224 for the same location and the same time window. For example, the processor 132 controls the plasma source 1154 via the analytical controller 1158 to increase or decrease an amount of power that is output from the plasma source 1154 until the metric value M7 of the state S1 of the plot 1104 is within the pre-fixed range from, such as matches, the metric value M8 of the plot 502. When the digital metric data 1162 is within the pre-fixed range from the digital metric data 224, the discrepancy between the digital metric data 1162 and the digital metric data 224 is reduced or eliminated.

It should be noted that the same clock signal that is used to convert the analog metric data 222 from the analog form to the digital form is used to convert the analog metric data 1160 from the analog form to the digital form. For example, the processor 132 of the process controller 116 generates and supplies the clock signal to the ADCs 104 and 1164. The ADC 104 samples the digital metric data 224 during each clock cycle of the clock signal and the ADC 1164 samples the digital metric data 1162 during each clock cycle of the same clock signal.

Figure 12A:
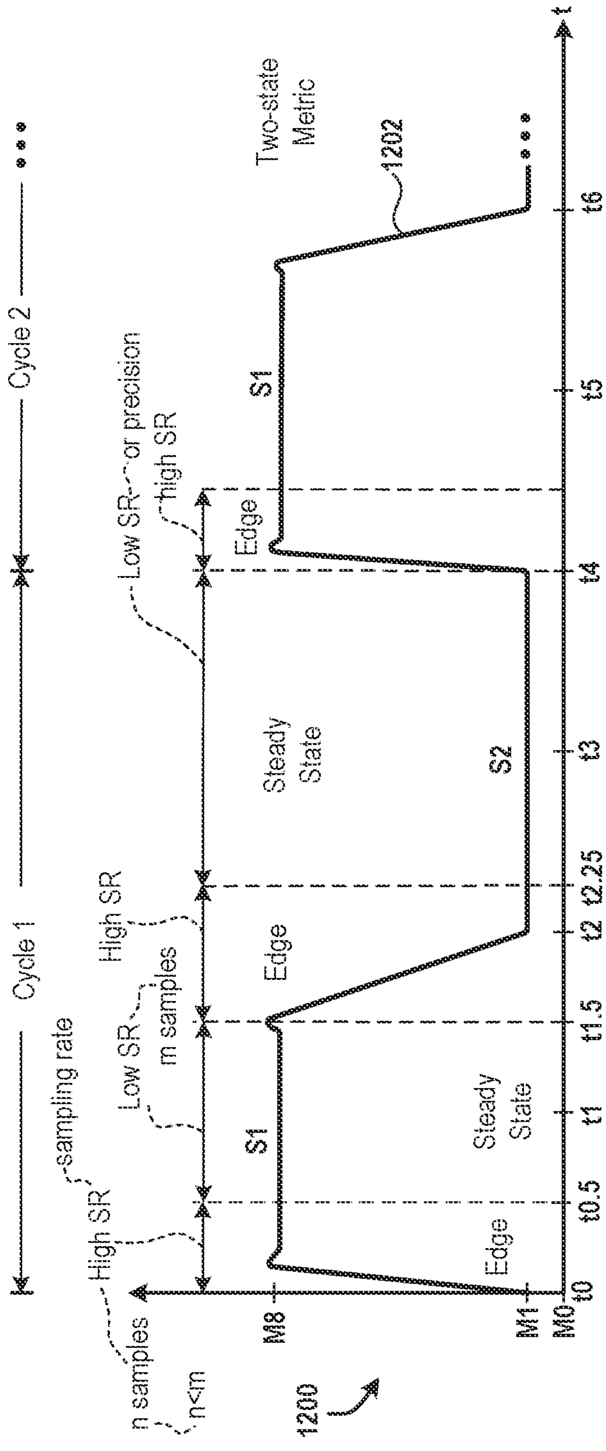
FIG. 12A is an embodiment of a graph to illustrate a different sampling rate by the ADC processor for an edge of two-state metric data of the metric compared to a steady state of the two-state metric data.

FIG. 12A is an embodiment of a graph 1200 to illustrate a different sampling rate by the ADC processor 210 (FIG. 2A) for an edge, such as a transition, of two-state metric data of the metric compared to a steady state of the metric data. The graph 1200 includes a plot 1202 of analog metric data that is sampled by the ADC processor 210 versus the time t. The plot 1202 is an example of the analog metric data 202 (FIG. 2A). The metric of the graph 1200 is plotted on a y-axis and the time t is plotted on an x-axis.

During the cycle 1 of the clock signal, the plot 1202 includes a rising edge of the metric data between the times t0 and t0.5, a first instance of a steady state of the metric data between the times t0.5 and t1.5, and a falling edge between the time t1.5 and a time t2.25. A rising edge is sometimes referred to herein as a rise transition and defines a transition state. Similarly, a falling edge is sometimes referred to herein as a fall transition and defines a transition state. Also, during the cycle 1 of the clock signal, the plot 1202 includes a second instance of a steady state of metric data between the times t2.25 and t4. During the cycle 2 of the clock signal, a rising edge, a first instance of a steady state, a falling edge, and a second instance of the steady state occur in a similar manner, such as in the same manner, as that during the cycle 1 of the clock signal. During each cycle of the clock signal, rising and falling edges and two instances of the steady state of the metric data of the plot 1202 repeat.

During each cycle of the clock signal, the ADC processor 210 samples the rising edge of the metric data of the plot 1202 with a greater precision, such as a higher sampling rate or a greater frequency, compared to a lower precision in sampling the first instance or the second instance of the steady state. For example, during the time interval between the times t0 and t0.5, the metric data, such as the analog metric data 202, represented by the plot 1202 is sampled at a first sampling rate to output the digital metric data 224. The first sampling rate is greater than a second sampling rate for sampling the metric data of the plot 1202 during the time interval between the times t0.5 and t1.5. To illustrate, the ADC processor 210 determines whether a rate of increase in a value of the metric data of the plot 1202 between a first time and a second time exceeds a pre-set rate. The second time is within a pre-set time limit from the first time and occurs after the first time. Upon determining that the rate of increase exceeds the pre-set rate, the ADC processor 210 determines to sample the metric data, such as the analog metric data 202, represented by the plot 1202 between the first and second times with the greater precision, such as the first sampling rate. On the other hand, upon determining that the rate of increase does not exceed the pre-set rate, the ADC processor 210 determines to sample the first instance or the second instance of the steady state of the plot 1202 with the lower precision, such as the second sampling rate. As another illustration, the ADC processor 210 determines whether the metric data of the plot 1202 from the time t0 to the time t1.5 lies within a pre-determined range, such as the metric level M8 or a range from a first pre-set metric level to a second pre-set metric level. The first pre-set metric level is a pre-set percentage, such as 1 or 2 percent, lower than the metric level M8 and the second pre-set metric level is the pre-set percentage above the metric level M8. Upon determining that the metric data of the plot 1202 between the times t0 and t0.5 does not lie within or lies outside the pre-determined range, the ADC processor 210 determines to sample the metric data of the plot 1202 from the time t0 to the time t0.5 at the first sampling rate. The time t0 is an example of a location. In the illustration, the ADC processor 210 determines whether the metric data of the plot 1202 from the time t0.5 to the time t1.5 lies within the pre-determined range. Also, upon determining that the metric data of the plot 1202 between the times t0.5 and t1.5 lies within the pre-determined range, the ADC processor 210 determines to sample the metric data of the plot 1202 from the time t0.5 to the time t1.5 at the second sampling rate. The time t0.5 is an example of a location.

As another example, during each cycle of the clock signal, a processor, such as the processor 124 or the processor 132, determines whether to sample the metric data, such as the analog metric data 202, represented by the plot 1202 at the first sampling rate or the second sampling rate, and controls the ADC processor 210 to sample the metric data at the first sampling rate or the second sampling rate to output the digital metric data 204. To illustrate, the processor determines whether a rate of increase in a value of the metric data, such as the digital metric data 204, represented by the plot 1202 between the first time and the second time exceeds the pre-set rate. Upon determining that the rate of increase exceeds the pre-set rate, the processor generates an instruction and sends the instruction to the ADC 210 to sample the metric data, such as the analog metric data 222, represented by the plot 1202 between the first and second times with the greater precision, such as the first sampling rate. On the other hand, upon determining that the rate of increase does not exceed the pre-set rate, the processor generates an instruction and sends the instruction to the ADC 210 to sample the metric data, such as the analog metric data 222, of the first or second instance of the steady state of the plot 1202 with the lower precision, such as the second sampling rate. In the illustration, when the processor is the processor 132, the processor 132 sends the instruction via the analytical controller 106 to the ADC processor 210. As another illustration, the processor determines whether the metric data of the plot 1202 from the time t0 to the time t1.5 lies within the pre-determined range. Upon determining that the metric data of the plot 1202 between the times t0.5 and t1.5 lies within the pre-determined range, the processor determines that the metric data of the plot 1202 from the time t0.5 to the time t1.5 is to be sampled at the second sampling rate, and sends the instruction to ADC processor 210 to sample the metric data at the second sampling rate. Also, in response to determining that the metric data of the plot 1202 between the times t0 and t0.5 lies outside the pre-determined range, the processor determines that the metric data of the plot 1202 from the time t0 to the time t0.5 is to be sampled at the first sampling rate, and sends the instruction to ADC processor 210 to sample the metric data at the first sampling rate.

Moreover, during each cycle of the clock signal, the ADC processor 210 samples the falling edge of the metric data of the plot 1202 with a greater precision compared to that of the first instance or the second instance of the steady state. For example, during the time interval between the times t1.5 and t2.25, the metric data, such as the analog metric data 202, represented by the plot 1202 is sampled at the first sampling rate to output the digital metric data 204. To illustrate, the ADC processor 210 determines whether a rate of decrease in a value of the metric data, such as the digital metric data 204, between a first time and a second time exceeds a pre-set rate. The second time is within a pre-set time limit from the first time and occurs after the first time. Upon determining that the rate of decrease exceeds the pre-set rate, the ADC processor 210 determines to sample the metric data of the plot 1202 between the first and second times with the greater precision, such as the first sampling rate. On the other hand, upon determining that the rate of decrease does not exceed the pre-set rate, the ADC processor 210 determines to sample the first instance or the second instance of the steady state of the plot 1202 with the lower precision, such as the second sampling rate. As another illustration, the ADC processor 210 determines whether the metric data of the plot 1202 from the time t1.5 to the time t2.25 lies within the pre-determined range. Upon determining that the metric data of the plot 1202 between the times t1.5 and t2.25 does not lie within the pre-determined range, the ADC processor 210 determines to sample the metric data of the plot 1202 from the time t1.5 to the time t2.25 at the first sampling rate. As yet another illustration, the ADC processor 210 determines whether the metric data of the plot 1202 from the time t1.5 to the time t2.25 lies within a pre-arranged range, such as M1 or a range from a first pre-arranged metric level to a second pre-arranged metric level. The first pre-arranged metric level is a pre-arranged percentage, such as 1 or 2 percent, lower than the metric level M2 and the second pre-arranged metric level is the pre-arranged percentage above the metric level M2. Upon determining that the metric data of the plot 1202 between the times t1.5 and t2.25 does not lie within the pre-arranged range, the ADC processor 210 determines to sample the metric data of the plot 1202 from the time t1.5 to the time t2.25 at the first sampling rate.

As another example, during each cycle of the clock signal, a processor, such as the processor 124 or the processor 132, controls the ADC processor 210 to sample the metric data of the falling edge of the plot 1202 at the first sampling rate to output the digital metric data 224. To illustrate, the processor determines whether a rate of decrease in a value of the metric data of the plot 1202 between a first time and a second time exceeds a pre-set rate. The second time is within a pre-set time limit from the first time and occurs after the first time. Upon determining that the rate of decrease exceeds the pre-set rate, the processor generates an instruction and sends the instruction to the ADC 210 to sample the metric data, such as the analog metric data 202, represented by the plot 1202 between the first and second times with the greater precision, such as the first sampling rate. On the other hand, upon determining that the rate of decrease does not exceed the pre-set rate, the processor generates an instruction and sends the instruction to the ADC 210 to sample the metric data, such as the analog metric data 222, of the first or second instance of the steady state of the plot 1202 with the lower precision, such as the second sampling rate. In the illustration, when the processor is the processor 132, the processor 132 sends the instruction via the analytical controller 106 to the ADC processor 210. As another illustration, the processor determines whether the metric data of the plot 1202 from the time t1.5 to the time t2.25 lies within the pre-determined range. Upon determining that the metric data of the plot 1202 between the times t1.5 and t2.25 does not lie within the pre-determined range, the processor controls the ADC processor 210 to sample the metric data of the plot 1202 from the time t1.5 to the time t2.25 at the first sampling rate.

It should be noted that the metric data of the plot 1202 illustrates a two-state signal. For example, the first instance of the steady state during each cycle of the clock signal has a state S1. To illustrate, during the state S1, a metric level of the plot 1202 is within the pre-determined range, such as a within a pre-set standard deviation, from the metric level M8. As another example, the second instance of the steady state during each cycle of the clock signal has a state S2. To illustrate, during the state S2, a metric level of the plot 1202 is within a pre-determined range, such as a within a pre-set standard deviation, from the metric level M1. As another example, each transition between two consecutive steady states, such as the state S1 and the state S2, represented by the plot 1202 does not have a single metric level. Rather, in the example, metric values of the transition fall outside standard deviations of the two consecutive steady states. There is no steady state between the two consecutive steady states. To illustrate, metric values of the rise transition between the states S1 and S2 of the plot 1202 are outside a first pre-set standard deviation from the metric level M8 of the state S1 and a second pre-set standard deviation from the metric level M1 of the state S2.

Figure 12B:
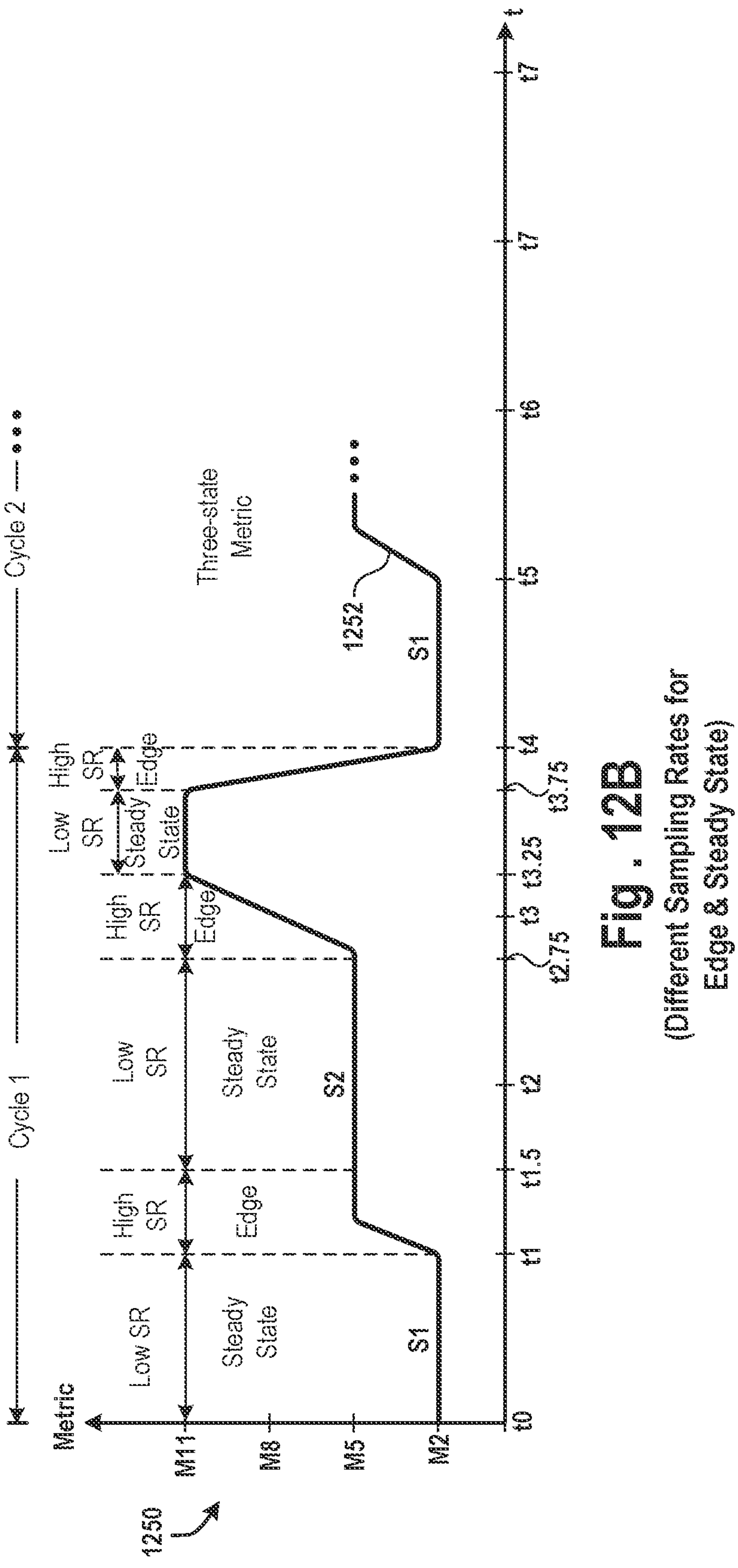
FIG. 12B is an embodiment of a graph to illustrate a different sampling rate by the ADC processor for an edge of three-state metric data of the metric compared to a steady state of the three-state metric data.

FIG. 12B is an embodiment of a graph 1250 to illustrate a different sampling rate applied by the ADC processor 210 (FIG. 2A) to sample an edge, such as a rise transition or a fall transition, of three-state metric data of the metric compared to a sampling rate for sampling a steady state of the metric data. The graph 1250 includes a plot 1252 of metric data that is sampled by the ADC processor 210 versus the time t. The plot 1252 is an example of the analog metric data 202 (FIG. 2A). The metric of the graph 1250 is plotted on a y-axis and the time t is plotted on an x-axis.

During the cycle 1 of the clock signal, the plot 1252 includes a first instance of a steady state of the metric data between the times t0 and t1, a first instance of a rising edge of the metric data between the times t1 and t1.5, a second instance of a steady state of the metric data between the time t1.5 and a time t2.75, a second instance of a rising edge of the metric data between the times t2.75 and a time 3.25, and a third instance of a steady state between the time t3.25 and a time t3.75. The time t2.75 is at three quarters of a time interval between the times t2 and t3, the time 3.25 is at one quarter of a time interval between the times t3 and t4, and the time 3.75 is at three quarters of the time interval between the times t3 and t4. Also, during the cycle 1 of the clock signal, the plot 1252 includes a falling edge of the metric data between the times t3.75 and t4. During the cycle 2 of the clock signal, a first instance of a steady state, the first instance of a rising edge, a second instance of a steady state, a second instance of a rising edge, a third instance of a steady state, and a falling edge occur in a similar manner, such as in the same manner, as that during the cycle 1 of the clock signal.

During each cycle of the clock signal, the ADC processor 210 samples the metric data of the plot 1252 with a greater precision, such as a higher sampling rate or a greater frequency, during an instance of a rising edge or a falling edge compared to a precision in sampling an instance of a steady state in the same manner in which the ADC 210 samples the metric data of the plot 1202 (FIG. 12A). For example, during the time interval between the times t1 and t1.5, the metric data, such as the analog metric data 202, represented by the plot 1252 is determined to be sampled and sampled by the ADC processor 210 at the first sampling rate to output the digital metric data 204. The first sampling rate is greater than the second sampling rate for sampling the metric data of the plot 1252 during the time interval between the times t0 and t1. The metric data of the plot 1252 during the time interval between the times t0 and t1 is determined to be sampled and sampled at the second sampling rate by the ADC processor 210. As another example, during each cycle of the clock signal, a processor, such as the processor 124 or the processor 132, controls the ADC processor 210 to sample the metric data between the times t1 and t1.5 of the plot 1252 at the first sampling rate to output the digital metric data 204. The first sampling rate is greater than the second sampling rate for sampling the metric data of the plot 1252 during the time interval between the times t0 and t1. As yet another example, during the time interval between the times t3.75 and t4, the metric data of the plot 1252 is determined to be sampled and sampled at the first sampling rate to output the digital metric data 204. The first sampling rate is greater than the second sampling rate for sampling the metric data of the plot 1252 during the time interval between the times t3.25 and t3.75. The metric data of the plot 1252 during the time interval between the times t3.25 and t3.75 is determined to be sampled and sampled at the second sampling rate by the ADC processor 210. As another example, during each cycle of the clock signal, a processor, such as the processor 124 or the processor 132, controls the ADC processor 210 to sample the metric data, such as the analog metric data 202, between the times t3.75 and t4 of the plot 1252 at the first sampling rate to output the digital metric data 204. The first sampling rate is greater than the second sampling rate for sampling the metric data of the plot 1252 during the time interval between the times t3.25 and t3.75.

It should be noted that the metric data of the plot 1252 illustrates a three-state signal. For example, the first instance of the steady state during each cycle of the clock signal has a state S1. To illustrate, during the state S1, a metric level of the plot 1252 is within a pre-determined range, such as a within a pre-set standard deviation, from the metric level M2. As another example, the second instance of the steady state during each cycle of the clock signal has a state S2. To illustrate, during the state S2, a metric level of the plot 1252 is within a pre-determined range, such as a within a pre-set standard deviation, from the metric level M5. As yet another example, the third instance of the steady state during each cycle of the clock signal has a state S3. To illustrate, during the state S3, a metric level of the plot 1252 is within a pre-determined range, such as a within a pre-set standard deviation, from a metric level M11. The metric level M11 is greater than the metric level M8. As another example, each transition between two consecutive steady states, such as the state S1 and the state S2 or the state S2 and the state S3, represented by the plot 1252 does not have a single metric level. Rather, in the example, metric values of the transition fall outside standard deviations of the two consecutive steady states. There is no steady state between the two consecutive steady states. To illustrate, metric values of the rise transition between the states S1 and S2 of the plot 1252 are outside a first pre-set standard deviation from the metric level M2 of the state S1 and a second pre-set standard deviation from the metric level M5 of the state S2.

It should be noted that although some of the embodiments herein describe that a processor In one embodiment, instead of a rise transition occurring between the states S2 and S3 of the plot 1252, a fall transition occurs. In the embodiment, the state S3 has a lower metric level compared to the metric level M5 of the state S2.

Figure 13:
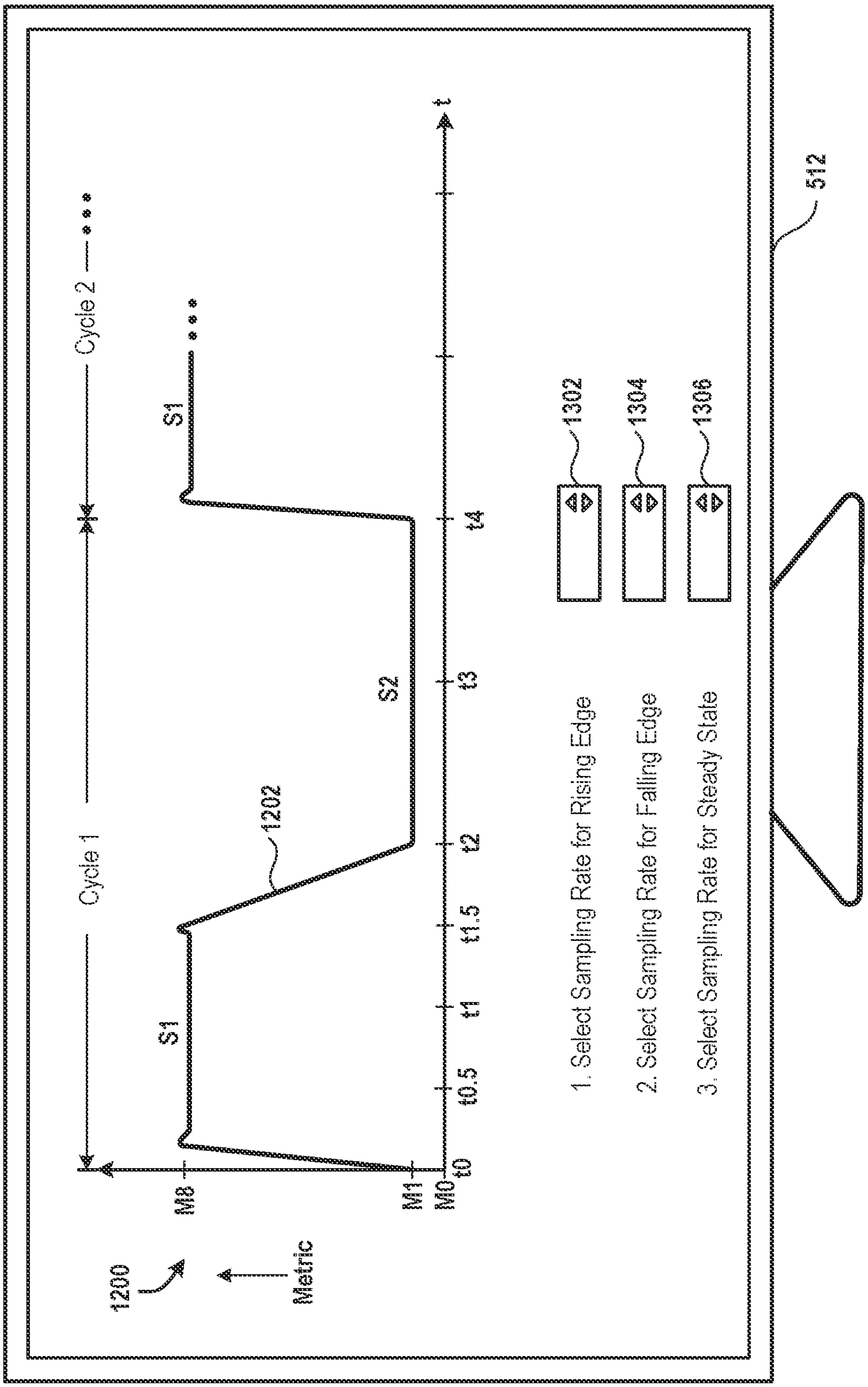
FIG. 13 is a diagram of an embodiment of the monitor to illustrate reception of sampling rates for each edge and each steady state during a cycle of the clock signal.

FIG. 13 is a diagram of an embodiment of the monitor 512 to illustrate reception of sampling rates for each edge and each steady state during each cycle of the clock signal. The monitor 512 includes a display of the graph 1200. Below the graph 1200, three fields 1302, 1304, and 1306 are generated for display by the GPU of the monitor 512.

The user uses the keyboard 514 or the mouse 516 (FIG. 5B) or a combination thereof to provide a value of a sampling rate within each of the fields 1302, 1304, and 1306 for each cycle of the clock signal. For example, the computer processor of the monitor 512 receives, within the field 1302, a sampling rate for sampling a rising edge of the plot 1202 during each cycle of the clock signal. As another example, the computer processor receives, within the field 1304, a sampling rate for sampling a falling edge of the plot 1202 during each cycle of the clock signal. As yet another example, the computer processor receives, within the field 1306, a sampling rate for sampling instances, such as a first instance and a second instance, of a steady state of the plot 1202 during each cycle of the clock signal. In the example, the first instance of the steady state is between the rising edge of the cycle and the falling edge of the plot 1202 during the cycle and the second instance is between the falling edge and another rising edge of the plot 1202 during an immediately following cycle. In the example, the cycle precedes the immediately following cycle.

When the monitor 512 is a part of the analytical controller 106 (FIG. 1A), the computer processor of the monitor 512 sends the sampling rates received within the fields 1302, 1304, and 1306 via the transceivers 122 and 128 to the ADC processor 210 (FIG. 2A). The ADC processor 210 samples the analog metric data 222 (FIG. 2B) as per the sampling rates received within the fields 1302, 1304, and 1306 to output the digital metric data 224 (FIG. 2B).

In an embodiment, when the monitor 512 is a part of the process controller 116 (FIG. 1B), the computer processor of the monitor 512 sends the sampling rates received within the fields 1302, 1304, and 1306 via the communication controllers 136 and 130 (FIG. 2B) to the processor 124 of the analytical controller 106. The processor 124 sends the sampling rates received within the fields 1302, 1304, and

1306 to the ADC processor 210 (FIG. 2A). Upon receiving the sampling rates, the ADC processor 210 samples the analog metric data 222 as per the sampling rates to output the digital metric data 224.

In one embodiment, instead of the field 1306, two different fields are generated by the GPU of the monitor 512 for display on the monitor 512. The two fields include a first field and a second field. The user users the keyboard 514 or the mouse 516 or a combination thereof to provide a first sampling rate within the first field and a second sampling rate within the second field. The first sampling rate is for sampling the first instance of the steady state of the plot 1202 (FIG. 12A) during each cycle of the clock signal. The second sampling rate is for the second instance of the steady state of the plot 1202 during each cycle of the clock signal. The computer processor of the monitor 512 receives the first and second sampling rates provided within the first and second fields.

In an embodiment, instead of the field 1306, six different fields are generated for display by the GPU of the monitor 512. The three fields include a first field, a second field, a third field, a fourth field, a fifth field, and a sixth field. The user users the keyboard 514 or the mouse 516 or a combination thereof to provide a first sampling rate within the first field, a second sampling rate within the second field, a third sampling rate within the third field, a fourth sampling rate within the fourth field, a fifth sampling rate within the fifth field, and a sixth sampling rate within the sixth field. The first sampling rate is for sampling the first instance of the steady state of the plot 1252 (FIG. 12B) during each cycle of the clock signal. The second sampling rate is for sampling the second instance of the steady state of the plot 1252 during each cycle of the clock signal. The third sampling rate is for sampling the third instance of the steady state of the plot 1252 during each cycle of the clock signal. The fourth sampling rate is for sampling a first rising edge of the plot 1252 during each cycle of the clock signal and the fifth sampling rate is for sampling a second rising edge of the plot 1252 during each cycle of the clock signal. The sixth sampling rate is for sampling a falling edge of the plot 152 during each cycle of the clock signal. The computer processor receives the first through sixth sampling rates provided within the first through sixth fields.

FIG. 14A is a diagram of an embodiment of a payload 1400 of a datagram to illustrate a manner in which the digital metric data 204 (FIG. 2A) is transferred between the analytical controller 106 (FIG. 1A) and the process controller 116 (FIG. 1A). For example, the datagram is generated by the communication controller 130 of the analytical controller 106 by applying the network communication protocol and sent to the communication controller 136 of the process controller 116. To illustrate, the communication controller 130 receives data to be inserted within the fields 1410A, 1410B, and 1410E from the processor 124 and applies the network communication protocol to generate the datagram, and sends the datagram to the communication controller 136. In the example, the communication controller 136 applies the network communication protocol to the datagram to extract the data from the fields 1410A, 1410B, and 1410E and provides the data to the processor 132 of the process controller 116 for analysis. Further, in the example, the processor 132 determines data to be inserted within the fields 1410C, 1410D, and 1410E based on the data received within the fields 1410A, 1410B, and 1410E and provides the data to be inserted within the fields 1410C, 1410D, and 1410E to the communication controller 136. In the example, the communication controller 136 receives data to be inserted within the fields 1410C, 1410D, and 1410E from the processor 132 and applies the network communication protocol to generate a datagram, and sends the datagram to the communication controller 130. Continuing with the example, the communication controller 130 receives the data from the communication controller 136 and applies the network communication protocol to extract the data from the fields 1410C, 1410D, and 1410E, and provides the data to the processor 124. The processor 124 controls a plasma source according to the data that is received within the fields 1410C, 1410D, and 1410E. Examples of the plasma source include the plasma source 226 and 1154 (FIG. 11B).

Examples of the datagram include a packet, such as a UDP packet, a TCP/IP packet, or a UDP/IP packet. The payload 1400 includes a sample set (SS) 1402 followed by multiple sample sets 1404. For example, the payload 1400 includes a sample set 1 followed by multiple sample sets 2 through Ma, where Ma is a positive integer greater than 1. To illustrate, Ma ranges from 7 to 9. To further illustrate, Ma is 8.

Each of the sample sets 1 through Ma of the payload 1400 stores digital metric data, such as the digital metric data 204 or 224 (FIGS. 2A and 2B), that is output by the ADC processor 210 (FIG. 2A) and the digital metric data is sampled from an edge, such as a rising edge or a falling edge, of the analog metric data 202 (FIG. 2A) or 222 (FIG. 2B). For example, the sample set 1402 includes digital metric data that is output by the ADC processor 210 by sampling the rising edge of the plot 1202 (FIG. 12A). Also, in the example, each of the sample sets 1404 includes digital metric data of the metric that is output by the ADC processor 210 by sampling the rising edge of the plot 1202. The digital metric data corresponding to the edge is sampled during one or more cycles of the clock signal.

The payload 1400 further includes another sample set 1406 followed by multiple sample sets 1408. For example, the payload 1400 includes a sample set 1 followed by multiple sample sets 2 through Na, where Na is a positive integer greater than 1. To illustrate, Na ranges from 60 to 64. To further illustrate, Na is 62. Each sample set of the payload 1400 has a fixed number of bytes P, where P is a positive integer.

Each of the sample sets 1 through Na store digital metric data that is output by the ADC processor 210 by sampling a steady state of the analog metric data 202 (FIG. 2A) or 222 (FIG. 2B). For example, the sample set 1406 includes digital metric data of the metric that is output by the ADC processor 210 by sampling the first instance of the steady state of the plot 1202. Also, in the example, each of the sample sets 1408 includes digital metric data of the metric that is output by the ADC processor 210 by sampling the first instance of the steady state of the plot 1202. It should be noted that as an example, Na is greater than Ma if the first instance of the steady state of the plot 1202 is longer compared to the rising edge of the plot 1202. The rising edge precedes the first instance of the steady state of the plot 1202. The digital metric data corresponding to the steady state is sampled during the same one or more cycles of the clock signal for which the digital metric data corresponding to the edge is sampled.

The sample set 1402 of the payload 1400 includes multiple fields, which include a field 1410A for storing a digital metric value of forward power or delivered power that is sampled by the ADC processor 210, a field 1410B for storing a digital metric value of reverse power that is sampled by the ADC processor 210, a field 1410C for storing a frequency value of an RF signal that is to be supplied by the plasma source, a field 1410D for storing setpoint data, a field 1410E for storing a status of the RF signal, and a reserve field 1410F. An example of the setpoint data includes an amount of power or an amount of voltage to be supplied by the plasma source. Examples of the status of the RF signal include whether the plasma source is to operate in a continuous wave (CW) mode or in a pulse mode, a number of states of the RF signal, whether the fields 1410A and 1410B include digital power values of an edge or a steady state of metric data of the metric, whether the field 1410A includes forward power or delivered power as metric data, whether the frequency within the field 1410C is to be manually tuned by the user or automatically tuned by the computer processor of the monitor 512 (FIG. 5B). In the pulse mode, the RF signal has multiple states. In the CW mode, the RF signal has a single state. In a similar manner, each of the sample sets 2-Ma of the payload 1400 includes multiple fields, such as the fields 1410A through 1410F. Also, each of the sample sets 1 through Na of the payload 1400 includes multiple fields, such as the fields 1410A through 1410F.

In one embodiment, the payload 1400 is limited by a maximum byte size, which ranges from 1300 bytes to 1700 bytes. For example, the payload 1400 is limited by a byte size of 1500 bytes. As another example, the payload 1400 is limited by a byte size of 1600 bytes.

In an embodiment, each field 1410A-1410F has a size of a1 number of bits, where a1 is a positive integer. For example, the field 1410A stores a digital value of forward power and the digital value is represented by 16 bits. As another example, the field 1410A stores a digital value of forward power, measured in watts, and the digital value is represented by 8 bits or 32 bits. To illustrate, the digital value of forward power is constrained to a resolution of b1 watts, where b1 is a positive integer or a positive real number. To illustrate, b1 is 0.5 watts or 1 watt or 2 watts or 3 watts. A resolution, as used herein, is a smallest unit or an increment or a decrement. As another example, the field 1410B stores a digital value of reverse power and the digital value is represented by 16 bits. To illustrate, the digital value of reverse power is constrained to a resolution of b1 watts. To further illustrate, the field 1410B stores a digital value of reverse power and the digital value is represented by 8 bits or 32 bits. As another example, the field 1410C stores a digital value of frequency of an RF signal to be generated by the plasma source, and the digital value is represented by 16 bits. To illustrate, the digital value of frequency is constrained to a resolution of b2 kilohertz (kHz), where b2 is a positive integer or a positive real number. To illustrate, b2 is 0.5 kHz or 1 kHz or 2 kHz. As yet another example, the field 1410D stores a digital value of setpoint data and the digital value is represented by 16 bits. As another example, the field 1410D stores a digital value of forward power or supplied power, measured in watts, and the digital value is represented by 8 bits or 32 bits. To illustrate, the digital value of forward power is constrained to a resolution of b1 watts.

As another example, the field 1410E stores digital values of status and the digital values are represented by 16 bits or 32 bits. To illustrate, the field 1410E includes one bit that indicates whether the plasma source is to operate in the CW mode or in the pulse mode, two bits that indicate a number of states of the RF signal generated by the plasma source, and a bit that indicates whether a sample set, having the field 1410E, has digital metric data for a steady state of the metric or an edge of the metric. To illustrate, the digital value of metric data of the steady state of the metric is constrained to a resolution of b3 microseconds and the digital value of metric data of the edge of the metric is constrained to a resolution of b4 microseconds. To further illustrate, b3 ranges from 130 to 180 and b4 ranges from 15 to 25. To illustrate further, b3 is 160 and b4 is 20. As another illustration, b3 is 140. As yet another illustration, b3 is 150 and b4 is 25. The field 1410E further includes one bit that indicates whether the field 1410A includes digital value of forward power or of delivered power measured by an RF sensor, such as the RF sensor 201 or 1152 (FIG. 11B). The field 1410E further includes one bit that indicates whether the frequency within the field 1410C of the plasma source is to be manually tuned by the user or automatically tuned by the computer processor. As another example, the field 1410F includes 32 bits of any data, which is not included within the fields 1410A through 1410E.

In one embodiment, each sample set, described herein, includes a time stamp field for defining a time stamp. For example, the time stamp field is situated between the fields 1410E and 1410F. The time stamp indicates a number of bits within each of the fields 1410A, 1410B, 1410C, 1410D, and 1410E. For example, the time stamp is equal to 32 bits or 16 bits or 8 bits. To illustrate, the timestamp provides a resolution with which the metric data is sampled within the field 1410A, or the metric data is sampled within the field 1410B. To further illustrate, the time stamp provides a resolution that ranges from 0.8 ms to 1.2 ms, such as 1 ms.

In an embodiment, the reserve field 1410F is not included within each sample set.

FIG. 14B is an embodiment of a payload 1420 of a single packet that is transferred between the analytical controller 106 (FIG. 1A) and the process controller 116 (FIG. 2B). The payload 1420 includes metric data for multiple states, such as a state S1, a state S2, and a state S3, and a rising edge or a falling edge associated with each of the states. The rising or falling edge is associated with the state when the rising edge or falling edge precedes or immediately follows the state. The payload 1420 is used to illustrate that each of Nb, Nc, and Nd number of sample sets of the payload 1420 is less than the number Na of sample sets of the payload 1400, where each of Nb, Nc, and Nd is a positive integer. For example, the number Nb, or Nc, or Nd of sample sets of the payload 1420 is one and the number Na of sample sets of the payload 1400 is 30. As another example, the number Nb, or Nc, or Nd of sample sets of the payload 1420 is two and the number Na of sample sets of the payload 1400 is 20. Also, the payload 1420 is used to illustrate that each number Mb, Mc, and Md of sample sets of the payload 1420 is less than the number Ma of sample sets of the payload 1400, where each of Mb, Mc, and Md is a positive integer.

It should be noted that as an example, a total size, such as a total number of sample sets, of the payload 1420 is equal to a total size, such as a total number of sample sets, of the payload 1400. As an example, a sum of the numbers Mb, Mc and Md is equal to Ma and a sum of the numbers Nb, Nc, and Nd is equal to Na. In addition, as an example, a resolution of each of the sample sets Nb, Nc, and Nd of the payload 1420 is different than, such as less than, a resolution of each of the sample sets Na of the payload 1400 (FIG. 14A). To illustrate, a resolution of each sample set Nb, Nc, and Nd of the payload 1420 is 140 microseconds and a resolution of each sample set Na of the payload 1400 is 160 microseconds.

Each of the sample sets 1 through Mb of the payload 1420 stores digital metric data that is output by the ADC processor 210 (FIG. 2A) by sampling an edge, such as a rising edge or a falling edge, of the analog metric data 202 (FIG. 2A) or 222 (FIG. 2B), and the edge is associated with a steady state of the metric data. For example, the edge is next to, such as immediately follows or precedes, a steady state of the metric data and provides a transition to another steady state. For example, a sample set 1422 of the payload 1420 includes digital metric data of the metric that is output by the ADC processor 210 by sampling the first instance of the rising edge of the plot 1252 (FIG. 12B). In the example, the rising edge follows and is next to the first instance of the steady state of the plot 1252. In the example, the first instance of the steady state of the plot 1252 is the state S1. To illustrate, the first instance of the rising edge of the plot 1252 occurs during a time interval between the time t1 and the time t1.5. Also, in the illustration, each of the sample sets 1424 includes digital metric data that is output by the ADC processor 210 by sampling the first instance of the rising edge of the plot 1252.

The payload 1420 further includes another sample set 1426 followed by multiple sample sets 1428. For example, a sample set 1 of the payload 1420 is followed by sample sets 2 through Nb, where Nb is less than Mb. The sample set 1426 follows the sample sets 1424. The sample set 1426 and each of the sample sets 1428 of the payload 1420 store digital metric data that is output by the ADC processor 210 by sampling a steady state of the analog metric data 202 (FIG. 2A) or 222 (FIG. 2B). For example, the sample set 1426 includes digital metric data that is output by the ADC processor 210 by sampling the first instance of the steady state of the plot 1252. In the example, the first instance of the steady state of the plot 1252 occurs between the times t0 and t1 and is referred to herein as the state S1. Also, in the example, each of the sample sets 1428 includes digital metric data of the metric that is output by the ADC processor 210 by sampling the first instance of the steady state of the plot 1252.

The multiple sample sets 1428 are followed by a sample set 1430 and sample sets 1432 of the payload 1420. For example, a sample set 1 of the payload 1420 is followed by sample sets 2 through Mc. As another example, the payload 1420 includes the sample set 1430, which includes digital metric data that is output by the ADC processor 210 by sampling the second instance of the rising edge of the plot 1252. In the example, the second instance of the rising edge follows and is next to the second instance of the steady state of the plot 1252. Also, in the example, the second instance of the rising edge of the plot 1252 is the state S2. To illustrate, the second instance of the rising edge occurs during a time interval between the time t2.75 and the time t3.25. Also, in the example, each of the sample sets 1432 includes digital metric data that is output by the ADC processor 210 by sampling the second instance of the rising edge of the plot 1252.

The payload 1420 further includes another sample set 1434, which follows the sample sets 1432, and the sample set 1434 is followed by multiple sample sets 1436. For example, a sample set 1 of the payload 1420 is followed by sample sets 2 through Nc, where Nc is less than Mc. In the example, the sample set 1434 and each of the sample sets 1436 of the payload 1420 store digital metric data that is output by the ADC processor 210 by sampling a steady state of the analog metric data 202 (FIG. 2A) or 222 (FIG. 2B). To illustrate, the sample set 1436 includes digital metric data that is output by the ADC processor 210 by sampling the second instance of the steady state of the plot 1252. In the illustration, the second instance of the steady state of the plot 1252 occurs between the times t1.5 and t2.75 and is referred to herein as the state S2. Also, in the example, each of the sample sets 1436 includes digital metric data that is output by the ADC processor 210 by sampling the second instance of the steady state of the plot 1252.

The payload 1420 also includes a sample set 1438, which follows the sample sets 1436, and the sample set 1438 is followed multiple sample sets 1440. For example, a sample set 1 of the payload 1420 is followed by sample sets 2 through Md. As another example, the sample set 1438 of the payload 1420 includes digital metric data of the metric that is output by the ADC processor 210 by sampling the falling edge of the plot 1252. In the example, the falling edge follows and is next to the third instance of the steady state of the plot 1252. Also, in the example, the third instance of the steady state of the plot 1252 is the state S3. To illustrate, the falling edge occurs during a time interval between the time t3.75 and the time t4. Also, in the illustration, each of the sample sets 1440 includes digital metric data that is output by the ADC processor 210 by sampling the falling edge of the plot 1252.

The payload 1420 further includes another sample set 1442, which follows the sample set 1440, and the sample set 1442 is followed by multiple sample sets 1444. For example, a sample set 1 of the payload 1420 is followed by sample sets 2 through Nd, where Nd is less than Md. The sample set 1442 and each of the sample sets 1444 of the payload 1420 store digital metric data that is output by the ADC processor 210 by sampling a steady state of the analog metric data 202 (FIG. 2A) or 222 (FIG. 2B). As an example, the sample set 1442 includes digital metric data of the metric that is output by the ADC processor 210 by sampling the third instance of the steady state of the plot 1252. In the example, the third instance of the steady state of the plot 1252 occurs between the times t3.25 and t3.75 and is referred to herein as the state S3. Also, in the example, each of the sample sets 1444 includes digital metric data that is output by the ADC processor 210 by sampling the third instance of the steady state of the plot 1252.

Each sample set of the payload 1420 has a fixed number of bytes P, where P is a positive integer. Also, each sample set of the payload 1420 includes multiple fields, such as the fields 1410A through 1410F (FIG. 14A).

It should further be noted that a number of edges for which the digital metric data is stored in the payload 1420 is greater than a number of edges for which the digital metric data is stored in the payload 1400. For example, the payload 1420 includes the digital metric data sampled from three edges and the payload 1400 includes the digital metric data sampled from one edge. A processor, such as the processor 124 or the processor 132, calculates a first number of edges of the digital metric data to be stored in the payload 1420. The first number of edges occur during each cycle of the clock signal. Similarly, the processor calculates a second number of edges of the digital metric data to be stored in the payload 1400, and the second number of edges occur during each cycle of the clock signal. The processor further compares the first number of edges with the second number of edges to determine whether the first number is greater than the second number. In response to determining that the first number of edges is greater than the second number of edges, the processor determines to allocate a lower number of sample sets, within the payload 1420, to the digital metric data of each of the edges of the first number compared to a number of sample sets allocated within the payload 1400 to the digital metric data of each of the edges of the second number. The processor provides an instruction to a communication controller, such as the communication controller 130 or 136 (FIG. 1A), indicating the number of sample sets to be allocated to the digital metric data of each of the edges of the first number. Upon receiving the instruction, the communication controller generates a packet having the payload 1420. Also, the processor provides another instruction to the communication controller indicating the number of sample sets to be allocated to the digital metric data of each of the edges of the second number. Upon receiving the other instruction, the communication controller generates a packet having the payload 1400.

It should also be noted that a number of steady states of the digital metric data is stored in the payload 1420 is greater than a number of steady states of the digital metric data stored in the payload 1400. For example, the payload 1420 includes the digital metric data sampled from three steady states and the payload 1400 includes the digital metric data sampled from one steady state. A processor, such as the processor 124 or the processor 132, calculates a first number of steady states of the digital metric data to be stored in the payload 1420. The first number of steady states occur during each cycle of the clock signal. Similarly, the processor calculates a second number of steady states of the digital metric data to be stored in the payload 1400, and the second number of steady states occur during each cycle of the clock signal. The processor further compares the first number of steady states with the second number of steady states to determine whether the first number is greater than the second number. In response to determining that the first number steady states is greater than the second number steady states, the processor determines to allocate a lower number of sample sets, within the payload 1420, to the digital metric data of each of the steady states of the first number compared to a number of sample sets allocated within the payload 1400 to the digital metric data of each of the steady states of the second number. The processor provides an instruction to a communication controller, such as the communication controller 130 or 136 (FIG. 1A), indicating the number of sample sets to be allocated to the digital metric data of each of the steady states of the first number. Upon receiving the instruction, the communication controller generates a packet having the payload 1420. Also, the processor provides another instruction to the communication controller indicating the number of sample sets to be allocated to the digital metric data of each of the steady states of the second number. Upon receiving the other instruction, the communication controller generates a packet having the payload 1400.

In one embodiment, the payload 1420 is limited by the maximum byte size.

In one embodiment, the terms packet and datagram are used herein interchangeably.

Figures 2, 14C:
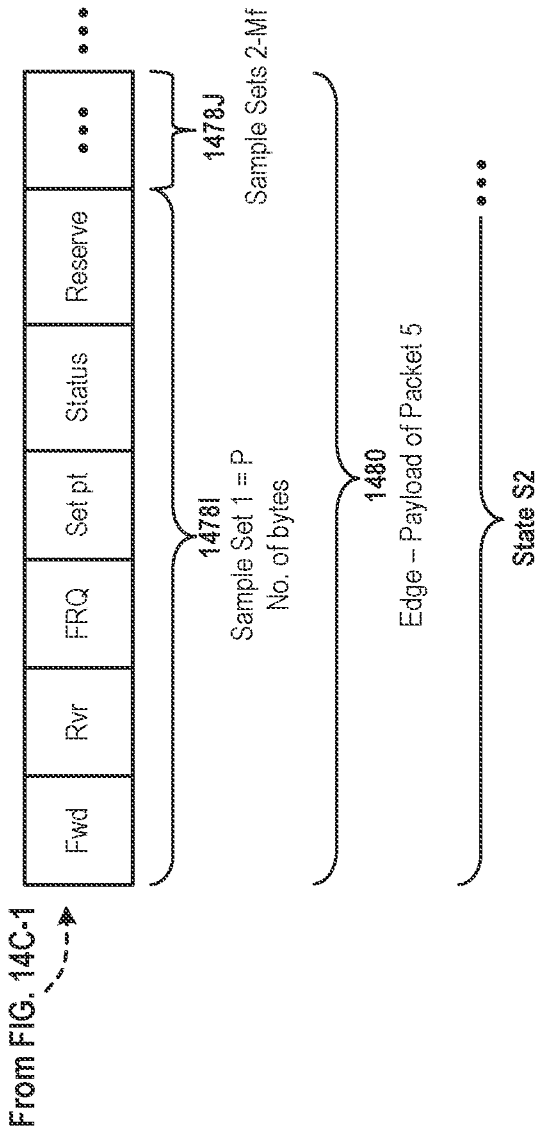

FIG. 14C-1 is a diagram of an embodiment of payloads 1470, 1472, 1474, and 1476 of multiple packets, such as a packet 1, a packet 2, a packet 3, and a packet 4, to illustrate that a large amount of digital metric data of a steady state can be distributed among the packets. The packets 1 through 4 are transferred between the analytical controller 106 and the process controller 116 (FIG. 2B). The payload 1470 of the packet 1 includes digital metric data of an edge, such as a rising edge or a falling edge, associated with a state S1 of the metric. Each sample set 1 through Me of the payload 1470 stores digital metric data that is output by the ADC processor 210 (FIG. 2B) from an edge, such as a rising edge or a falling edge, of the analog metric data 202 (FIG. 2A) or 222 (FIG. 2B), and the edge is associated with the state S1 of the metric data, where Me is a positive integer. The edge is next to, such as precedes or immediately follows, a steady state of the metric data and provides a transition to the steady state from another steady state. For example, a sample set 1478A of the payload 1470 includes digital metric data that is output by the ADC processor 210 by sampling the rising edge of the plot 1202 (FIG. 12A). In the example, the rising edge precedes and is next to the first instance of the steady state of the plot 1202. Also, in the example, the first instance of the steady state of the plot 1202 is the state S1. To illustrate, the rising edge occurs during a time interval between the time t0 and the time t0.5. Also, in the illustration, each of multiple sample sets 1478B includes digital metric data that is output by the ADC processor 210 by sampling the rising edge of the plot 1202.

The payload 1472 of the packet 2 includes a sample set 1478C, which follows the sample set 1478A, and is followed by multiple sample sets 1478D. For example, a sample set 1 of the payload 1472 is followed by sample sets 2 through Ne, where Ne is greater than Me and is a positive integer. The sample set 1478C and each of the sample sets 1478D of the payload 1472 store digital metric data that is output by the ADC processor 210 by sampling a steady state of the analog metric data 202 (FIG. 2A) or 222 (FIG. 2B). For example, the sample set 1478C includes digital metric data of the metric that is output by the ADC processor 210 by sampling the first instance of the steady state of the plot 1202. The first instance of the steady state of the plot 1202 occurs between the times t0.5 and t1.5 and is referred to herein as the state S1. Also, each of the sample sets 1478D includes digital metric data that is output by the ADC processor by sampling the first instance of the steady state of the plot 1202.

The payload 1474 of the packet 3 includes a sample set 1478E, which follows the sample sets 1478D, and is followed by multiple sample sets 1478F. For example, a sample set 1 of the payload 1474 is followed by sample sets 2 through Nf, where Nf is a positive integer. The sample set 1478E and each of the sample sets 1478F of the payload 1474 store digital metric data that is output by the ADC processor 210 from the steady state of the analog metric data 202 (FIG. 2A) or 222 (FIG. 2B). For example, the sample set 1478E includes digital metric data of the metric that is output from the ADC processor 210 by sampling the first instance of the steady state S1 of the plot 1202. Also, in the example, each of the sample sets 1478F includes digital metric data that is output by the ADC processor 210 by sampling the first instance of the steady state of the plot 1202.

The payload 1476 of the packet 4 includes a sample set 1478G, which follows the sample sets 1478F, and is followed by multiple sample sets 1478H. For example, a sample set 1 of the payload 1476 is followed by sample sets 2 through Ng, where Ng is a positive integer. The sample set 1478G and each of the sample sets 1478H of the payload 1476 store digital metric data that is output by the ADC processor 210 from the steady state of the analog metric data 202 (FIG. 2A) or 222 (FIG. 2B). For example, the sample set 1478G includes digital metric data of the metric that is output by the ADC processor 210 by sampling the first instance of the steady state S1 of the plot 1202. Also, in the example, each of the sample sets 1478H includes digital metric data that is output by the ADC processor 210 by sampling the first instance of the steady state of the plot 1202. As illustrated, the payloads of the packets 2 through 4 include digital metric data of the metric output by sampling the first instance of the steady state of the plot 1202.

Each sample set of any of the payloads 1470, 1472, 1474, and 1476 is limited to P number of bytes.

FIG. 14C-2 is a diagram of an embodiment of a payload 1480 of a packet 5, which includes digital metric data of an edge associated with the steady state S2. The packet 5 is transferred between the analytical controller 106 and the process controller 116 (FIG. 2B). The payload 1480 of the packet 5 includes metric data for an edge, such as a rising edge or a falling edge, associated with a state S2 of the metric. Each sample set 1 through Mf of the payload 1480 stores digital metric data that is output by the ADC processor 210 (FIG. 2B) by sampling an edge, such as a rising edge or a falling edge, of the analog metric data 202 (FIG. 2A) or 222 (FIG. 2B), and the edge is associated with the state S2 of the metric data, where Mf is a positive integer. The edge is next to, such as precedes or immediately follows, a steady state of the metric data and provides a transition to the steady state from another steady state. For example, a sample set 1478I of the payload 1480 includes digital metric data that is output by the ADC processor 210 by sampling the falling edge of the plot 1202 (FIG. 12A). In the example, the falling edge precedes and is next to the second instance of the steady state of the plot 1202. Also, in the example, the second instance of the steady state of the plot 1202 is the state S2. To illustrate, the falling edge occurs during a time interval between the time t1.5 and the time t2.25. Also, in the illustration, each of multiple sample sets 1478J includes digital metric data that is output by the ADC processor 210 by sampling the falling edge of the plot 1202.

Each sample set of the payload 1480 limited to P number of bytes.

It should also be noted that a number of sample sets of a steady state of digital metric data stored in the packets 2 through 4 is greater than a number of sample sets of a steady state of digital metric data stored in the payload 1400 (FIG. 14A). For example, the payloads 1472, 1474, and 1476 includes the digital metric data sampled from one state and the payload 1400 includes the digital metric data sampled from one steady state. A processor, such as the processor 124 or the processor 132, calculates a first time window of a steady state of the digital metric data to be stored in the payloads 1472, 1474, and 1476. The steady state occurs during each cycle of the clock signal. Similarly, the processor calculates a second time window of a steady state of the digital metric data to be stored in the payload 1400, and the steady state occurs during each cycle of the clock signal. The processor further compares the first time window with the second time window to determine whether the first time window is greater than the second time window. In response to determining that the first time window steady states is greater than the second time window, the processor determines that a higher amount of digital metric data is to be stored in the payloads 1472, 1474, and 1476 compared to an amount of digital metric data is to be stored in the payload 1400. Also, in response to determining that the first time window is greater than the second time window, the processor determines to allocate a first number of packets to the digital metric data collected during the first time window compared to a second number of packets allocated to the digital metric data collected during the second time window. The first number of packets is greater than the second number of packets. The processor provides an instruction to a communication controller, such as the communication controller 130 or 136 (FIG. 1A), indicating the first number of packets to be allocated to the digital metric data collected during the first time window. Upon receiving the instruction, the communication controller generates the packets having the payloads 1472, 1474, and 1476. Also, the processor provides another instruction to the communication controller indicating second number of packets to be allocated to the digital metric data collected during the second time window. Upon receiving the other instruction, the communication controller generates the packet having the payload 1400.

Figure 15:
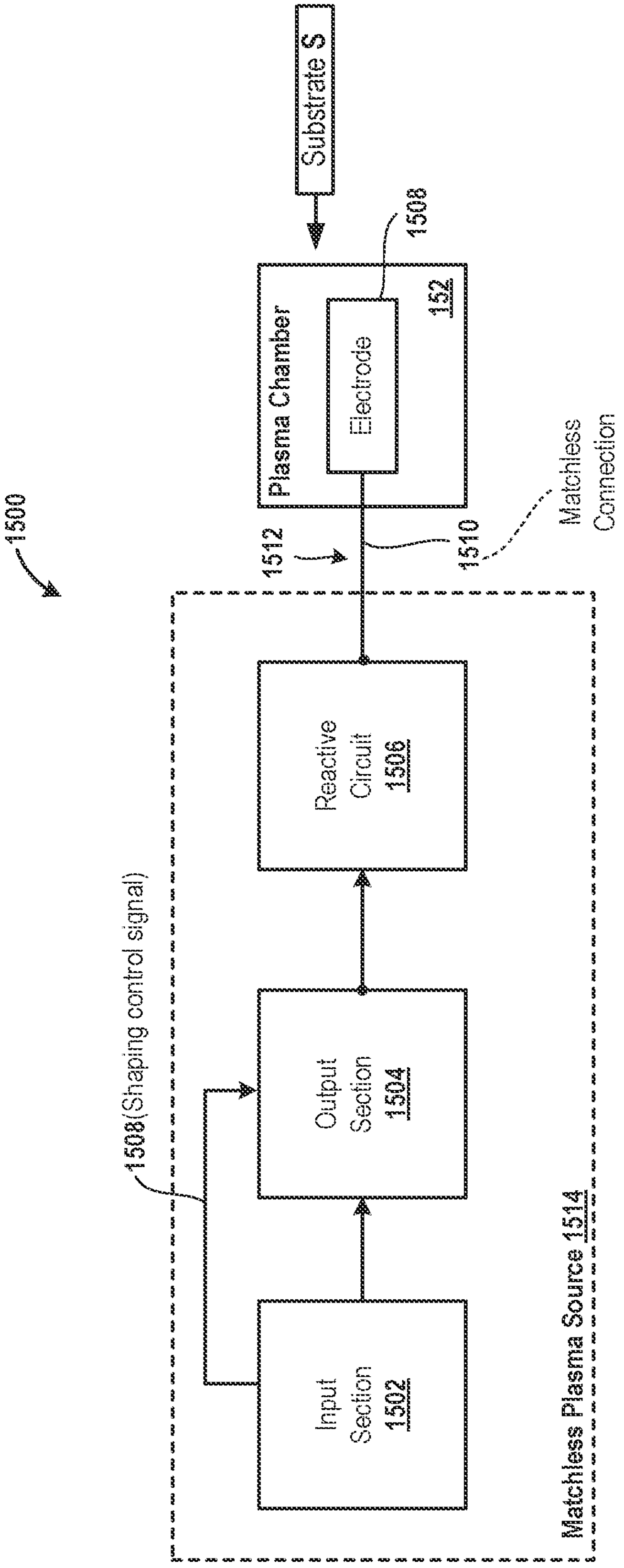
FIG. 15 is a diagram of an embodiment of a system to illustrate details of a matchless plasma source.

FIG. 15 is a diagram of an embodiment of a system 1500 to illustrate details of an MPS 1514. The MPS 1514 is an example of any of the MPS's a1 through a(n+m) (FIG. 1B). The system 1500 includes the MPS 1514, a connection 1510, and the plasma chamber 152. The MPS 1514 includes an input section 1502, an output section 1504, and a reactive circuit 1506. An example of the input section 1502 includes a signal generator and a portion of a gate driver. An example of the signal generator is a square wave oscillator that generates a square wave signal, such as a digital waveform or a pulse train. The square wave pulses between a first logic level, such as high or one, and a second logic level, such as low or zero. An example of the output section 1504 includes the remaining portion of the gate driver and a half-bridge transistor circuit. Further, an example of the reactive circuit 1506 includes a variable capacitor. Another example of the reactive circuit 1506 includes a fixed capacitor.

The input section 1502 is coupled to the output section 1504, which is further coupled to the reactive circuit 1506. The reactive circuit 1506 is coupled via the connection 1510 to an electrode 1508 located within the plasma chamber 152. Examples of the electrode 1508 include the lower electrode of the chuck 118 (FIG. 1B), the RF coil 154A, the RF coil 154B, and the RF coil 154C (FIG. 1B).

The input section 1502 generates multiple square wave signals and provides the square wave signals to the output section 1504. The output section 1504 generates an amplified square waveform from the multiple square wave signals received from the input section 1504. Moreover, the output section 1504 shapes an envelope, such as a peak-to-peak magnitude, of the amplified square waveform. For example, a shaping control signal 1508 is supplied from the input section 1502 to the output section 1504 to generate the envelope. The shaping control signal 1508 has multiple voltage values for shaping the amplified square waveform.

The amplified square waveform that is shaped is sent from the output section 1504 to the reactive circuit 1506. The reactive circuit 1506 removes, such as filters out, higher-order harmonics of the amplified square waveform to generate an RF signal 1512, which is a shaped sinusoidal waveform having a fundamental frequency. Examples of the RF signal 1512 include the RF signal 140*a*1, 140*a*2, 140*an*, 140*a*(n+1), and 140*a*(n+m). The shaped sinusoidal waveform has the envelope that is shaped.

The RF signal 1512 is sent from the reactive circuit 1506 via the connection 1510 to the electrode 1508 for processing the substrate S. Also, the one or more process materials, such as fluorine containing gases, oxygen containing gases, nitrogen containing gases, liquids for deposition of metals and dielectrics, etc., are supplied to the plasma chamber 152. Upon receiving the shaped sinusoidal waveform and the one or more process materials, plasma is lit within the plasma chamber 152 to process the substrate S. An example of the MPS 1514 is provided in U.S. Pat. No. 10,264,663, which is incorporated by reference herein in its entirety.

In some embodiments, the input section 1502 includes a controller board having the signal generator and further includes the gate driver, and the output section includes the half-bridge transistor circuit. The controller board includes a controller coupled to the signal generator to control the signal generator to generate the square wave signal at a pre-determined frequency.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, and/or one or more microprocessors, or microcontrollers that execute program instructions (e.g., software). The program instructions are instructions communicated to the controller in the form of various individual settings (or program files), defining operational variables for carrying out a particular process on or for a semiconductor wafer or to a system. The operational variables are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change variables of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of variables and/or settings, which are then communicated to the system from the remote computer. In some examples, the controller receives instructions in the form of data, which specify variables for each of the processing steps to be performed during one or more operations. It should be understood that the variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a capacitively-coupled plasma chamber, a transformer coupled plasma chamber, a capacitively coupled plasma reactor, conductor tools, dielectric tools, a plasma chamber including an electron cyclotron resonance (ECR) reactor, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for increasing accuracy in controlling a plasma tool, comprising:

receiving, by a processor, a first set of metric data generated based on measurements from a radio frequency (RF) sensor of a plasma tool;

analyzing the first set of metric data to determine a first location within one of a plurality of clock cycles of a clock signal and to determine a first time window from the first location, wherein the first location and the first time window are determined for capturing of a second set of metric data within the first time window from the first location;

providing, by the processor, the first location and the first time window that are determined to a data processing system of the plasma tool;

receiving the second set of metric data captured based on measurements by the RF sensor, wherein the second set of metric data is captured at the first location and for the first time window;

analyzing the second set of metric data to generate variable data; and controlling the plasma tool according to the variable data generated based on the second set of metric data.

2. The method of claim 1, wherein the first time window includes a first time and a second time, wherein the first location is at the first time.

3. The method of claim 2, wherein a third set of metric data outside the first time window is not captured.

4. The method of claim 1, wherein the plasma tool includes an RF generator or a matchless plasma source.

5. The method of claim 1, wherein said analyzing the first set of metric data includes:

determining whether a portion of the first set of metric data lies within a pre-determined range;

determining the first location and the first time window during which the portion of the first set of metric data is in the pre-determined range.

6. The method of claim 5, wherein the pre-determined range corresponds to a steady state of the portion of the first set of metric data.

7. The method of claim 1, wherein said analyzing the first set of metric data includes:

determining whether a portion of the first set of metric data lies outside a pre-determined range;

determining the first location and the first time window during which the portion of the first set of metric data is outside the pre-determined range.

8. The method of claim 7, wherein the pre-determined range corresponds to a transition state of the portion of the first set of metric data, wherein during the transition state, the portion of the first set of metric data transitions from a first steady state of the first set of metric data to a second steady state of the first set of metric data.

9. The method of claim 1, wherein the time window defines a state or a sub-state or a slice of an RF signal generated by a plasma source of the plasma tool.

10. The method of claim 1, wherein said analyzing the second set of metric data to generate the variable data includes:

determining a first statistical value from the second set of metric data; and determining the variable data based on the first statistical value.

11. The method of claim 10, further comprising:

receiving a third set of metric data captured at a second location for a second time window; and determining a second statistical value from the third set of metric data, wherein said analyzing the second set of metric data to generate the variable data includes:

determining whether there is a consensus between the first statistical value and the second statistical value; and determining the variable data in response to determining that there is consensus between the first statistical value and the second statistical value.

12. The method of claim 1, wherein said analyzing the second set of metric data to generate the variable data includes:

determining whether a number of samples of the second set of metric data exceeds a pre-determined threshold;

determining a statistical value from the second set of metric data in response to determining that the number of samples of the second set of metric data exceeds the pre-determined threshold; and determining the variable data based on the statistical value.

13. The method of claim 1, further comprising providing, by the processor, a first number of cycles for which the second set of metric data is to be collected.

14. The method of claim 13, wherein the first number of cycles is one, the method comprising:

analyzing the first set of metric data to determine a second location and a second time window for capturing of a third set of metric data;

providing, by the processor, the second location and the second time window to the data processing system of the plasma tool;

providing, by the processor, a second number of cycles for which the third set of metric data is to be collected, wherein the cycles of the second number follow the cycles of the first number.

15. The method of claim 1, further comprising:

generating a digital pulsed signal;

providing the digital pulsed signal indicating a rate of sampling of a portion of the first set of metric data to the data processing system, wherein the portion corresponds to a state or a sub-state or a slice of the first set of metric data, wherein the portion forms the second set of metric data.

16. The method of claim 1, further comprising:

receiving a digital pulsed signal from a plasma source of the plasma tool; and providing the digital pulsed signal indicating a rate of sampling of the second set of metric data to the data processing system.

17. The method of claim 1, wherein during a time period in which the second set of metric data is received by the processor from the data processing system, a portion of the first set of metric data is not captured by the data processing system.

18. The method of claim 1, further comprising:

receiving a third set of metric data captured at the first location for the first time window, wherein the third set of metric data is captured during a different cycle than a cycle during which the second set of metric data is captured, wherein said analyzing the second set of metric data to generate the variable data includes comparing the second and third sets of metric data to identify a discrepancy between the second and third sets and generating the variable data to reduce the discrepancy.

19. The method of claim 1, further comprising:

receiving a third set of metric data captured at the first location and for the first time window from a second data processing system of a second plasma tool, wherein said analyzing the second set of metric data to generate the variable data includes comparing the second and third sets of metric data to identify a discrepancy between the second and third sets and generating the variable data to reduce the discrepancy.

20. The method of claim 1, further comprising:

receiving a third set of metric data from the data processing system;

determining whether the third set of metric data includes a higher number of transition states compared to a number of transition states of the second set of metric data and a higher number of steady states compared to a number of steady states of the second set of metric data;

allocating a lower number of sample sets within a first payload of a first packet to each of the steady states of the third set of metric data compared to a number of sample sets allocated within a second payload of a second packet to each of the steady states of the second set of metric data in response to determining that the third set of metric data includes the higher number of steady states; and allocating a lower number of sample sets within the first payload of the first packet to each of the transition states of the third set of metric data compared to a number of sample sets allocated within the second payload of the second packet to each of the transition states of the second set of metric data in response to determining that the third set of metric data includes the higher number of transition states.

21. The method of claim 1, further comprising:

receiving a third set of metric data from the data processing system;

determining whether the third set of metric data includes a higher amount of data corresponding to a steady state compared to an amount of data corresponding to a steady state of the second set of metric data;

allocating a higher number of packets to the steady state of the third set of metric data compared to a number of packets allocated within to the steady state of the second set of metric data in response to determining that the third set of metric data includes the higher amount of data.

* * * * *